United States Patent
Oshiyama et al.

(10) Patent No.: US 9,368,536 B2
(45) Date of Patent: Jun. 14, 2016

(54) SOLID STATE IMAGING DEVICE FOR REDUCING DARK CURRENT, METHOD OF MANUFACTURING THE SAME, AND IMAGING APPARATUS

(71) Applicant: Sony Corporation, Tokyo (JP)

(72) Inventors: Itaru Oshiyama, Kanagawa (JP); Takashi Ando, Kanagawa (JP); Susumu Hiyama, Kanagawa (JP); Tetsuji Yamaguchi, Kanagawa (JP); Yuko Ohgishi, Tokyo (JP); Harumi Ikeda, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/570,784

(22) Filed: Dec. 15, 2014

(65) Prior Publication Data
US 2015/0214264 A1    Jul. 30, 2015

Related U.S. Application Data

(63) Continuation of application No. 12/977,766, filed on Dec. 23, 2010, now Pat. No. 8,946,840, which is a continuation of application No. 12/244,889, filed on Oct. 3, 2008, now Pat. No. 8,288,836.

(30) Foreign Application Priority Data

Oct. 11, 2007    (JP) ................................ 2007-265287

(51) Int. Cl.
*H01L 27/146* (2006.01)

(52) U.S. Cl.
CPC ...... *H01L 27/14636* (2013.01); *H01L 27/1461* (2013.01); *H01L 27/1462* (2013.01);

(Continued)

(58) Field of Classification Search
CPC ............ H01L 27/1461; H01L 27/1462; H01L 27/14629; H01L 27/14683; H01L 27/14643; H01L 27/1464; H01L 31/0232; H01L 31/102; H01L 31/18
USPC .......... 257/432, 447, E31.127, 294, 435, 436, 257/438, 440, 291
See application file for complete search history.

(56) References Cited

U.S. PATENT DOCUMENTS

2003/0214595 A1    11/2003    Mabuchi
2005/0151218 A1    7/2005    Mouli
(Continued)

FOREIGN PATENT DOCUMENTS

| JP | 2006-269789 | 10/2006 |
| JP | 2006-270292 | 10/2006 |
| JP | 2007-088305 | 4/2007 |

OTHER PUBLICATIONS

Official Action (with English translation) for Korean Patent Application No. 10-2014-7021003 mailed Oct. 22, 2014, 13 pages.

(Continued)

*Primary Examiner* — Selim Ahmed
(74) *Attorney, Agent, or Firm* — Sheridan Ross P.C.

(57) ABSTRACT

A solid state imaging device having a light sensing section that performs photoelectric conversion of incident light includes: an insulating layer formed on a light receiving surface of the light sensing section; a layer having negative electric charges formed on the insulating layer; and a hole accumulation layer formed on the light receiving surface of the light sensing section.

20 Claims, 42 Drawing Sheets

(52) U.S. Cl.
CPC ...... *H01L27/1464* (2013.01); *H01L 27/14625* (2013.01); *H01L 27/14629* (2013.01); *H01L 27/14683* (2013.01); *H01L 27/14643* (2013.01)

(56) References Cited

U.S. PATENT DOCUMENTS

| | | |
|---|---|---|
| 2005/0167734 A1 | 8/2005 | She et al. |
| 2006/0033827 A1 | 2/2006 | Kanbe et al. |
| 2007/0034981 A1 | 2/2007 | Saito |
| 2007/0210395 A1* | 9/2007 | Maruyama et al. ........... 257/431 |

OTHER PUBLICATIONS

Official Action (with English translation) for Korean Patent Application No. 10-2008-0099843 mailed Nov. 25, 2014, 14 pages.
Official Action (with English translation) for Korean Patent Application No. 10-2008-131301 mailed Jan. 19, 2015, 12 pages.
Official Action (with English translation) for Chinese Patent Application No. 201310737987.0 mailed Sep. 14, 2015, 17 pages.
Official Action (with English translation) for Chinese Patent Application No. 201310734014.1 dated Nov. 3, 2015, 15 pages.
Official Action (with English translation) for Korean Patent Application No. 10-2015-26536 mailed May 11, 2015, 20 pages.

* cited by examiner (1)

(2)

(3)

(3)

(4)

(5)

(3)

(4)

(5)

(3)

(4)

NEGATIVE VOLTAGE (1)

NEGATIVE VOLTAGE (2)

NEGATIVE VOLTAGE          (3)

NEGATIVE VOLTAGE          (4)

(1)

(2)

(3)

NEGATIVE VOLTAGE (4)

NEGATIVE VOLTAGE (1)

(2)

NEGATIVE VOLTAGE (1)

NEGATIVE VOLTAGE (2)

(3)

(4)

(5)

(1)

(2)

(3)

(1)

(2)

SOLID STATE IMAGING DEVICE FOR
REDUCING DARK CURRENT, METHOD OF
MANUFACTURING THE SAME, AND
IMAGING APPARATUS

RELATED APPLICATION DATA

This application is a continuation of U.S. patent application Ser. No. 12/977,766, filed Dec. 23, 2010, which is a continuation of U.S. patent application Ser. No. 12/244,889, filed Oct. 3, 2008, now U.S. Pat. No. 8,288,836, which claims priority to Japanese Patent Application JP 2007-265287, filed in the Japanese Patent Office on Oct. 11, 2007, the entire disclosures of which are hereby incorporated herein by reference.

BACKGROUND OF THE INVENTION

The present invention relates to a solid state imaging device capable of suppressing generation of a dark current, a method of manufacturing the same, and an imaging apparatus.

Solid state imaging devices, such as a CCD (charge coupled device) and a CMOS image sensor, are widely used in a video camera, a digital still camera, and the like. Improvement in sensitivity and noise reduction are important issues in all kinds of solid state imaging devices.

In particular, a dark current, which is detected as a very small current when an electric charge (electron) generated from a minute defect in a substrate interface of a light receiving surface is input as a signal, or a dark current generated due to the interface state on the interface between the light sensing section and an upper layer even though there is no pure signal charge generated by photoelectric conversion of incident light in a state where there is no incident light is a noise to be reduced in the solid state imaging device.

As a technique of suppressing generation of a dark current caused by the interface state, for example, an embed type photodiode structure having a hole accumulation layer 23 formed of a P⁺ layer on a light sensing section (for example, a photodiode) 12 is used as shown in (2) of FIG. 42. Moreover, in this specification, the embed type photodiode structure is referred to as an HAD (hole accumulated diode) structure. As shown in (1) of FIG. 42, in a structure where the HAD structure is not provided, electrons generated due to the interface state flow to the photodiode as a dark current. On the other hand, as shown in (2) of FIG. 38, in the HAD structure, generation of electrons from the interface is suppressed by the hole accumulation layer 23 formed on the interface. In addition, even if electric charges (electrons) are generated from the interface, the electric charges (electrons) do not flow to a charge accumulation section, which is a potential well in an N⁺ layer of the light sensing section 12, but flow to the hole accumulation layer 23 of the P⁺ layer in which many holes exist. Accordingly, the electric charges (electrons) can be eliminated. As a result, since it can be prevented that the electric charges generated due to the interface are detected as a dark current, the dark current caused by the interface state can be suppressed.

As a method of forming the HAD structure, it is common to perform ion implantation of impurities for forming the P⁺ layer, for example, boron (B) or boron difluoride ($BF_2$) through a thermally oxidized layer or a CVD oxide layer formed on a substrate, to activate injected impurities by annealing, and then to form a p-type region near the interface. However, heat treatment in a high temperature of 700° C. or more is essential in order to activate doped impurities. Accordingly, formation of the hole accumulation layer using ion implantation is difficult in a low-temperature process at 400° C. or less. Also in the case of desiring to avoid long-time activation at high temperature in order to suppress diffusion of dopant, the method of forming a hole accumulation layer in which ion implantation and annealing are performed is not preferable.

Furthermore, when a silicon oxide or a silicon nitride formed on an upper layer of the light sensing section is formed in a low-temperature plasma CVD method, for example, the interface state is reduced compared with an interface between of a light receiving surface and a layer formed at high temperature. The reduction in interface state increases a dark current.

As described above, in the case of desiring to avoid ion implantation and annealing process at high temperature, not only the hole accumulation layer cannot be formed by known ion implantation but also a dark current is further reduced. In order to solve the problem, it becomes necessary to form a hole accumulation layer in another method that is not based on ion implantation in the related art.

For example, there is disclosed a technique in which charged particles having the same polarity as an opposite conduction type are embedded in an insulating layer formed of a silicon oxide on a photoelectric conversion element having a conduction type opposite a conduction type of a semiconductor region formed within a semiconductor region to thereby pull up an electric potential of a surface of the photoelectric conversion section and form an inversion layer on the surface and as a result, generation of a dark current is reduced by preventing depletion of the surface (for example, refer to JP-A-1-256168). However, in the above technique, a technique of embedding the charged particles into the insulating layer is needed, but it is not known which kind of embedding technique is used. In addition, in order to inject electric charges into the insulating layer from the outside as normally used in a nonvolatile memory, an electrode used to inject electric charges is needed. Even if electric charges can be injected from the outside in a non-contact state without using an electrode, the electric charges trapped in the insulating layer are not detrapped. Accordingly, an electric charge holding property becomes a problem. For this reason, since a high-quality insulating layer having a high electric charge holding property is requested, it has been difficult to realize the insulating layer.

SUMMARY OF THE INVENTION

In order to form a sufficient hole accumulation layer by performing ion implantation into a light sensing section (photoelectric conversion section) in high concentration, annealing in high temperature is essential since the light sensing section is damaged by the ion implantation. In this case, however, diffusion of impurities occurs and a photoelectric conversion characteristic deteriorates. On the other hand, when the ion implantation is performed in low concentration in order to reduce damage caused by the ion implantation, the concentration of the hole accumulation layer lowers. As a result, the hole accumulation layer does not sufficiently function as a hole accumulation layer. That is, it is difficult to realize a sufficient hole accumulation layer and to reduce a dark current while maintaining a desired photoelectric conversion characteristic by suppressing diffusion of impurities.

In view of the above, it is desirable to realize a sufficient hole accumulation layer and to reduce a dark current.

According to an embodiment of the present invention, a solid state imaging device (first solid state imaging device) having a light sensing section that performs photoelectric conversion of incident light includes: an interface state lowering layer formed on a light receiving surface of the light sensing section; a layer having negative electric charges formed on the interface state lowering layer; and a hole accumulation layer formed on the light receiving surface of the light sensing section.

In the first solid state imaging device described above, since the layer having negative electric charges is formed on the interface state lowering layer, the hole accumulation layer is sufficiently formed on the light-receiving-surface-side interface of the light sensing section by the electric field generated by negative electric charges. Accordingly, generation of electric charges (electrons) from the interface is suppressed. In addition, even if electric charges (electrons) are generated from the interface, the electric charges (electrons) do not flow to a charge accumulation portion which is a potential well in the light sensing section but flow to the hole accumulation layer in which many holes exist. As a result, the electric charges (electrons) can be eliminated. As a result, since it can be prevented that the electric charges generated due to the interface become a dark current and are detected by the light sensing section, a dark current caused by the interface state is suppressed. Furthermore, generation of electrons due to the interface state is further suppressed since the interface state lowering layer is formed on the light receiving surface of the light sensing section. As a result, it is suppressed that electrons generated due to the interface state flow to the light sensing section as a dark current.

According to another embodiment of the present invention, a solid state imaging device (second solid state imaging device) having a light sensing section that performs photoelectric conversion of incident light includes: an insulating layer that is formed on a light receiving surface of the light sensing section and allows the incident light to be transmitted therethrough; a negative voltage applying layer formed on the insulating layer; and a hole accumulation layer formed on the light receiving surface of the light sensing section.

In the second solid state imaging device described above, since the negative voltage applying layer is formed on the insulating layer formed on the light receiving surface of the light sensing section, the hole accumulation layer is sufficiently formed on the light-receiving-surface-side interface of the light sensing section by the electric field generated when a negative voltage is applied to the negative voltage applying layer. Accordingly, generation of electric charges (electrons) from the interface is suppressed. In addition, even if electric charges (electrons) are generated from the interface, the electric charges (electrons) do not flow to a charge accumulation portion which is a potential well in the light sensing section but flow to the hole accumulation layer in which many holes exist. As a result, the electric charges (electrons) can be eliminated. As a result, since it can be prevented that the electric charges generated due to the interface become a dark current and are detected by the light sensing section, a dark current caused by the interface state is suppressed.

According to still another embodiment of the present invention, a solid state imaging device (third solid state imaging device) having a light sensing section that performs photoelectric conversion of incident light includes: an insulating layer formed on a light receiving surface of the light sensing section; and a layer that is formed on the insulating layer and has a work function value larger than that of a light-receiving-surface-side interface of the light sensing section that performs photoelectric conversion.

In the third solid state imaging device described above, since the layer having a work function value larger than that of the light-receiving-surface-side interface of the light sensing section that performs photoelectric conversion is provided on the insulating layer formed on the light sensing section, holes can be accumulated in the light-receiving-side interface of the light sensing section. As a result, a dark current is reduced.

According to still another embodiment of the present invention, a method (first manufacturing method) of manufacturing a solid state imaging device in which a light sensing section that performs photoelectric conversion of incident light is formed in a semiconductor substrate includes the steps of: forming an interface state lowering layer on the semiconductor substrate formed with the light sensing section; forming a layer having negative electric charges on the interface state lowering layer; and forming a hole accumulation layer on a light receiving surface of the light sensing section with the layer having negative electric charges.

In the method (first manufacturing method) of manufacturing a solid state imaging device, since the layer having negative electric charges is formed on the interface state lowering layer, the hole accumulation layer is sufficiently formed on the light-receiving-surface-side interface of the light sensing section by the electric field generated by negative electric charges. Accordingly, electric charges (electrons) generated from the interface is suppressed. In addition, even if electric charges (electrons) are generated from the interface, the electric charges (electrons) do not flow to a charge accumulation portion which is a potential well in the light sensing section but flow to the hole accumulation layer in which many holes exist. As a result, the electric charges (electrons) can be eliminated. Thus, since it can be prevented that a dark current generated by the electric charges on the interface is detected in the light sensing section, a dark current caused by the interface state is suppressed. Furthermore, generation of electrons due to the interface state is further suppressed since the interface state lowering layer is formed on the light receiving surface of the light sensing section. As a result, it is suppressed that electrons generated due to the interface state flow to the light sensing section as a dark current. In addition, by using the layer having negative electric charges, the HAD structure can be formed without ion implantation and annealing.

According to still another embodiment of the present invention, a method (second manufacturing method) of manufacturing a solid state imaging device in which a light sensing section that performs photoelectric conversion of incident light is formed in a semiconductor substrate includes the steps of: forming an insulating layer, which allows the incident light to be transmitted therethrough, on a light receiving surface of the light sensing section; forming a negative voltage applying layer on the insulating layer; and forming a hole accumulation layer on the light receiving surface of the light sensing section by applying a negative voltage to the negative voltage applying layer.

In the method (second manufacturing method) of manufacturing a solid state imaging device, since the negative voltage applying layer is formed on the insulating layer formed on the light receiving surface of the light sensing section, the hole accumulation layer is sufficiently formed on the light-receiving-surface-side interface of the light sensing section by the electric field generated when a negative voltage is applied to the negative voltage applying layer. Accordingly, electric charges (electrons) generated from the interface is suppressed. In addition, even if electric charges (electrons) are generated from the interface, the electric charges (electrons) do not flow to a charge accumulation portion which is a potential well in the light sensing section but flow to the hole accumulation layer in which many holes exist. As a result, the electric charges (electrons) can be eliminated. Thus, since it can be prevented that a dark current generated by the electric charges on the interface is detected in the light sensing section, a dark current caused by the interface state is suppressed. In addition, by using the layer having negative electric charges, the HAD structure can be formed without ion implantation and annealing.

According to still another embodiment of the present invention, a method (third manufacturing method) of manufacturing a solid state imaging device in which a light sensing section that performs photoelectric conversion of incident light is formed in a semiconductor substrate includes the steps of: forming an insulating layer on a light receiving surface of the light sensing section; and forming a layer, which has a work function value larger than that of a light-receiving-surface-side interface of the light sensing section that performs photoelectric conversion, on the insulating layer.

In the method (third manufacturing method) of manufacturing a solid state imaging device, since the layer having a work function value larger than that of the light-receiving-surface-side interface of the light sensing section that performs photoelectric conversion is provided on the insulating layer formed on the light sensing section, it is possible to form the hole accumulation layer which is formed on the light-receiving-side interface of the light sensing section. As a result, a dark current is reduced.

According to still another embodiment of the present invention, an imaging apparatus (first imaging apparatus) includes: a condensing optical section that condenses incident light; a solid state imaging device that receives the incident light condensed in the condensing optical section and performs photoelectric conversion of the received light; and a signal processing section that processes signal charges photoelectrically converted. The solid state imaging device includes: an interface state lowering layer formed on a light receiving surface of a light sensing section of the solid state imaging device that performs photoelectric conversion of the incident light; a layer having negative electric charges formed on the interface state lowering layer; and a hole accumulation layer formed on the light receiving surface of the light sensing section.

In the first imaging apparatus described above, since the first solid state imaging device according to the embodiment of the present invention is used, a solid state imaging device in which a dark current is reduced can be used.

According to still another embodiment of the present invention, an imaging apparatus (second imaging apparatus) includes: a condensing optical section that condenses incident light; a solid state imaging device that receives the incident light condensed in the condensing optical section and performs photoelectric conversion of the received light; and a signal processing section that processes signal charges photoelectrically converted. The solid state imaging device includes: an insulating layer formed on a light receiving surface of a light sensing section of the solid state imaging device that performs photoelectric conversion of the incident light; and a negative voltage applying layer formed on the insulating layer. The insulating layer allows the incident light to be transmitted therethrough, and a hole accumulation layer is formed on the light receiving surface of the light sensing section.

In the second imaging apparatus described above, since the second solid state imaging device according to the embodiment of the present invention is used, a solid state imaging device in which a dark current is reduced can be used.

According to still another embodiment of the present invention, an imaging apparatus (third imaging apparatus) includes: a condensing optical section that condenses incident light; a solid state imaging device that receives the incident light condensed in the condensing optical section and performs photoelectric conversion of the received light; and a signal processing section that processes signal charges photoelectrically converted. The solid state imaging device includes: an insulating layer formed on an upper layer of a light receiving surface of a light sensing section of the solid state imaging device that converts the incident light into signal charges; and a layer that is formed on the insulating layer and has a work function value larger than that of a light-receiving-surface-side interface of the light sensing section that performs photoelectric conversion.

In the third imaging apparatus described above, since the third solid state imaging device according to the embodiment of the present invention is used, a solid state imaging device in which a dark current is reduced can be used.

In the solid state imaging device according to the embodiment of the present invention, a noise in an imaged image can be reduced because a dark current can be suppressed. As a result, there is an advantage that a high-quality image can be obtained. In particular, generation of a white point (point of a primary color in the case of a color CCD) due to a dark current at the time of long-time exposure with a small exposure amount can be reduced.

In the method of manufacturing a solid state imaging device according to the embodiment of the present invention, a noise in an imaged image can be reduced because a dark current can be suppressed. As a result, there is an advantage that a solid state imaging device capable of obtaining a high-quality image can be realized. In particular, it becomes possible to realize a solid state imaging device capable of reducing generation of a white point (point of a primary color in the case of a color CCD) due to a dark current at the time of long-time exposure with a small exposure amount.

In the imaging apparatus according to the embodiment of the present invention, a noise in an imaged image can be reduced because the solid state imaging device capable of suppressing a dark current is used. As a result, there is an advantage that a high-quality image can be recorded. In particular, generation of a white point (point of a primary color in the case of a color CCD) due to a dark current at the time of long-time exposure with a small exposure amount can be reduced.

DESCRIPTION OF THE PREFERRED EMBODIMENTS

Figure 1:
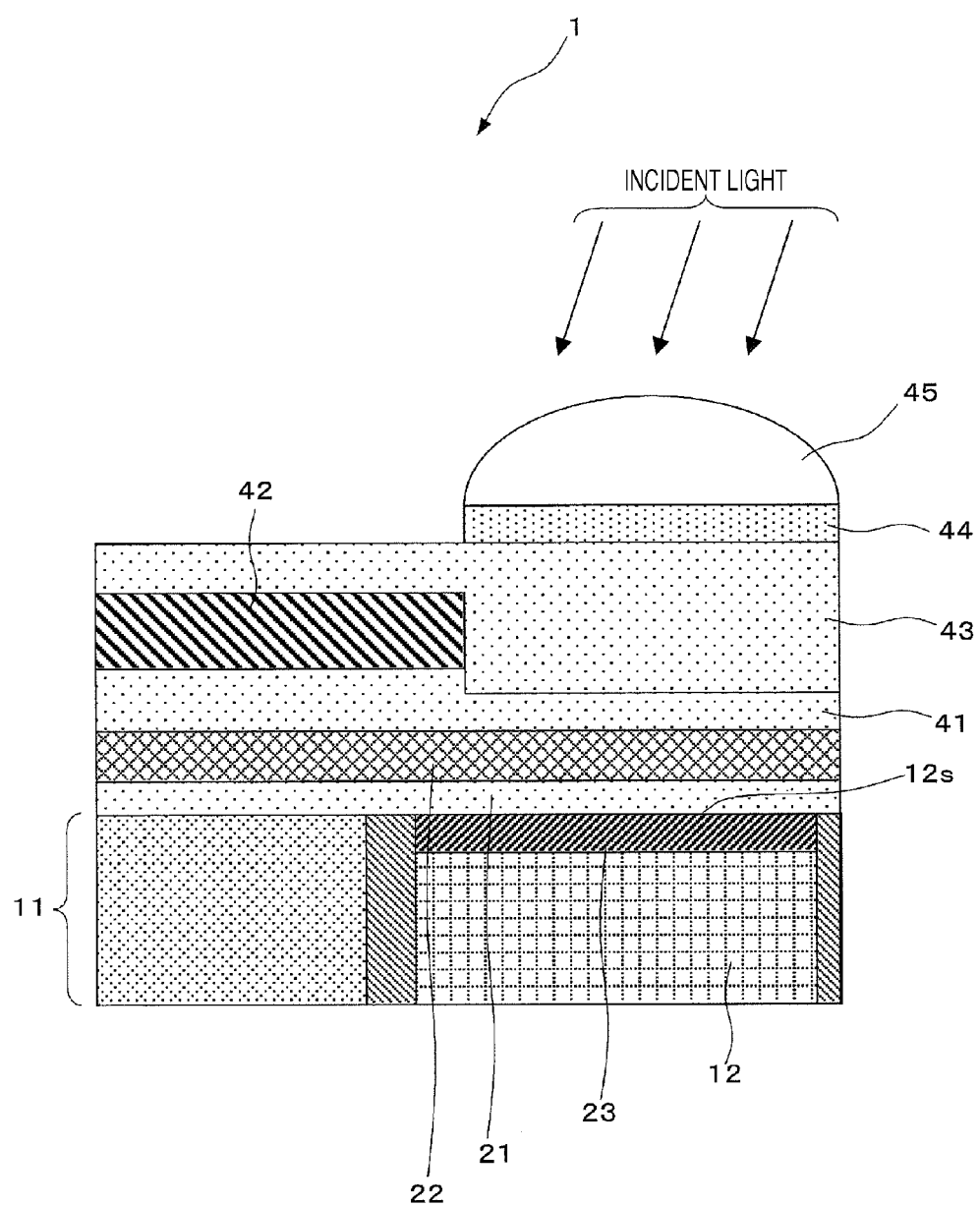
FIG. 1 is a cross-sectional view illustrating the configuration of main parts in a solid state imaging device (first solid state imaging device) according to an embodiment (first example) of the present invention.

A solid state imaging device (first solid state imaging device) according to an embodiment (first example) of the present invention will be described with reference to a cross-sectional view of FIG. 1 illustrating the configuration of main parts.

As shown in FIG. 1, a solid state imaging device 1 includes a light sensing section 12, which performs photoelectric conversion of incident light L, in a semiconductor substrate (or a semiconductor layer) 11. On a side portion of the light sensing section 12, a peripheral circuit section 14 in which a peripheral circuit (not specifically shown) is formed with a pixel separating region 13 interposed therebetween is provided. The following explanation will be made using the semiconductor substrate 11. On a light receiving surface 12s of the light sensing section (including a hole accumulation layer 23 which will be described later) 12, an interface state lowering layer 21 is formed. The interface state lowering layer 21 is formed of a silicon oxide ($SiO_2$) layer, for example. On the interface state reducing layer 21, a layer 22 having negative electric charges is formed. Thus, the hole accumulation layer 23 is formed at the light receiving surface side of the light sensing section 12. Accordingly, at least on the light sensing section 12, the interface state reducing layer 21 is formed in a film thickness that the hole accumulation layer 23 is formed at a side of the light receiving surface 12s of the light sensing section 12 by the layer 22 having negative electric charges. For example, the film thickness is set to be equal to or larger than one atomic layer and equal to or smaller than 100 nm.

In the case when the solid state imaging device 1 is a CMOS image sensor, for example, a pixel circuit configured to include transistors, such as a transfer transistor, a reset transistor, an amplifying transistor, and a selection transistor, is provided as a peripheral circuit of the peripheral circuit section 14. In addition, a driving circuit which performs an operation of reading a signal on a read line of a pixel array section formed by the plurality of light sensing sections 12, a vertical scanning circuit which transmits the read signal, a shift register or an address decoder, a horizontal scanning circuit, and the like are included.

Moreover, in the case when the solid state imaging device 1 is a CCD image sensor, for example, a read gate which reads a signal charge photoelectrically converted by the light sensing section to a vertical transfer gate and a vertical charge transfer section which transmits the read signal charge in the vertical direction are provided as the peripheral circuit of the peripheral circuit section 14. In addition, a horizontal charge transfer section and the like are included.

The layer 22 having negative electric charges is formed of a hafnium oxide ($HfO_2$) layer, an aluminum oxide ($Al_2O_3$) layer, a zirconium oxide ($ZrO_2$) layer, a tantalum oxide ($Ta_2O_5$) layer, or a titanium oxide ($TiO_2$) layer, for example.

Such kinds of layers have been used as a gate insulating layer of an insulated gate field effect transistor and the like. Accordingly, since a layer forming method is known, the layers can be easily formed. Examples of the layer forming method include a chemical vapor deposition method, a sputtering method, and an atomic layer deposition method. Here, it is preferable to use the atomic layer deposition method because an $SiO_2$ layer which lowers the interface state can be simultaneously formed in a thickness of 1 nm during the film formation. In addition, as materials other than those described above, a lanthanum oxide ($La_2O_3$), a praseodymium oxide ($Pr_2O_3$), a cerium oxide ($CeO_2$), a neodymium oxide ($Nd_2O_3$), a promethium oxide ($Pm_2O_3$), a samarium oxide ($Sm_2O_3$), an europium oxide ($Eu_2O_3$), a gadolinium oxide ($Gd_2O_3$), a terbium oxide ($Tb_2O_3$), a dysprosium oxide ($Dy_2O_3$), a holmium oxide ($Ho_2O_3$), an erbium oxide ($Er_2O_3$), a thulium oxide ($Tm_2O_3$), an ytterbium oxide ($Yb_2O_3$), a lutetium oxide ($Lu_2O_3$), an yttrium oxide ($Y_2O_3$), and the like may be mentioned. In addition, the layer 22 having negative electric charges may also be formed of a hafnium nitride layer, an aluminum nitride layer, a hafnium oxynitride layer, or an aluminum oxynitride layer.

The layer 22 having negative electric charges may have silicon (Si) or nitrogen (N) added in a range in which an insulation property is not adversely affected. The concentration is appropriately determined in a range in which an insulation property of the layer is not adversely affected. Thus, it becomes possible to raise the thermal resistance of the layer or an ability to prevent implantation of ions during a process by adding the silicon (Si) or the nitrogen (N).

An insulating layer 41 is formed on the layer 22 having negative electric charges, and a light shielding layer 42 is formed on the insulating layer 41 positioned above the peripheral circuit section 14. A region where light is not incident on the light sensing section 12 is generated by the light shielding layer 42, and a black level in an image is determined by an output of the light sensing section 12. In addition, since it is prevented light from being incident on the peripheral circuit section 14, a characteristic change caused by light incident on the peripheral circuit section is suppressed. Moreover, an insulating layer 43 which allows the incident light to be transmitted therethrough is formed. It is preferable that a surface of the insulating layer 43 be flat. Furthermore, a color filter layer 44 and a condensing lens 45 are formed on the insulating layer 43.

In the solid state imaging device (first solid state imaging device) 1, the layer 22 having negative electric charges is formed on the interface state reducing layer 21. Accordingly, an electric field is applied to a surface of the light sensing section 12 through the interface state reducing layer 21 by negative electric charges in the layer 22 having negative electric charges, such that the hole accumulation layer 23 is formed on the surface of the light sensing section 12.

Figure 2:
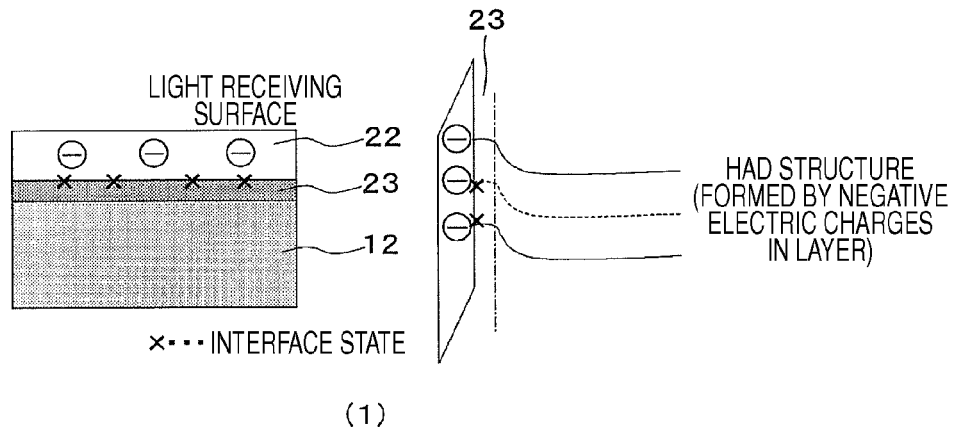
FIG. 2 is an energy band view explaining an effect of the solid state imaging device (first solid state imaging device) according to the embodiment of the present invention.
Figure 2:
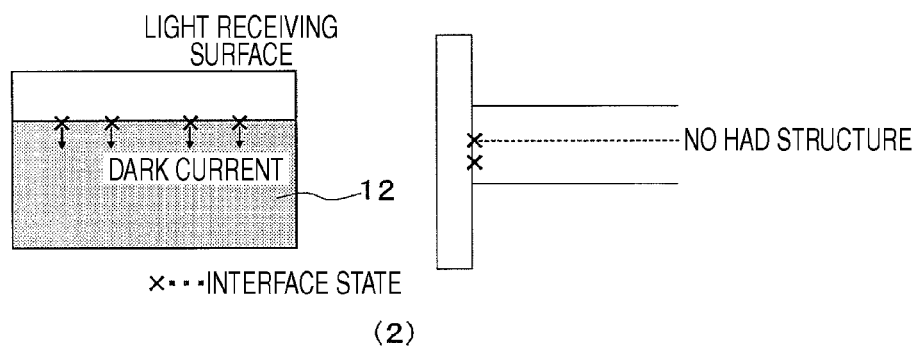
Figure 2:
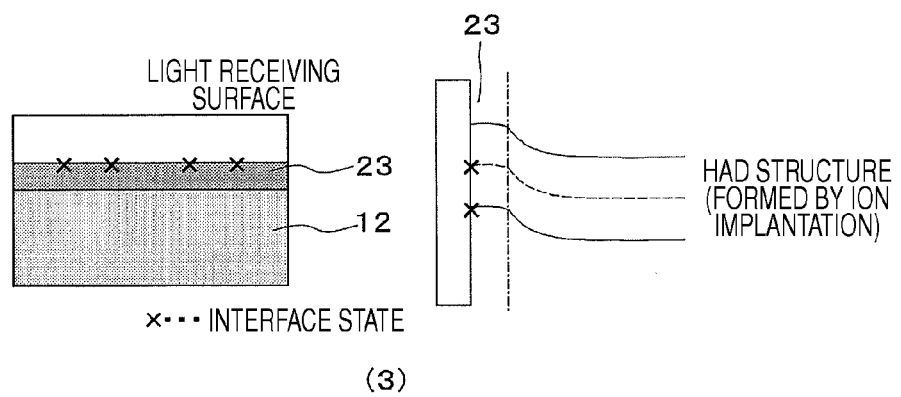

In addition, as shown in (1) of FIG. 2, the neighborhood of the interface can be used as the hole accumulation layer 23 by the negative electric charges present in the layer from immediately after forming the layer 22 having negative electric charges. Accordingly, a dark current generated by the interface state on the interface between the light sensing section 12 and the interface state reducing layer 21 is suppressed. That is, electric charges (electrons) generated from the interface is suppressed. In addition, even if electric charges (electrons) are generated from the interface, the electric charges (electrons) do not flow to a charge accumulation portion which is a potential well in the light sensing section 12 but flow to the hole accumulation layer 23 in which many holes exist and accordingly, the electric charges (electrons) can be eliminated. As a result, since it can be prevented that a dark current generated by the electric charges on the interface is detected in the light sensing section 12, a dark current caused by the interface state is suppressed.

On the other hand, in a configuration in which the hole accumulation layer is not provided as shown in (2) of FIG. 2, a dark current is generated due to the interface state. As a result, a problem that the dark current flows to the light sensing section 12 occurs. In addition, in a configuration in which the hole accumulation layer 23 is formed by ion implantation as shown in (3) of FIG. 2, the hole accumulation layer 23 is formed. However, since heat treatment at high temperature of 700° C. or more is essential in order to activate impurities doped in the ion implantation as described above, the impurities are diffused to extend the hole accumulation layer of the interface. As a result, since a region where photoelectric conversion occurs becomes narrow, it becomes difficult to obtain a desired photoelectric conversion characteristic.

Furthermore, in the solid state imaging device 1, generation of electrons due to the interface state is further suppressed since the interface state reducing layer 21 is formed on the light receiving surface 12s of the light sensing section 12. As a result, it is suppressed that electrons generated due to the interface state flow to the light sensing section 12 as a dark current.

Furthermore, in the case of using a hafnium oxide layer as the layer 22 having negative electric charges, it becomes possible to obtain an anti-reflection effect as well as to form an HAD structure by optimizing the film thickness, since the refractive index of the hafnium oxide layer is about 2. Also in the case of materials other than the hafnium oxide layer, it becomes possible to obtain the anti-reflection effect with a material having a high refractive index by optimizing the film thickness.

In addition, in the case where a silicon oxide and a silicon nitride that have been used in a known solid state imaging device are formed at low temperature, it is known that electric charges in a layer become positive charges. In this case, it is difficult to form the HAD structure with negative electric charges.

Figure 3:
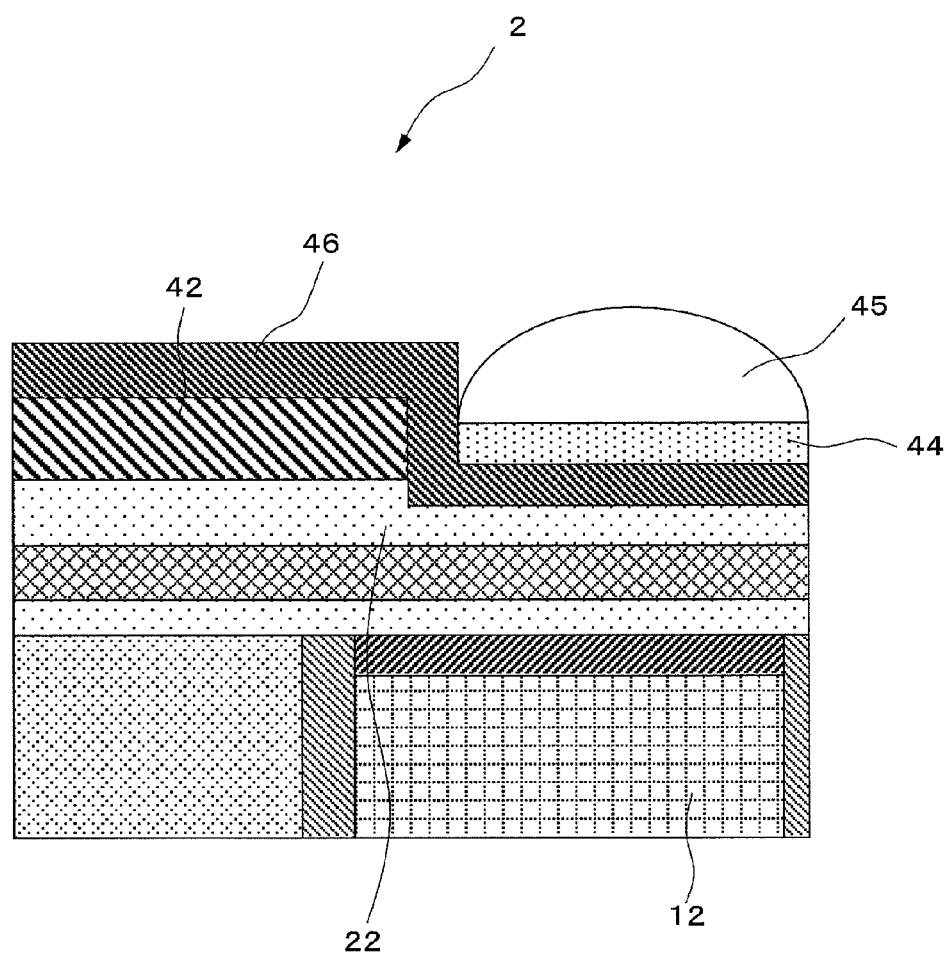
FIG. 3 is a cross-sectional view illustrating the configuration of main parts in a modification of the solid state imaging device (first solid state imaging device)

Next, a modification of the solid state imaging device (first solid state imaging device) 1 will be described with reference to a cross-sectional view of FIG. 3 illustrating the configuration of main parts.

As shown in FIG. 3, a solid state imaging device 2 has an anti-reflection layer 46 formed on the layer 22 having negative electric charges, in the case when the anti-reflection effect on the light sensing section 12 is not sufficient only with the layer 22 having negative electric charges in the solid state imaging device 1. The anti-reflection layer 46 is formed of a silicon nitride layer, for example. In addition, the insulating layer 43 formed in the solid state imaging device 1 is not formed. Accordingly, a color filter layer 44 and a condensing lens 45 are formed on the anti-reflection layer 46. Thus, it becomes possible to maximize the anti-reflection effect by additionally forming the silicon nitride layer. This configuration may also be applied to a solid state imaging device 3 to be described later.

Thus, since reflection before light is incident on the light sensing section 12 can be reduced by forming the anti-reflection layer 46, the amount of light incident on the light sensing section 12 can be increased. As a result, the sensitivity of the solid state imaging device 2 can be improved.

Figure 4:
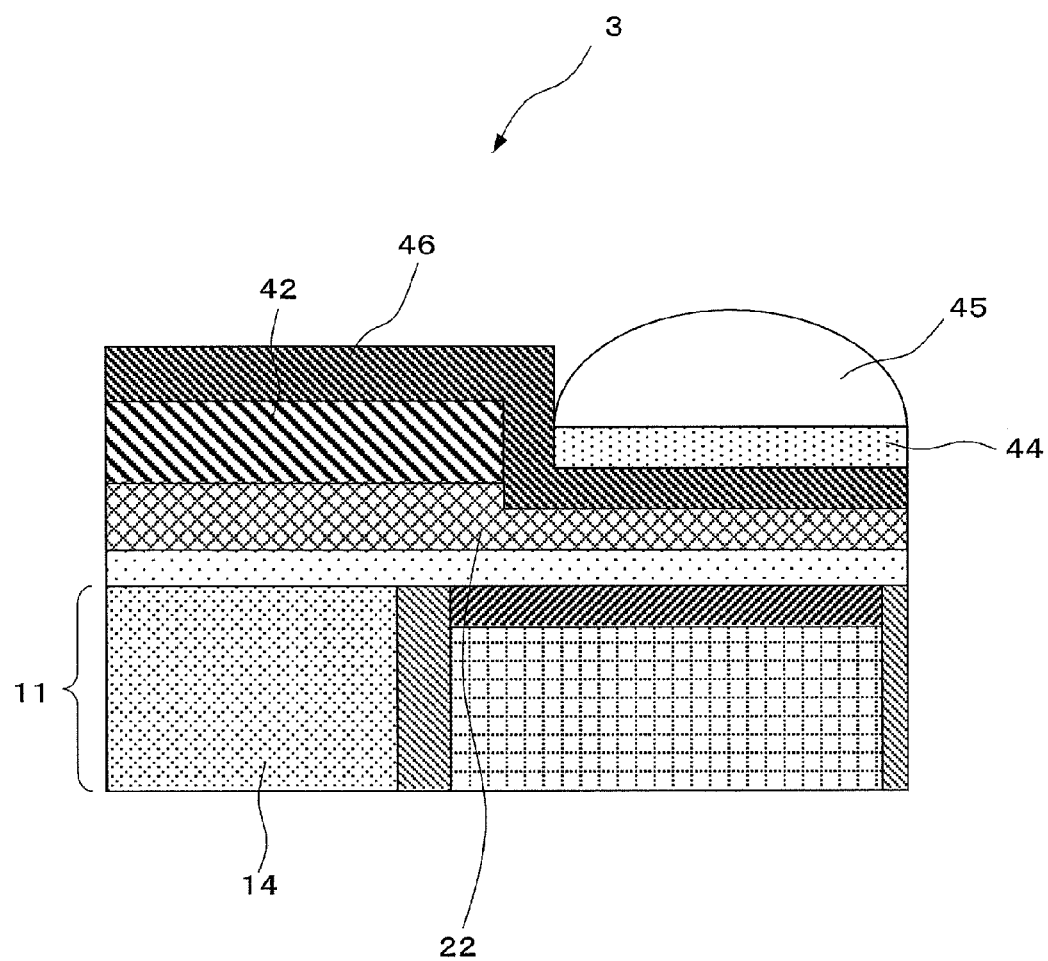
FIG. 4 is a cross-sectional view illustrating the configuration of main parts in a modification of the solid state imaging device (first solid state imaging device)

Next, a modification of the solid state imaging device (first solid state imaging device) 1 will be described with reference to a cross-sectional view of FIG. 4 illustrating the configuration of main parts.

As shown in FIG. 4, a solid state imaging device 3 is obtained by directly forming the light shielding layer 42 on the layer 22 having negative electric charges without forming the insulating layer 41 in the solid state imaging device 1. In addition, the insulating layer 43 is not formed but the anti-reflection layer 46 is formed.

Thus, since the light shielding layer 42 is directly formed on the layer 22 having negative electric charges, the light shielding layer 42 can be brought close to the surface of the semiconductor substrate 11. As a result, since a distance between the light shielding layer 42 and the semiconductor substrate 11 can be narrowed, light components obliquely incident from an upper layer of a neighboring light sensing section (photodiode), that is, optical mixed color components can be reduced.

Figure 5:
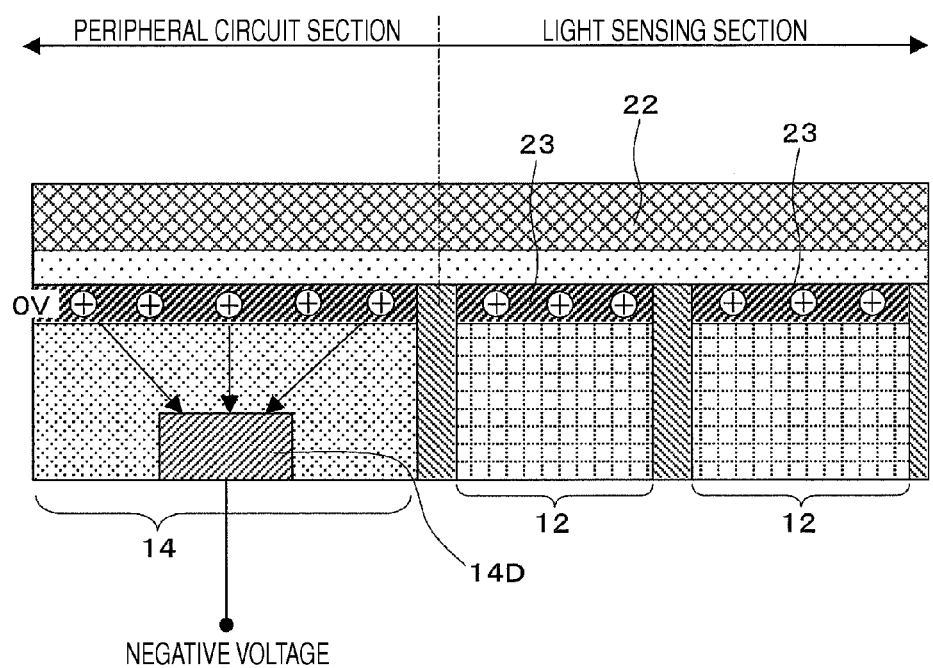
FIG. 5 is a cross-sectional view illustrating the configuration of main parts for explaining negative electric charges in a case when a layer having negative electric charges is in the neighborhood on a peripheral circuit section.

Furthermore, when the layer 22 having negative electric charges is in the neighborhood on the peripheral circuit section 14 as shown in FIG. 5, a dark current generated due to the interface state on the surface of the light sensing section 12 can be suppressed by the hole accumulation layer 23 formed by the negative electric charges of the layer 22 having negative electric charges. However, in the peripheral circuit section 14, a potential difference occurs between a side of the light sensing section 12 and an element 14D existing on a surface side. Accordingly, unexpected carriers flow from the surface of the light sensing section 12 to the surface-side element 14D, resulting in malfunction of the peripheral circuit section 14. The configurations for avoiding such malfunction will be described in the following second and third examples.

Figure 6:
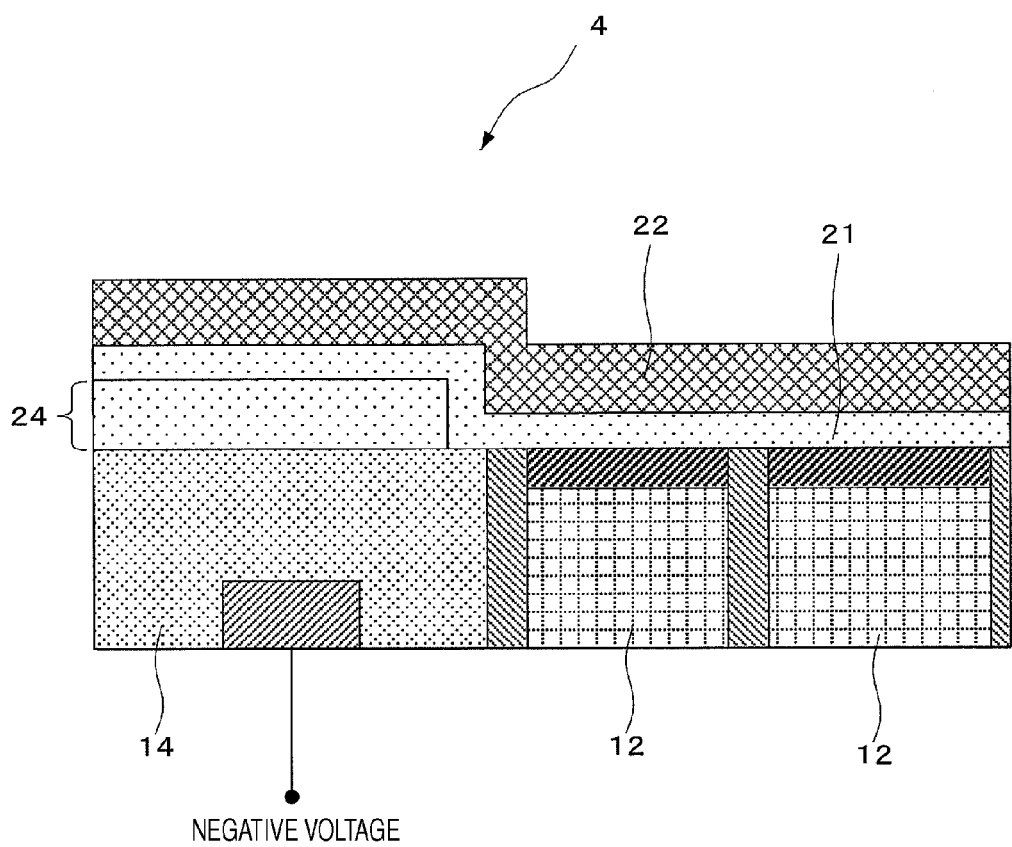
FIG. 6 is a cross-sectional view illustrating the configuration of main parts in a solid state imaging device (first solid state imaging device) according to an embodiment (second example) of the present invention.

Next, a solid state imaging device (first solid state imaging device) according to an embodiment (second example) of the present invention will be described with reference to a cross-sectional view of FIG. 6 illustrating the configuration of main parts. In addition, in FIG. 6, a light shielding layer for shielding a part of a light sensing section and a peripheral circuit section, a color filter layer for spectral filtering of light incident on the light sensing section, a condensing lens for condensing light incident on the light sensing section, and the like are not shown.

As shown in FIG. 6, in a solid state imaging device 4, an insulating layer 24 is formed between the surface of the peripheral circuit section 14 and the layer 22 having negative electric charges such that a distance of the layer 22 having negative electric charges from the surface of the peripheral circuit section 14 is larger than a distance of the layer 22 having negative electric charges from the surface of the light sensing section 12 in the solid state imaging device 1. The insulating layer 24 may be obtained by forming the interface state lowering layer 21 on the peripheral circuit section 14 to be thicker than that on the light sensing section 12, when the interface state lowering layer 21 is formed of a silicon oxide layer.

Thus, since the insulating layer 24 is formed between the surface of the peripheral circuit section 14 and the layer 22 having negative electric charges such that the distance of the layer 22 having negative electric charges from the surface of the peripheral circuit section 14 is larger than the distance of the layer 22 having negative electric charges from the light sensing section 12, a peripheral circuit of the peripheral circuit section 14 is not affected by the electric field of negative electric charges in the layer 22 having negative electric charges. As a result, it is possible to prevent the peripheral circuit from malfunctioning due to the negative electric charges.

Figure 7:
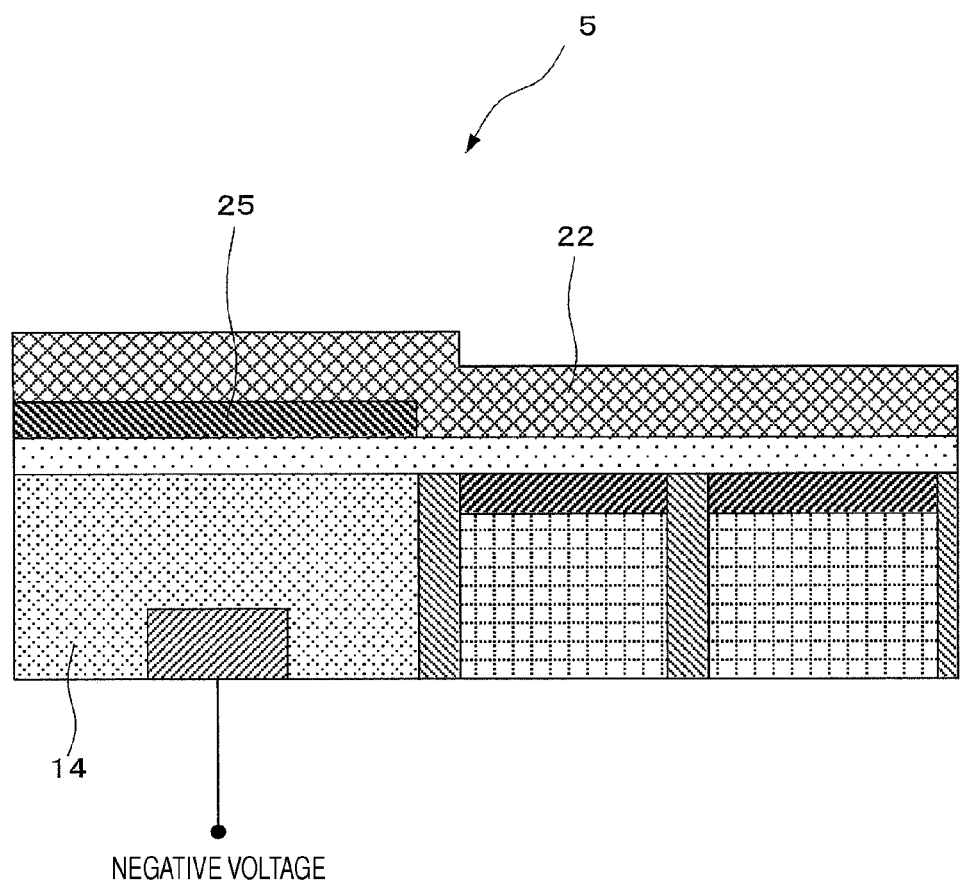
FIG. 7 is a cross-sectional view illustrating the configuration of main parts in a solid state imaging device (first solid state imaging device) according to an embodiment (third example) of the present invention.

Next, a solid state imaging device (first solid state imaging device) according to an embodiment (third example) of the present invention will be described with reference to a cross-sectional view of FIG. 7 illustrating the configuration of main parts. In addition, in FIG. 7, a light shielding layer for shielding a part of a light sensing section and a peripheral circuit section, a color filter layer for spectral filtering of light incident on the light sensing section, a condensing lens for condensing light incident on the light sensing section, and the like are not shown.

As shown in FIG. 7, a solid state imaging device 5 is obtained by forming a layer 25 for increasing a distance between the layer having negative electric charges and the light receiving surface between the peripheral circuit section 14 and the layer 22 having negative electric charges in the solid state imaging device 1. It is preferable that the layer 25 having positive electric charges in order to eliminate an influence of the negative electric charges, and it is preferable to use a silicon nitride for the layer 25.

Thus, since the layer 25 having positive electric charges is formed between the peripheral circuit section 14 and the layer 22 having negative electric charges, the negative electric charges of the layer 22 having negative electric charges can be reduced by the positive electric charges in the layer 25. Accordingly, the peripheral circuit section 14 is not affected by the electric field of the negative electric charges in the layer 22 having negative electric charges. As a result, it is possible to prevent the peripheral circuit section 14 from malfunctioning due to the negative electric charges. As described above, the configuration in which the layer 25 having positive electric charges is formed between the peripheral circuit section 14 and the layer 22 having negative electric charges may also be applied to the solid state imaging devices 1, 2, 3, and 4, and the same effects as in the solid state imaging device 5 can be obtained.

Each of the solid state imaging devices 4 and 5 is configured such that a light shielding layer for shielding a part of the light sensing section 12 and the peripheral circuit section 14, a color filter layer for spectral filtering of light incident on at least the light sensing section 12, a condensing lens for condensing light incident on the light sensing section 12, and the like are provided on the layer 22 having negative electric charges. As an example of such a configuration, any one of the configurations of the solid state imaging devices 1, 2, and 3 may also be applied.

Figure 8:
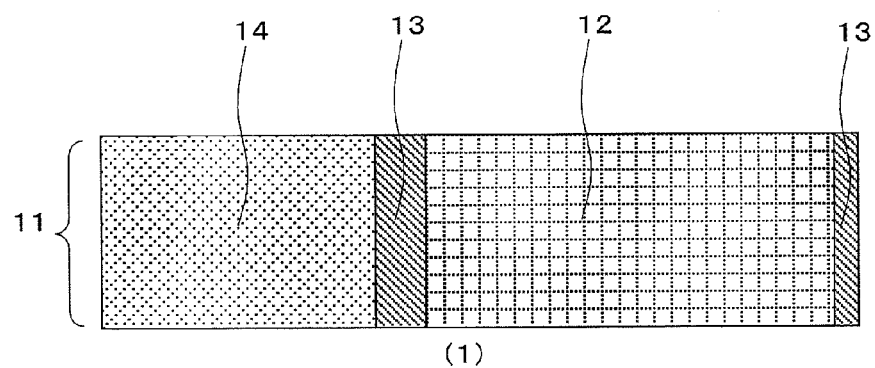
FIG. 8 is a cross-sectional view illustrating a manufacturing process in a method (first manufacturing method) of manufacturing a solid state imaging device according to an embodiment (first example) of the present invention.
Figure 8:
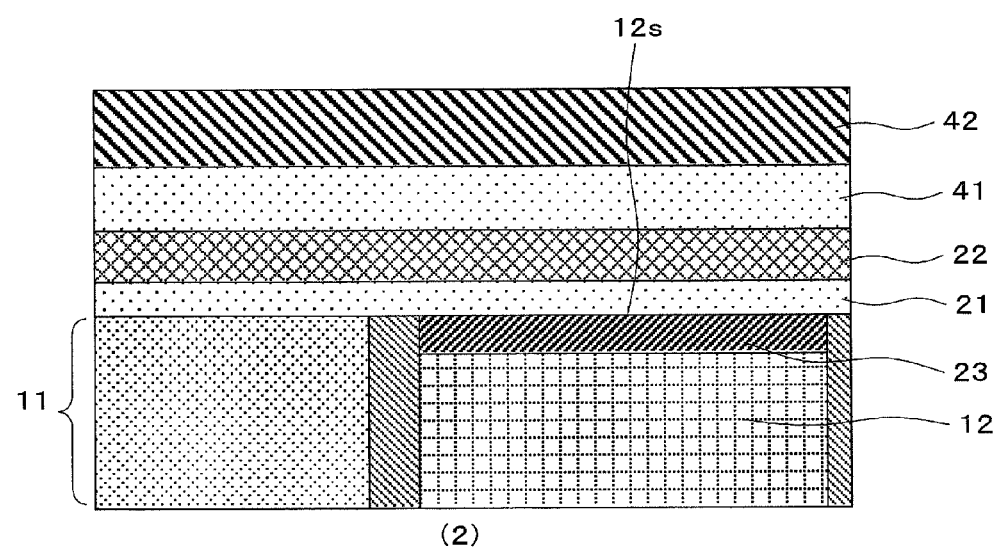
Figure 9:
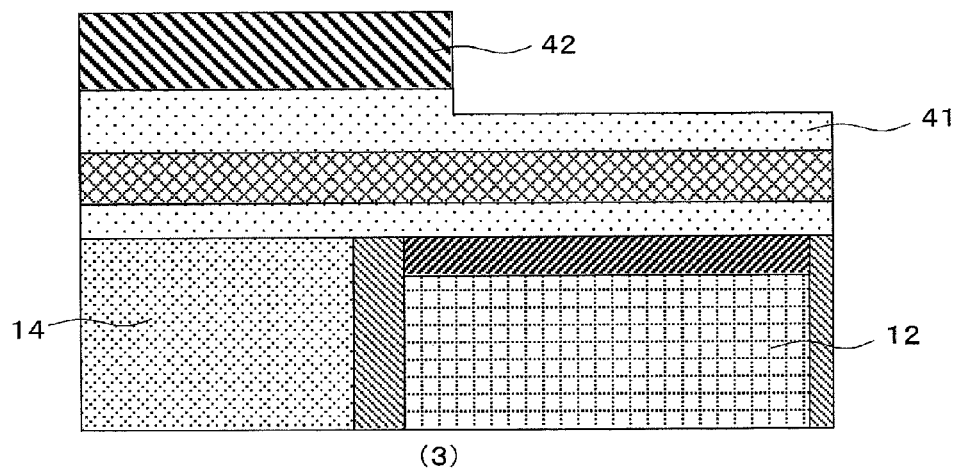
FIG. 9 is a cross-sectional view illustrating a manufacturing process in a method (first manufacturing method) of manufacturing a solid state imaging device according to an embodiment (first example) of the present invention.
Figure 9:
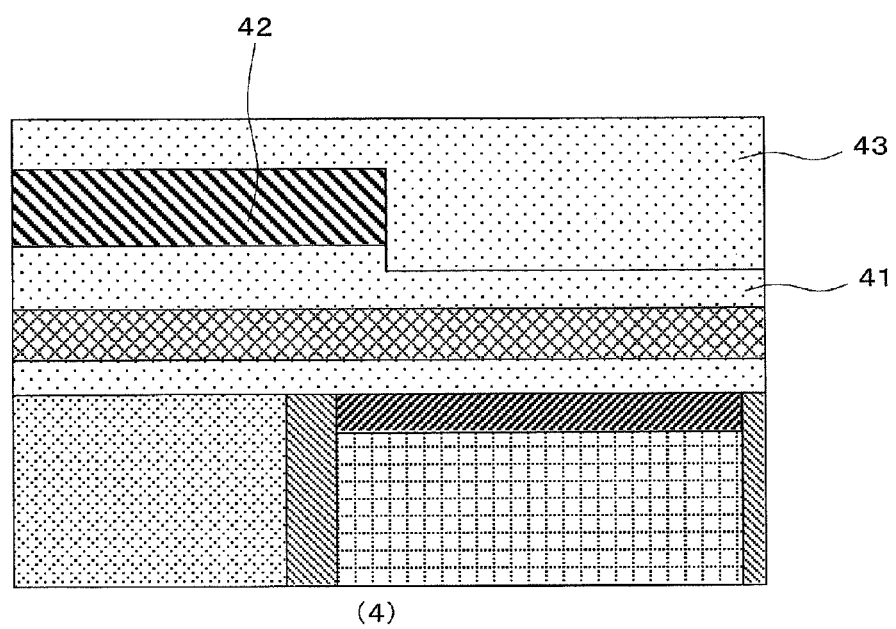
Figure 10:
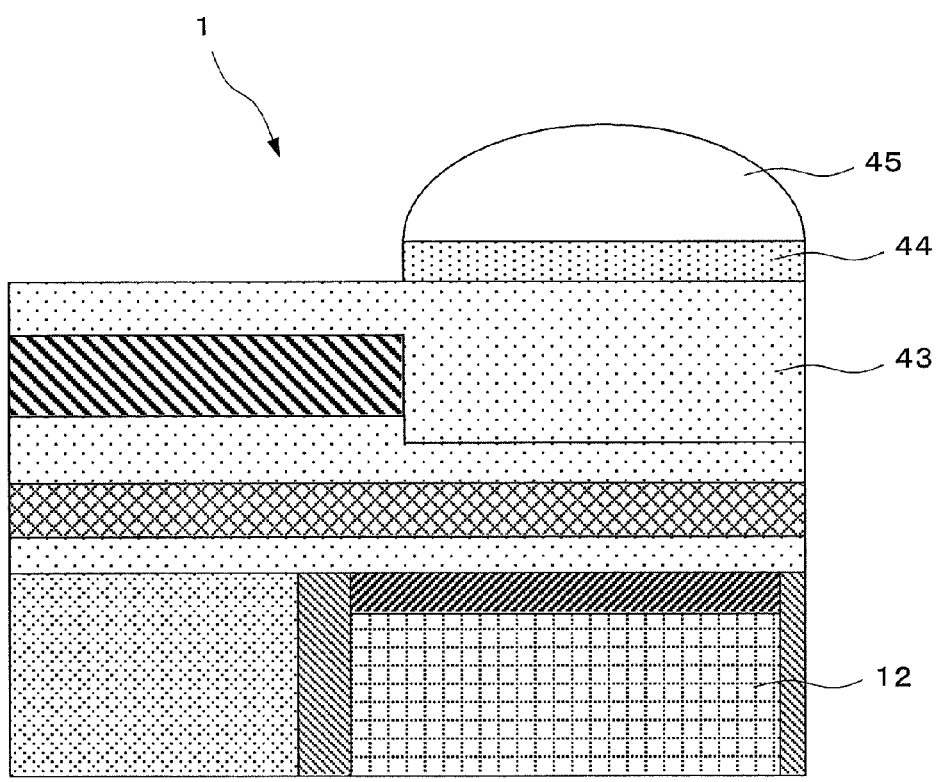
FIG. 10 is a cross-sectional view illustrating a manufacturing process in a method (first manufacturing method) of manufacturing a solid state imaging device according to an embodiment (first example) of the present invention.

Next, a method (first manufacturing method) of manufacturing a solid state imaging device according to an embodiment (first example) of the present invention will be described with reference to cross-sectional views of a manufacturing process of FIGS. 8 to 10 illustrating main parts. In FIGS. 8 to 10, a manufacturing process of the solid state imaging device 1 is shown as an example.

As shown in (1) of FIG. 8, the light sensing section 12 which performs photoelectric conversion of incident light, the pixel separating region 13 for separating the light sensing section 12, the peripheral circuit section 14 in which a peripheral circuit (not specifically shown) is formed with the pixel separating region 13 interposed between the peripheral circuit section 14 and the light sensing section 12, and the like are formed in the semiconductor substrate (or semiconductor layer) 11. A known manufacturing method is used as the manufacturing method.

Then, as shown in (2) of FIG. 8, the interface state lowering layer 21 is formed on the light receiving surface 12s of the light sensing section 12, actually, on the semiconductor substrate 11. The interface state lowering layer 21 is formed of a silicon oxide ($SiO_2$) layer, for example. Subsequently, the layer 22 having negative electric charges is formed on the interface state lowering layer 21. Thus, the hole accumulation layer 23 is formed at the light receiving surface side of the light sensing section 12. Accordingly, at least on the light sensing section 12, the interface state lowering layer 21 needs to be formed in a film thickness that the hole accumulation layer 23 is formed at a side of the light receiving surface 12s of the light sensing section 12 by the layer 22 having negative electric charges. For example, the film thickness is set to be equal to or larger than one atomic layer and equal to or smaller than 100 nm.

The layer 22 having negative electric charges is formed of a hafnium oxide ($HfO_2$) layer, an aluminum oxide ($Al_2O_3$) layer, a zirconium oxide ($ZrO_2$) layer, a tantalum oxide ($Ta_2O_5$) layer, or a titanium oxide ($TiO_2$) layer, for example. Such kinds of layers have been used as a gate insulating layer of an insulated gate field effect transistor and the like. Accordingly, since a layer forming method is known, the layers can be easily formed. For example, a chemical vapor deposition method, a sputtering method, and an atomic layer deposition method may be used as the layer forming method. Here, it is preferable to use the atomic layer deposition method because an $SiO_2$ layer which lowers the interface state can be simultaneously formed in a thickness of 1 nm during the film formation.

In addition, as materials other than those described above, a lanthanum oxide ($La_2O_3$), a praseodymium oxide ($Pr_2O_3$), a cerium oxide ($CeO_2$), a neodymium oxide ($Nd_2O_3$), a promethium oxide ($Pm_2O_3$), a samarium oxide ($Sm_2O_3$), an europium oxide ($Eu_2O_3$), a gadolinium oxide ($Gd_2O_3$), a terbium oxide ($Tb_2O_3$), a dysprosium oxide ($Dy_2O_3$), a holmium oxide ($Ho_2O_3$), an erbium oxide ($Er_2O_3$), a thulium oxide ($Tm_2O_3$), an ytterbium oxide ($Yb_2O_3$), a lutetium oxide ($Lu_2O_3$), an yttrium oxide ($Y_2O_3$), and the like may be used. In addition, the layer 22 having negative electric charges may also be formed of a hafnium nitride layer, an aluminum nitride layer, a hafnium oxynitride layer, or an aluminum oxynitride layer. These layers may also be formed by using the chemical vapor deposition, the sputtering method, or the atomic layer deposition, for example.

In addition, the layer 22 having negative electric charges may have silicon (Si) or nitrogen (N) added in a range in which an insulation property is not adversely affected. The concentration is appropriately determined in a range in which an insulation property of the layer is not adversely affected. Thus, it becomes possible to raise the thermal resistance of the layer or an ability to prevent implantation of ions during a process by adding the silicon (Si) or the nitrogen (N).

In addition, in the case of forming the layer 22 having negative electric charges with a hafnium oxide ($HfO_2$) layer, it becomes possible to obtain the anti-reflection effect efficiently by adjusting the film thickness, since the refractive index of the hafnium oxide ($HfO_2$) layer is about 2. Naturally, also for other kinds of layers, the anti-reflection effect can be obtained by optimizing the film thickness according to the refractive index.

Then, the insulating layer 41 is formed on the layer 22 having negative electric charges, and then the light shielding layer 42 is formed on the insulating layer 41. The insulating layer 41 is formed of a silicon oxide layer, for example. In addition, the light shielding layer 42 is formed of a metallic layer having a light shielding property, for example. Thus, reaction of metal of the light shielding layer 42 and the layer 22 having negative electric charges formed of a hafnium oxide layer, for example, can be prevented by forming the light shielding layer 42 on the layer 22 having negative electric charges with the insulating layer 41 interposed therebetween. In addition, since the insulating layer 42 serves as an etching stopper when the light shielding layer is etched, etching damage to the layer 22 having electric charges can be prevented.

Then, as shown in (3) of FIG. 9, a resist mask (not shown) is formed on a part of the light sensing section 12 and the light shielding layer 42 positioned above the peripheral circuit section 14 by resist application and lithography technique and then the light shielding layer 42 is processed by etching using the resist mask to thereby make the light shielding layer 42 left on the part of the light sensing section 12 and the insulating layer 41 positioned above the peripheral circuit section 14. A region where light is not incident on the light sensing section 12 is generated by the light shielding layer 42, and a black level in an image is determined by an output of the light sensing section 12. In addition, since it is prevented light from being incident on the peripheral circuit section 14, a characteristic change caused by light incident on the peripheral circuit section is suppressed.

Then, as shown in (4) of FIG. 9, the insulating layer 43 for reducing a level difference caused by the light shielding layer 42 is formed on the insulating layer 41. A surface of the insulating layer 43 is preferably flat and is formed of a coating insulating layer, for example.

Then, as shown in (5) of FIG. 10, the color filter layer 44 is formed on the insulating layer 43 positioned above the light sensing section 12 and then the condensing lens 45 is formed on the color filter layer 44 by a known manufacturing technique. In this case, a light-transmissive insulating layer (not shown) may be formed between the color filter layer 44 and the condensing lens 45 in order to prevent machining damage to the color filter layer 44 at the time of lens processing. Thus, the solid state imaging device 1 is formed.

In the first example of the method (first manufacturing method) of manufacturing a solid state imaging device, the layer 22 having negative electric charges is formed on the interface state lowering layer 21. Accordingly, by the electric field generated by negative electric charges in the layer 22 having negative electric charges, the hole accumulation layer 23 is sufficiently formed on the light-receiving-surface-side interface of the light sensing section 12. Accordingly, electric charges (electrons) generated from the interface is suppressed. In addition, even if electric charges (electrons) are generated from the interface, the electric charges (electrons) do not flow to a charge accumulation portion which is a potential well in the light sensing section 12 but flow to the hole accumulation layer 23 in which many holes exist. As a result, the electric charges (electrons) can be eliminated. Thus, since it can be prevented that a dark current generated by the electric charges on the interface is detected in the light sensing section, a dark current caused by the interface state is suppressed. Furthermore, generation of electrons due to the interface state is further suppressed since the interface state lowering layer 21 is formed on the light receiving surface of the light sensing section 12. As a result, it is suppressed that electrons generated due to the interface state flow to the light sensing section 12 as a dark current. In addition, by using the layer 22 having negative electric charges, the HAD structure can be formed without ion implantation and annealing.

Figure 11:
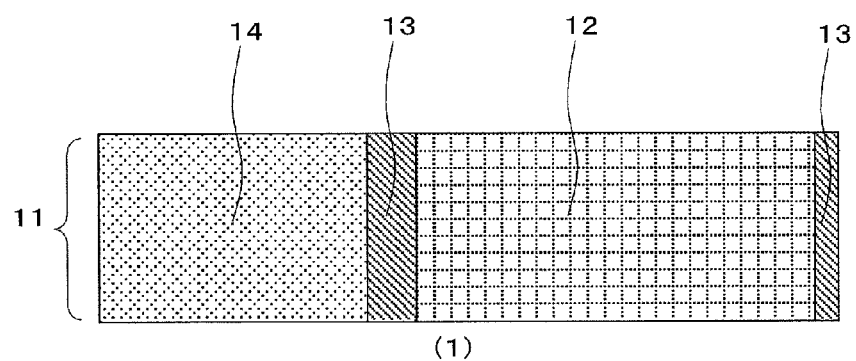
FIG. 11 is a cross-sectional view illustrating a manufacturing process in a method (first manufacturing method) of manufacturing a solid state imaging device according to an embodiment (second example) of the present invention.
Figure 11:
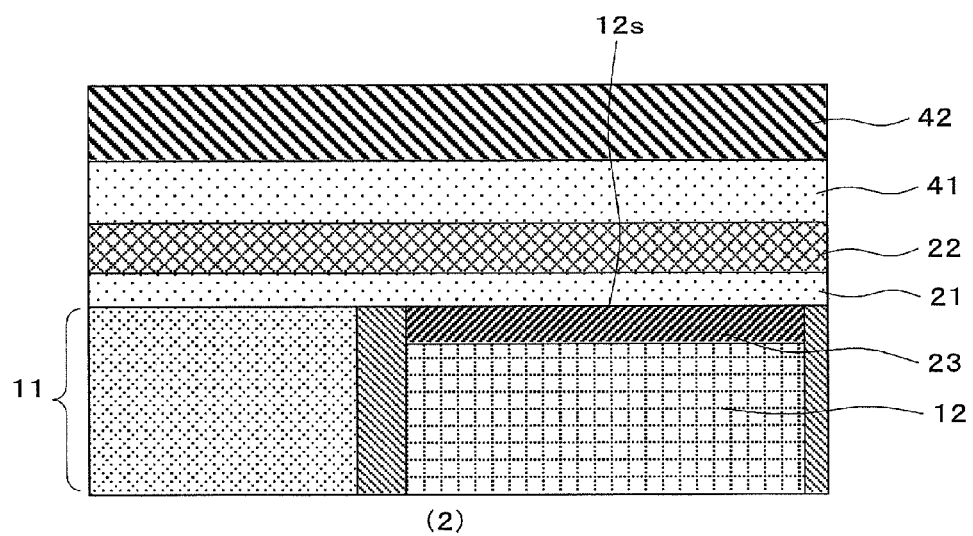
Figure 12:
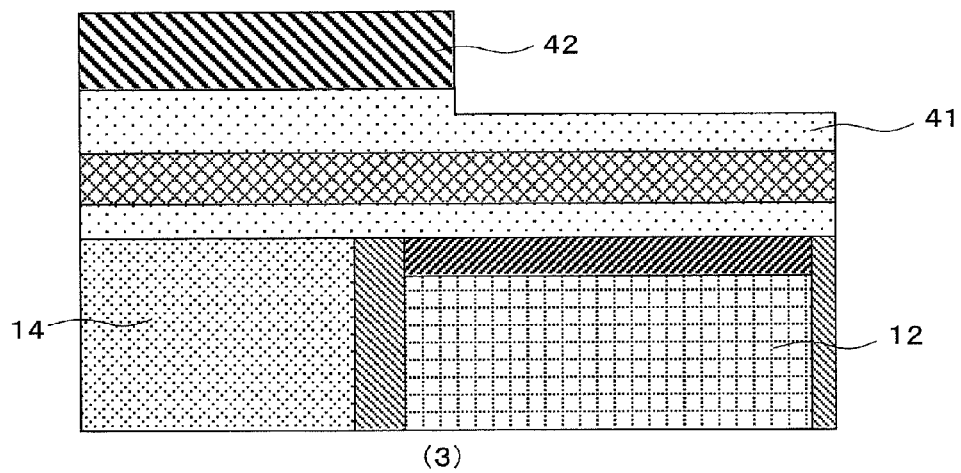
FIG. 12 is a cross-sectional view illustrating a manufacturing process in a method (first manufacturing method) of manufacturing a solid state imaging device according to an embodiment (second example) of the present invention.
Figure 12:
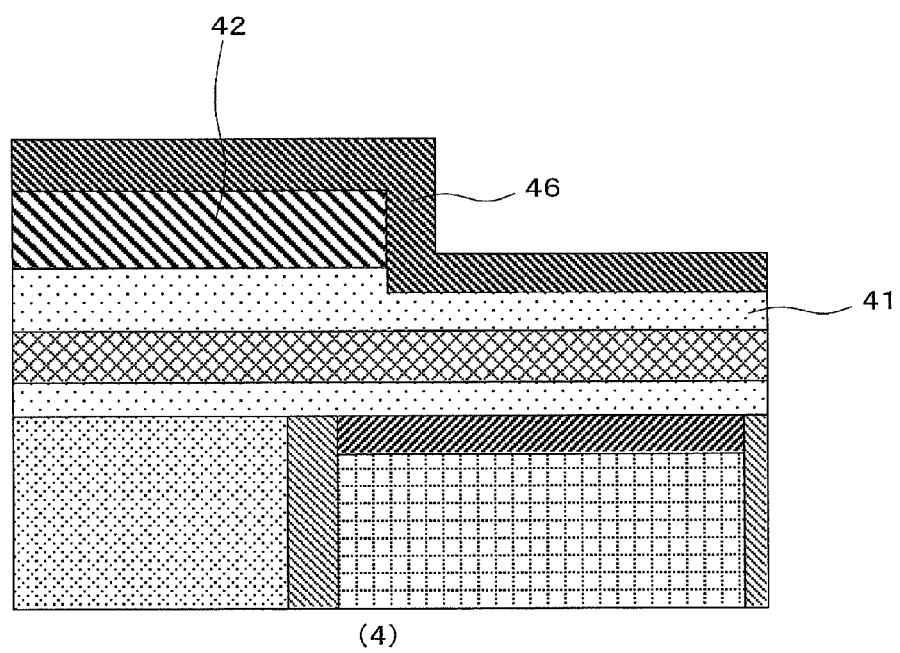
Figure 13:
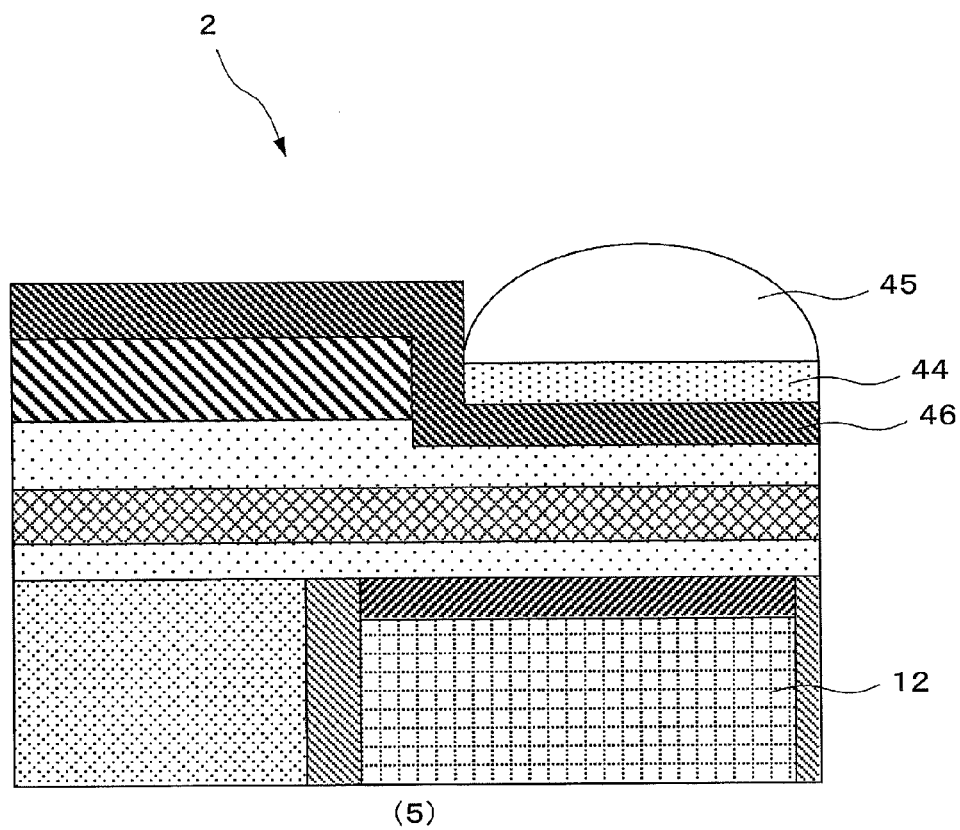
FIG. 13 is a cross-sectional view illustrating a manufacturing process in a method (first manufacturing method) of manufacturing a solid state imaging device according to an embodiment (second example) of the present invention.

Next, a method (first manufacturing method) of manufacturing a solid state imaging device according to an embodiment (second example) of the present invention will be described with reference to cross-sectional views of a manufacturing process of FIGS. 11 to 13 illustrating main parts. In FIGS. 11 to 13, a manufacturing process of the solid state imaging device 2 is shown as an example.

As shown in (1) of FIG. 11, the light sensing section 12 which performs photoelectric conversion of incident light, the pixel separating region 13 for separating the light sensing section 12, the peripheral circuit section 14 in which a peripheral circuit (not specifically shown) is formed with the pixel separating region 13 interposed between the peripheral circuit section 14 and the light sensing section 12, and the like are formed in the semiconductor substrate (or semiconductor layer) 11. A known manufacturing method is used as the manufacturing method.

Then, as shown in (2) of FIG. 11, the interface state lowering layer 21 is formed on the light receiving surface 12s of the light sensing section 12, actually, on the semiconductor substrate 11. The interface state lowering layer 21 is formed of a silicon oxide ($SiO_2$) layer, for example. Subsequently, the layer 22 having negative electric charges is formed on the interface state lowering layer 21. Thus, the hole accumulation layer 23 is formed at the light receiving surface side of the light sensing section 12. Accordingly, at least on the light sensing section 12, the interface state lowering layer 21 needs to be formed in a film thickness that the hole accumulation layer 23 is formed at a side of the light receiving surface 12s of the light sensing section 12 by the layer 22 having negative electric charges. For example, the film thickness is set to be equal to or larger than one atomic layer and equal to or smaller than 100 nm.

The layer 22 having negative electric charges is formed of a hafnium oxide ($HfO_2$) layer, an aluminum oxide ($Al_2O_3$) layer, a zirconium oxide ($ZrO_2$) layer, a tantalum oxide ($Ta_2O_5$) layer, or a titanium oxide ($TiO_2$) layer, for example. Such kinds of layers have been used as a gate insulating layer of an insulated gate field effect transistor and the like. Accordingly, since a layer forming method is known, the layers can be easily formed. For example, the chemical vapor deposition method, the sputtering method, and the atomic layer deposition method may be used as the layer forming method.

In addition, as materials other than those described above, a lanthanum oxide ($La_2O_3$), a praseodymium oxide ($Pr_2O_3$), a cerium oxide ($CeO_2$), a neodymium oxide ($Nd_2O_3$), a promethium oxide ($Pm_2O_3$), a samarium oxide ($Sm_2O_3$), an europium oxide ($Eu_2O_3$), a gadolinium oxide ($Gd_2O_3$), a terbium oxide ($Tb_2O_3$), a dysprosium oxide ($Dy_2O_3$), a holmium oxide ($Ho_2O_3$), an erbium oxide ($Er_2O_3$), a thulium oxide ($Tm_2O_3$), an ytterbium oxide ($Yb_2O_3$), a lutetium oxide ($Lu_2O_3$), an yttrium oxide ($Y_2O_3$), and the like may be used. In addition, the layer 22 having negative electric charges may also be formed of a hafnium nitride layer, an aluminum nitride layer, a hafnium oxynitride layer, or an aluminum oxynitride layer. These layers may also be formed by using the chemical vapor deposition, the sputtering method, or the atomic layer deposition, for example. Here, it is preferable to use the atomic layer deposition method because an $SiO_2$ layer which lowers the interface state can be simultaneously formed in a thickness of 1 nm during the film formation.

In addition, the layer 22 having negative electric charges may have silicon (Si) or nitrogen (N) added in a range in which an insulation property is not adversely affected. The concentration is appropriately determined in a range in which an insulation property of the layer is not adversely affected. Thus, it becomes possible to raise the thermal resistance of the layer or an ability to prevent implantation of ions during a process by adding the silicon (Si) or the nitrogen (N).

In addition, in the case of forming the layer 22 having negative electric charges with a hafnium oxide ($HfO_2$) layer, it becomes possible to obtain the anti-reflection effect efficiently by adjusting the film thickness, since the refractive index of the hafnium oxide (HfO$_2$) layer is about 2. Naturally, also for other kinds of layers, the anti-reflection effect can be obtained by optimizing the film thickness according to the refractive index.

Then, the insulating layer 41 is formed on the layer 22 having negative electric charges, and then the light shielding layer 42 is formed on the insulating layer 41. The insulating layer 41 is formed of a silicon oxide layer, for example. In addition, the light shielding layer 42 is formed of a metallic layer having a light shielding property, for example. Thus, reaction of metal of the light shielding layer 42 and the layer 22 having negative electric charges formed of a hafnium oxide layer, for example, can be prevented by forming the light shielding layer 42 on the layer 22 having negative electric charges with the insulating layer 41 interposed therebetween. In addition, since the insulating layer 42 serves as an etching stopper when the light shielding layer is etched, etching damage to the layer 22 having negative electric charges can be prevented.

Then, as shown in (3) of FIG. 12, a resist mask (not shown) is formed on a part of the light sensing section 12 and the light shielding layer 42 positioned above the peripheral circuit section 14 by resist application and lithography technique and then the light shielding layer 42 is processed by etching using the resist mask to thereby make the light shielding layer 42 left on the part of the light sensing section 12 and the insulating layer 41 positioned above the peripheral circuit section 14. A region where light is not incident on the light sensing section 12 is generated by the light shielding layer 42, and a black level in an image is determined by an output of the light sensing section 12. In addition, since it is prevented light from being incident on the peripheral circuit section 14, a characteristic change caused by light incident on the peripheral circuit section is suppressed.

Then, as shown in (4) of FIG. 12, the anti-reflection layer 46 is formed on the insulating layer 41 to cover the light shielding layer 42. The anti-reflection layer 46 is formed of a silicon nitride layer having a refractive index of about 2, for example.

Then, as shown in (5) of FIG. 13, the color filter layer 44 is formed on the anti-reflection layer 46 positioned above the light sensing section 12 and then the condensing lens 45 is formed on the color filter layer 44 by a known manufacturing technique. In this case, a light-transmissive insulating layer (not shown) may be formed between the color filter layer 44 and the condensing lens 45 in order to prevent machining damage to the color filter layer 44 at the time of lens processing. Thus, the solid state imaging device 2 is formed.

In the second example of the method (first manufacturing method) of manufacturing a solid state imaging device, the same effects as in the first example can be obtained and reflection before light is incident on the light sensing section 12 can be reduced by forming the anti-reflection layer 46. As a result, since the amount of light incident on the light sensing section 12 can be increased, the sensitivity of the solid state imaging device 2 can be improved.

Figure 14:
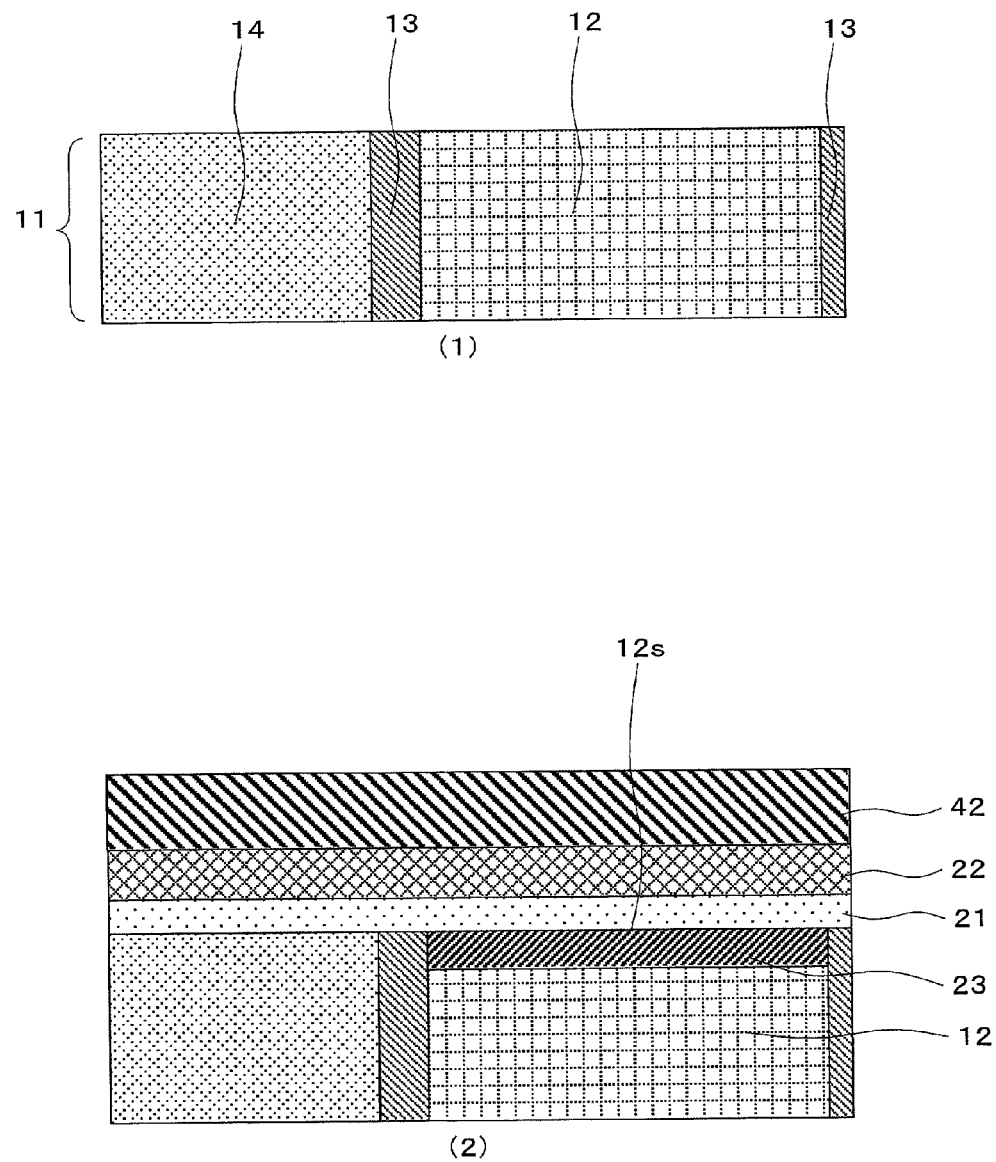
FIG. 14 is a cross-sectional view illustrating a manufacturing process in a method (first manufacturing method) of manufacturing a solid state imaging device according to an embodiment (third example) of the present invention.
Figure 15:
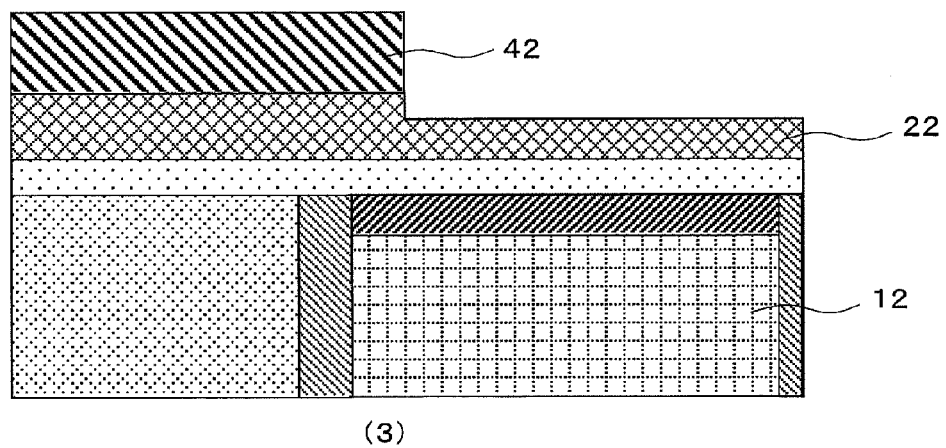
FIG. 15 is a cross-sectional view illustrating a manufacturing process in a method (first manufacturing method) of manufacturing a solid state imaging device according to an embodiment (third example) of the present invention.
Figure 15:
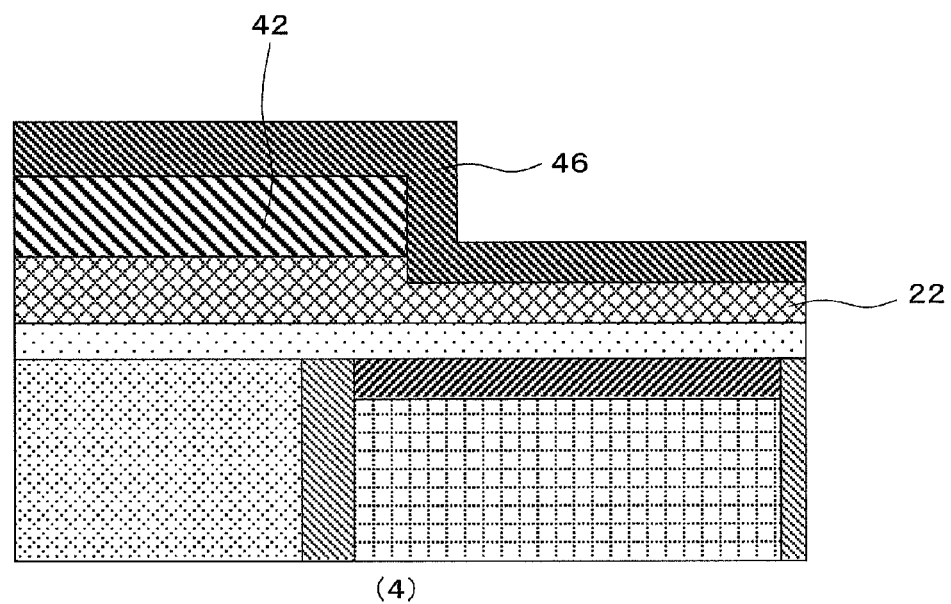
Figure 16:
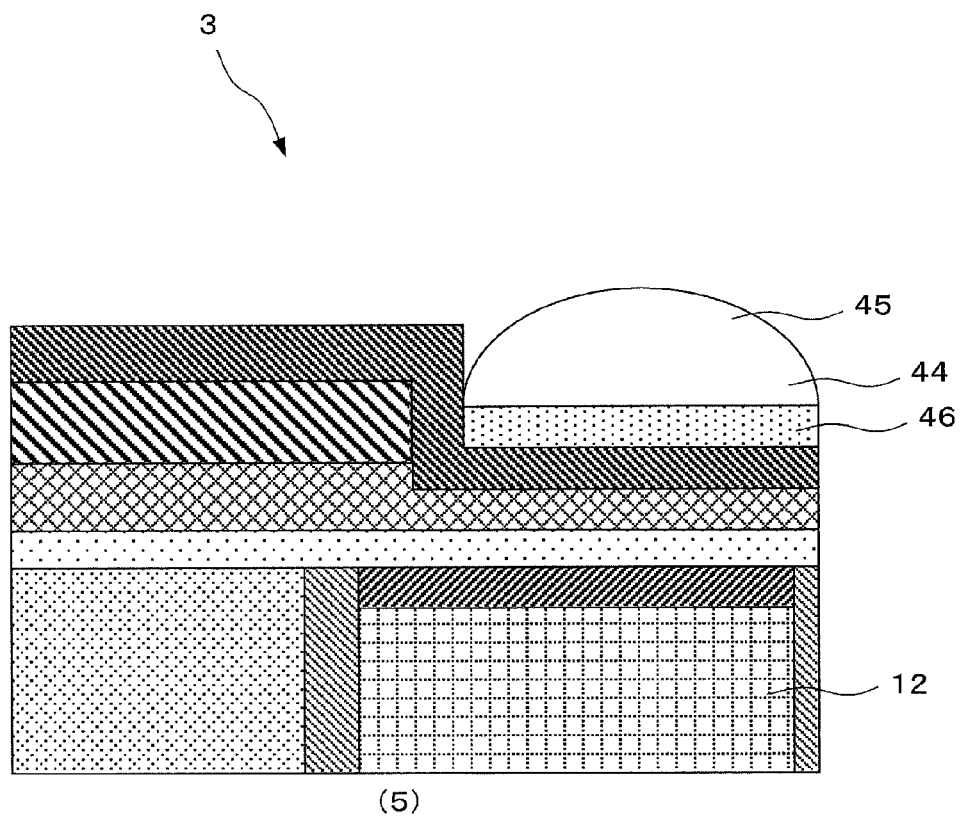
FIG. 16 is a cross-sectional view illustrating a manufacturing process in a method (first manufacturing method) of manufacturing a solid state imaging device according to an embodiment (third example) of the present invention.

Next, a method (first manufacturing method) of manufacturing a solid state imaging device according to an embodiment (third example) of the present invention will be described with reference to cross-sectional views of a manufacturing process of FIGS. 14 to 16 illustrating main parts. In FIGS. 14 to 16, a manufacturing process of the solid state imaging device 3 is shown as an example.

As shown in (1) of FIG. 14, the light sensing section 12 which performs photoelectric conversion of incident light, the pixel separating region 13 for separating the light sensing section 12, the peripheral circuit section 14 in which a peripheral circuit (not specifically shown) is formed with the pixel separating region 13 interposed between the peripheral circuit section 14 and the light sensing section 12, and the like are formed in the semiconductor substrate (or semiconductor layer) 11. A known manufacturing method is used as the manufacturing method.

Then, as shown in (2) of FIG. 14, the interface state lowering layer 21 is formed on the light receiving surface 12s of the light sensing section 12, actually, on the semiconductor substrate 11. The interface state lowering layer 21 is formed of a silicon oxide (SiO$_2$) layer, for example. Subsequently, the layer 22 having negative electric charges is formed on the interface state lowering layer 21. Thus, the hole accumulation layer 23 is formed at the light receiving surface side of the light sensing section 12. Accordingly, at least on the light sensing section 12, the interface state lowering layer 21 needs to be formed in a film thickness that the hole accumulation layer 23 is formed at a side of the light receiving surface 12s of the light sensing section 12 by the layer 22 having negative electric charges. For example, the film thickness is set to be equal to or larger than one atomic layer and equal to or smaller than 100 nm.

The layer 22 having negative electric charges is formed of a hafnium oxide (HfO$_2$) layer, an aluminum oxide (Al$_2$O$_3$) layer, a zirconium oxide (ZrO$_2$) layer, a tantalum oxide (Ta$_2$O$_5$) layer, or a titanium oxide (TiO$_2$) layer, for example. Such kinds of layers have been used as a gate insulating layer of an insulated gate field effect transistor and the like. Accordingly, since a layer forming method is known, the layers can be easily formed. For example, a chemical vapor deposition method, a sputtering method, and an atomic layer deposition method may be used as the layer forming method. Here, it is preferable to use the atomic layer deposition method because an SiO$_2$ layer which lowers the interface state can be simultaneously formed in a thickness of 1 nm during the film formation.

In addition, as materials other than those described above, a lanthanum oxide (La$_2$O$_3$), a praseodymium oxide (Pr$_2$O$_3$), a cerium oxide (CeO$_2$), a neodymium oxide (Nd$_2$O$_3$), a promethium oxide (Pm$_2$O$_3$), a samarium oxide (Sm$_2$O$_3$), an europium oxide (Eu$_2$O$_3$), a gadolinium oxide (Gd$_2$O$_3$), a terbium oxide (Tb$_2$O$_3$), a dysprosium oxide (Dy$_2$O$_3$), a holmium oxide (Ho$_2$O$_3$), an erbium oxide (Er$_2$O$_3$), a thulium oxide (Tm$_2$O$_3$), an ytterbium oxide (Yb$_2$O$_3$), a lutetium oxide (Lu$_2$O$_3$), an yttrium oxide (Y$_2$O$_3$), and the like may be used. In addition, the layer 22 having negative electric charges may also be formed of a hafnium nitride layer, an aluminum nitride layer, a hafnium oxynitride layer, or an aluminum oxynitride layer. These layers may also be formed by using the chemical vapor deposition, the sputtering method, or the atomic layer deposition, for example.

In addition, the layer 22 having negative electric charges may have silicon (Si) or nitrogen (N) added in a range in which an insulation property is not adversely affected. The concentration is appropriately determined in a range in which an insulation property of the layer is not adversely affected. Thus, it becomes possible to raise the thermal resistance of the layer or an ability to prevent implantation of ions during a process by adding the silicon (Si) or the nitrogen (N).

In addition, in the case of forming the layer 22 having negative electric charges with a hafnium oxide (HfO$_2$) layer, it becomes possible to obtain the anti-reflection effect efficiently by adjusting the film thickness of the hafnium oxide (HfO$_2$) layer. Naturally, also for other kinds of layers, the anti-reflection effect can be obtained by optimizing the film thickness according to the refractive index.

Then, the light shielding layer 42 is formed on the layer 22 having negative electric charges. The light shielding layer 42 is formed of a metallic layer having a light shielding property, for example. Thus, since the light shielding layer 42 is directly formed on the layer 22 having negative electric charges, the light shielding layer 42 can be brought close to the surface of the semiconductor substrate 11. As a result, since a distance between the light shielding layer 42 and the semiconductor substrate 11 can be narrowed, light components obliquely incident from an upper layer of a neighboring photodiode, that is, optical mixed color components can be reduced.

Then, as shown in (3) of FIG. 15, a resist mask (not shown) is formed on a part of the light sensing section 12 and the light shielding layer 42 positioned above the peripheral circuit section 14 by resist application and lithography technique and then the light shielding layer 42 is processed by etching using the resist mask to thereby make the light shielding layer 42 left on the part of the light sensing section 12 and the layer 22 having negative electric charges positioned above the peripheral circuit section 14. A region where light is not incident on the light sensing section 12 is generated by the light shielding layer 42, and a black level in an image is determined by an output of the light sensing section 12. In addition, since it is prevented light from being incident on the peripheral circuit section 14, a characteristic change caused by light incident on the peripheral circuit section is suppressed.

Then, as shown in (4) of FIG. 15, the anti-reflection layer 46 is formed on the layer 22 having negative electric charges so as to cover the light shielding layer 42. The anti-reflection layer 46 is formed of a silicon nitride layer having a refractive index of about 2, for example.

Then, as shown in (5) of FIG. 16, the color filter layer 44 is formed on the anti-reflection layer 46 positioned above the light sensing section 12 and then the condensing lens 45 is formed on the color filter layer 44 by a known manufacturing technique. In this case, a light-transmissive insulating layer (not shown) may be formed between the color filter layer 44 and the condensing lens 45 in order to prevent machining damage to the color filter layer 44 at the time of lens processing. Thus, the solid state imaging device 3 is formed.

In the third example of the method (first manufacturing method) of manufacturing a solid state imaging device, the same effects as in the first example can be obtained and the light shielding layer 42 can be brought close to the surface of the semiconductor substrate 11 by directly forming the light shielding layer 42 on the layer 22 having negative electric charges. As a result, since a distance between the light shielding layer 42 and the semiconductor substrate 11 can be narrowed, light components obliquely incident from an upper layer of a neighboring photodiode, that is, optical mixed color components can be reduced. In addition, the anti-reflection effect can be maximized by forming the anti-reflection layer 46 when the anti-reflection effect is not sufficient only with the layer 22 having negative electric charges.

Figure 17:
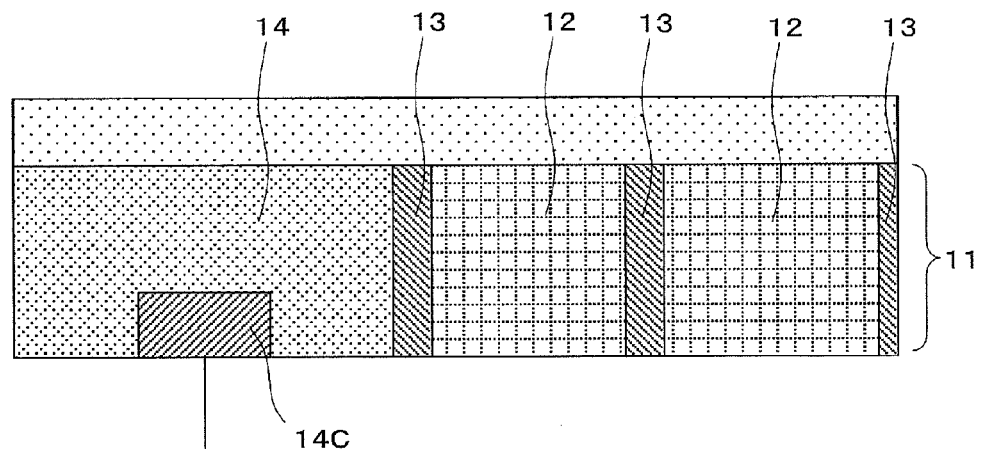
FIG. 17 is a cross-sectional view illustrating a manufacturing process in a method (first manufacturing method) of manufacturing a solid state imaging device according to an embodiment (fourth example) of the present invention.
Figure 17:
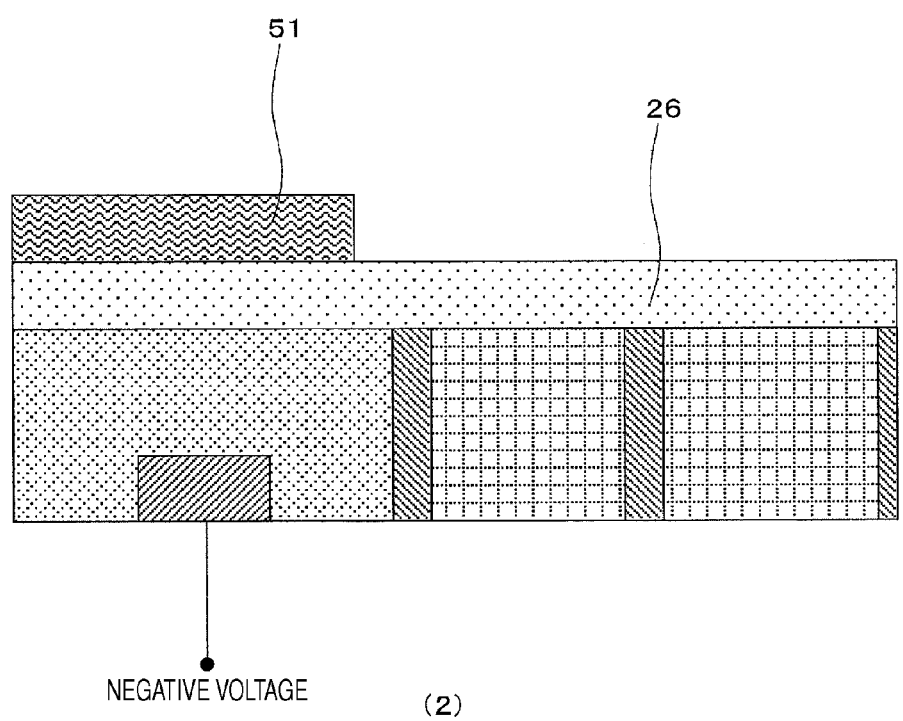
Figure 18:
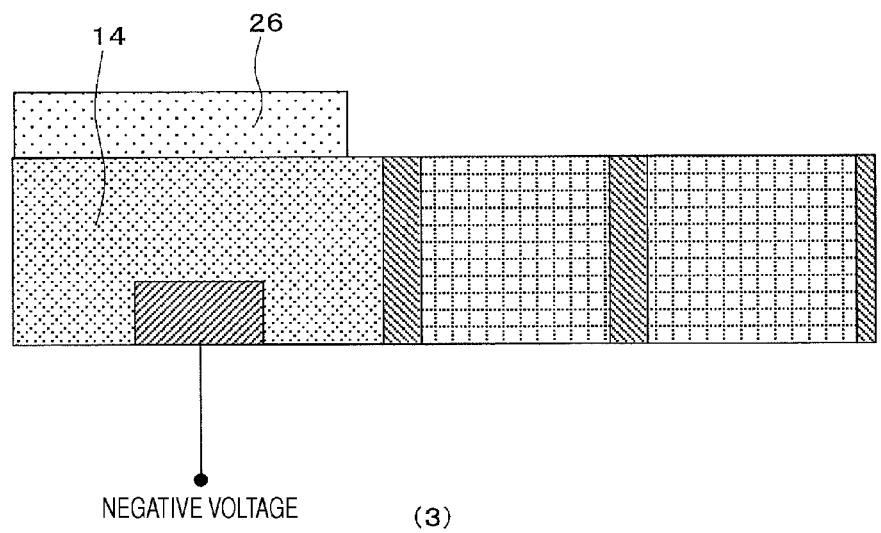
FIG. 18 is a cross-sectional view illustrating a manufacturing process in a method (first manufacturing method) of manufacturing a solid state imaging device according to an embodiment (fourth example) of the present invention.
Figure 18:
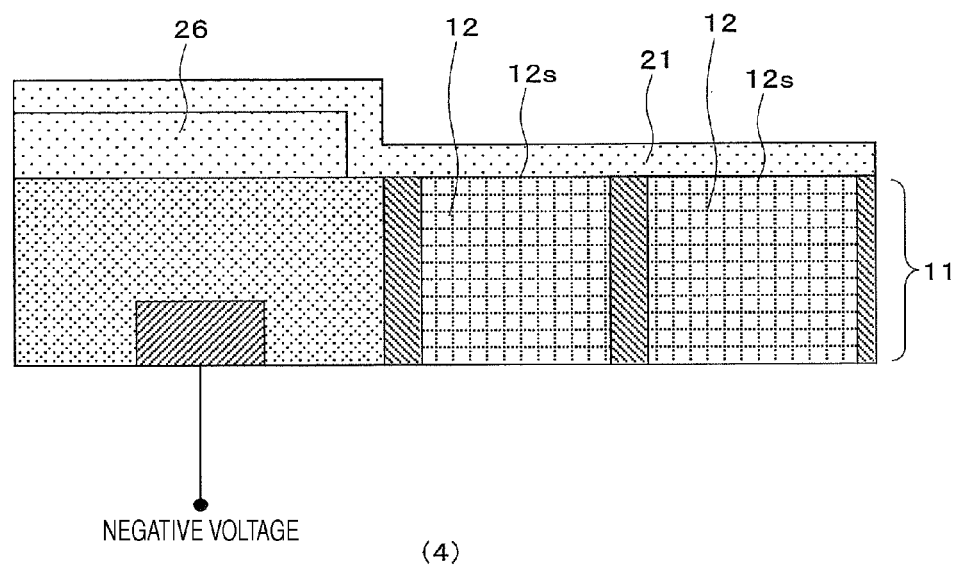
Figure 19:
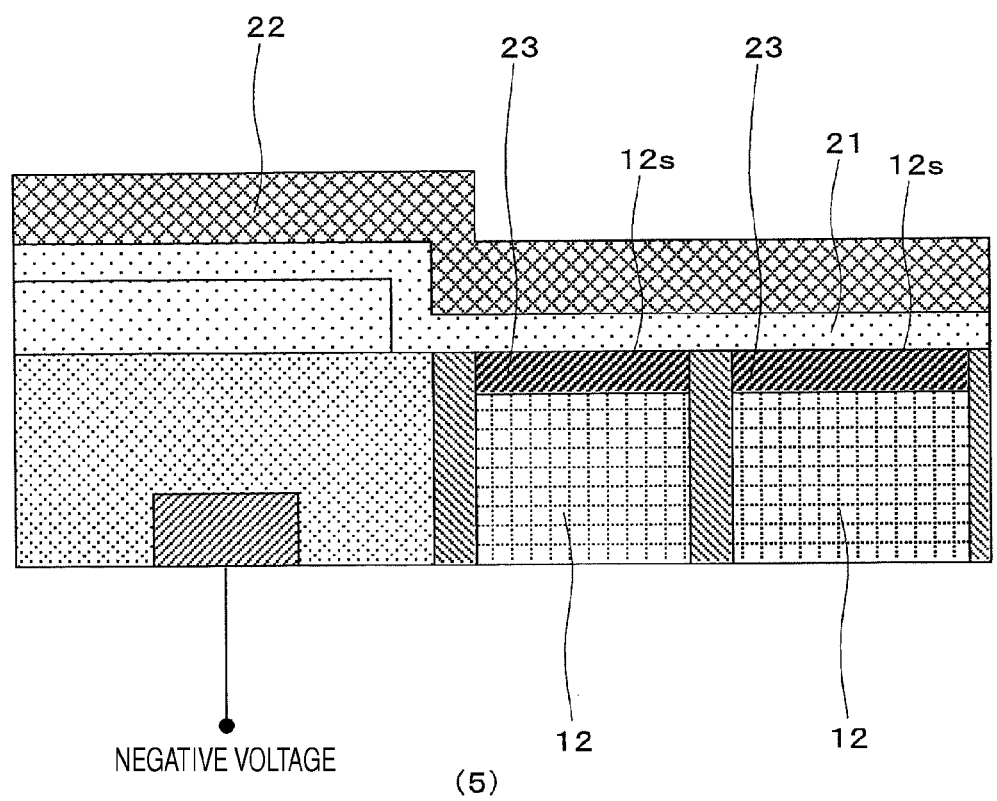
FIG. 19 is a cross-sectional view illustrating a manufacturing process in a method (first manufacturing method) of manufacturing a solid state imaging device according to an embodiment (fourth example) of the present invention.

Next, a method (first manufacturing method) of manufacturing a solid state imaging device according to an embodiment (fourth example) of the present invention will be described with reference to cross-sectional views of a manufacturing process of FIGS. 17 to 19 illustrating main parts. In FIGS. 17 to 19, a manufacturing process of the solid state imaging device 4 is shown as an example.

As shown in (1) of FIG. 17, the light sensing section 12 which performs photoelectric conversion of incident light, the pixel separating region 13 for separating the light sensing section 12, the peripheral circuit section 14 in which a peripheral circuit (for example, a circuit 14C) is formed with the pixel separating region 13 interposed between the peripheral circuit section 14 and the light sensing section 12, and the like are formed in the semiconductor substrate (or semiconductor layer) 11. A known manufacturing method is used as the manufacturing method. Then, an insulating layer 26 which allows the incident light to be transmitted therethrough is formed. The insulating layer 26 is formed of a silicon oxide layer, for example.

Then, as shown in (2) of FIG. 17, a resist mask 51 is formed on the insulating layer 26 positioned above the peripheral circuit section 14 by using resist application and lithography technique.

Then, as shown in (3) of FIG. 18, the insulating layer 26 is processed by etching using the resist mask 51 (refer to (2) of FIG. 17), leaving the insulating layer 26 on the peripheral circuit section 14. Then, the resist mask 51 is removed.

Then, as shown in (4) of FIG. 18, the interface state lowering layer 21 which covers the insulating layer 26 is formed on the light receiving surface 12s of the light sensing section 12, actually, on the semiconductor substrate 11. The interface state lowering layer 21 is formed of a silicon oxide ($SiO_2$) layer, for example.

Then, as shown in (5) of FIG. 19, the layer 22 having negative electric charges is formed on the interface state lowering layer 21. Thus, the hole accumulation layer 23 is formed at the light receiving surface side of the light sensing section 12. Accordingly, at least on the light sensing section 12, the interface state lowering layer 21 needs to be formed in a film thickness that the hole accumulation layer 23 is formed at a side of the light receiving surface 12s of the light sensing section 12 by the layer 22 having negative electric charges. For example, the film thickness is set to be equal to or larger than one atomic layer and equal to or smaller than 100 nm.

The layer 22 having negative electric charges is formed of a hafnium oxide ($HfO_2$) layer, an aluminum oxide ($Al_2O_3$) layer, a zirconium oxide ($ZrO_2$) layer, a tantalum oxide ($Ta_2O_5$) layer, or a titanium oxide ($TiO_2$) layer, for example. Such kinds of layers have been used as a gate insulating layer of an insulated gate field effect transistor and the like. Accordingly, since a layer forming method is known, the layers can be easily formed. For example, a chemical vapor deposition method, a sputtering method, and an atomic layer deposition method may be used as the layer forming method. Here, it is preferable to use the atomic layer deposition method because an $SiO_2$ layer which lowers the interface state can be simultaneously formed in a thickness of 1 nm during the film formation.

In addition, as materials other than those described above, a lanthanum oxide ($La_2O_3$), a praseodymium oxide ($Pr_2O_3$), a cerium oxide ($CeO_2$), a neodymium oxide ($Nd_2O_3$), a promethium oxide ($Pm_2O_3$), a samarium oxide ($Sm_2O_3$), an europium oxide ($Eu_2O_3$), a gadolinium oxide ($Gd_2O_3$), a terbium oxide ($Tb_2O_3$), a dysprosium oxide ($Dy_2O_3$), a holmium oxide ($Ho_2O_3$), an erbium oxide ($Er_2O_3$), a thulium oxide ($Tm_2O_3$), an ytterbium oxide ($Yb_2O_3$), a lutetium oxide ($Lu_2O_3$), an yttrium oxide ($Y_2O_3$), and the like may be used. In addition, the layer 22 having negative electric charges may also be formed of a hafnium nitride layer, an aluminum nitride layer, a hafnium oxynitride layer, or an aluminum oxynitride layer. These layers may also be formed by using the chemical vapor deposition, the sputtering method, or the atomic layer deposition, for example.

In addition, the layer 22 having negative electric charges may have silicon (Si) or nitrogen (N) added in a range in which an insulation property is not adversely affected. The concentration is appropriately determined in a range in which an insulation property of the layer is not adversely affected.

Thus, it becomes possible to raise the thermal resistance of the layer or an ability to prevent implantation of ions during a process by adding the silicon (Si) or the nitrogen (N).

In addition, in the case of forming the layer 22 having negative electric charges with a hafnium oxide ($HfO_2$) layer, it becomes possible to obtain the anti-reflection effect efficiently by adjusting the film thickness, since the refractive index of the hafnium oxide ($HfO_2$) layer is about 2. Naturally, also for other kinds of layers, the anti-reflection effect can be obtained by optimizing the film thickness according to the refractive index.

The solid state imaging device 4 is configured such that a light shielding layer for shielding a part of the light sensing section 12 and the peripheral circuit section 14, a color filter layer for spectral filtering of light incident on at least the light sensing section 12, a condensing lens for condensing light incident on the light sensing section 12, and the like are provided on the layer 22 having negative electric charges. As an example of such a configuration, any one of the configurations of the solid state imaging devices 1, 2, and 3 may also be applied.

In the fourth example of the method (first manufacturing method) of manufacturing a solid state imaging device, the layer 22 having negative electric charges is formed on the interface state lowering layer 21. Accordingly, by the electric field generated by negative electric charges in the layer 22 having negative electric charges, the hole accumulation layer 23 is sufficiently formed on the light-receiving-surface-side interface of the light sensing section 12. Accordingly, electric charges (electrons) generated from the interface can be suppressed. In addition, even if electric charges (electrons) are generated from the interface, the electric charges (electrons) do not flow to a charge accumulation portion which is a potential well in the light sensing section 12 but flow to the hole accumulation layer 23 in which many holes exist. As a result, the electric charges (electrons) can be eliminated. Thus, since it can be prevented that a dark current generated by the electric charges on the interface is detected in the light sensing section, a dark current caused by the interface state is suppressed. Furthermore, generation of electrons due to the interface state is further suppressed since the interface state lowering layer 21 is formed on the light receiving surface of the light sensing section 12. As a result, it is suppressed that electrons generated due to the interface state flow to the light sensing section 12 as a dark current. In addition, by using the layer 22 having negative electric charges, the HAD structure can be formed without ion implantation and annealing.

In addition, since the insulating layer 26 is formed on the peripheral circuit section 14, a distance to the layer 22 having negative electric charges on the peripheral circuit section 14 becomes larger than a distance to the layer having negative electric charges on the light sensing section 12. As a result, the negative electric field applied from the layer 22 having negative electric charges to the peripheral circuit section 14 is reduced. That is, since an influence of the layer 22 having negative electric charges on the peripheral circuit section 14 is reduced, malfunction of the peripheral circuit section 14 caused by the negative electric field generated by the layer 22 having negative electric charges is prevented.

Figure 20:
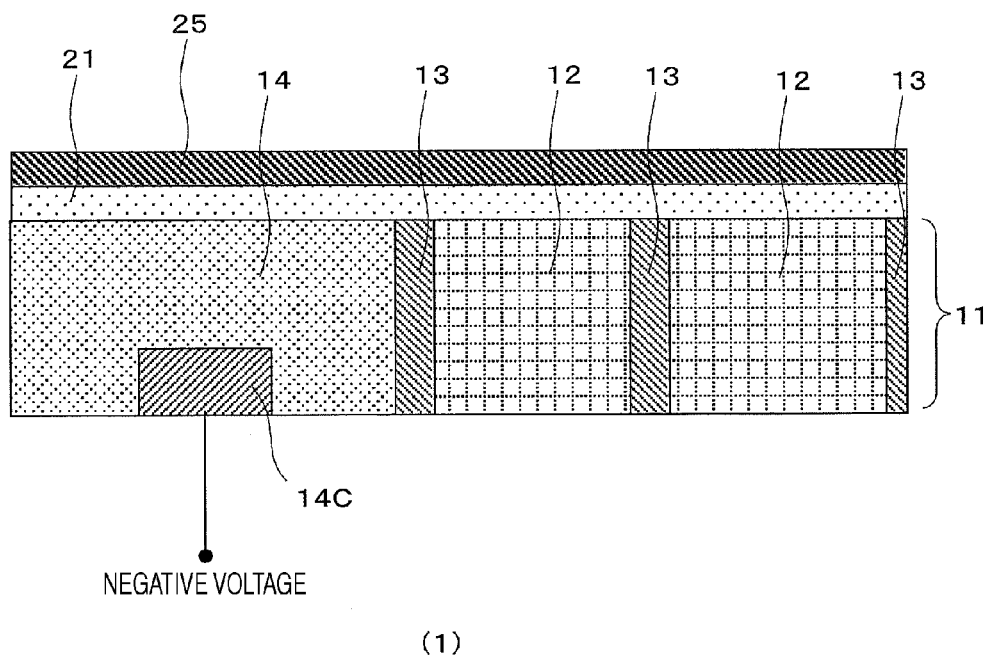
FIG. 20 is a cross-sectional view illustrating a manufacturing process in a method (first manufacturing method) of manufacturing a solid state imaging device according to an embodiment (fifth example) of the present invention.
Figure 20:
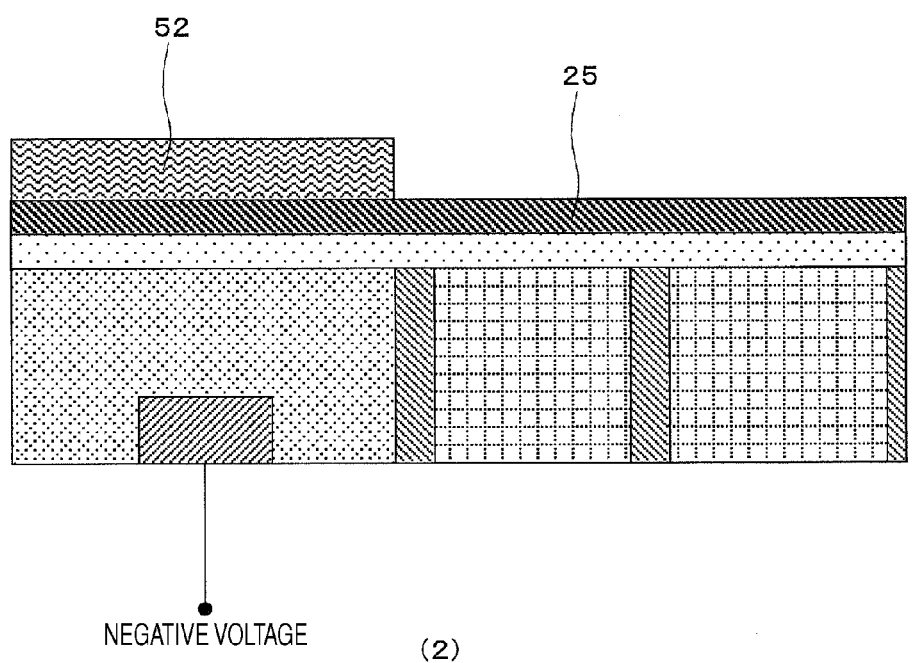
Figure 21:
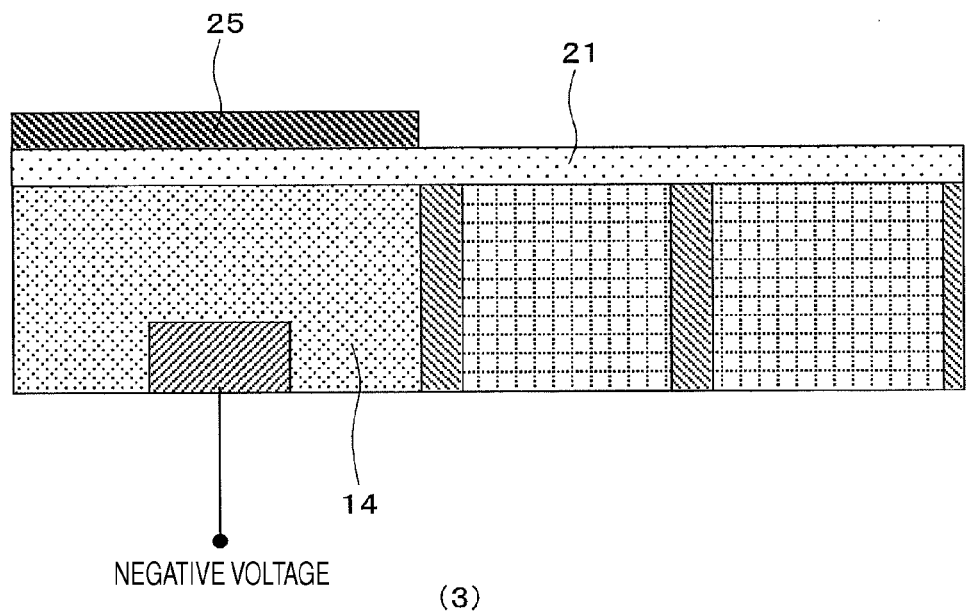
FIG. 21 is a cross-sectional view illustrating a manufacturing process in a method (first manufacturing method) of manufacturing a solid state imaging device according to an embodiment (fifth example) of the present invention.
Figure 21:
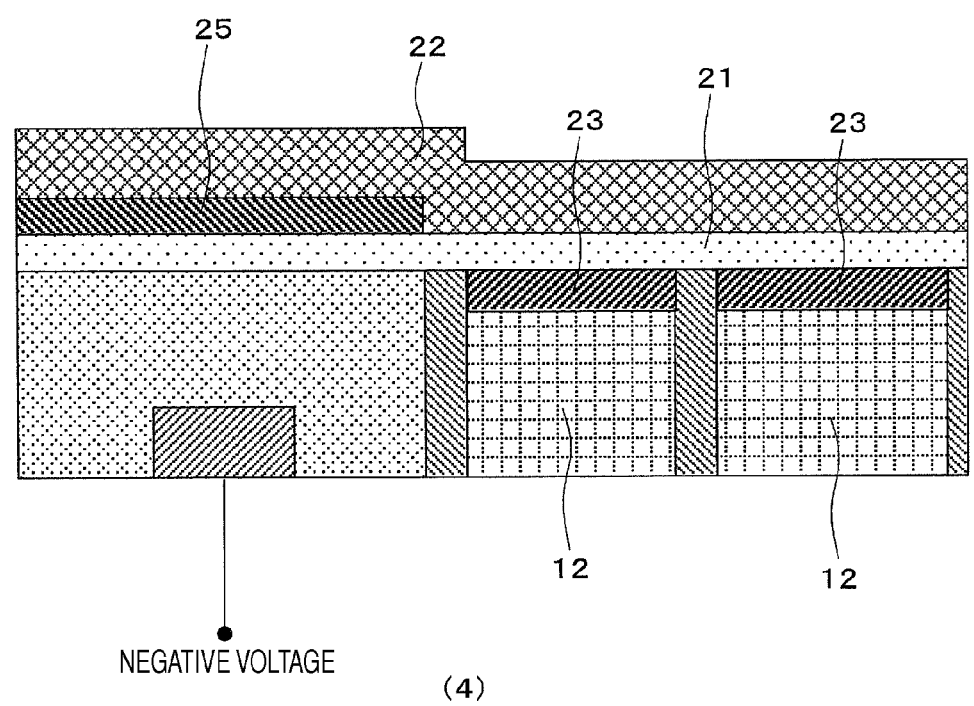

Next, a method (first manufacturing method) of manufacturing a solid state imaging device according to an embodiment (fifth example) of the present invention will be described with reference to cross-sectional views of a manufacturing process of FIGS. 20 and 21 illustrating main parts. In FIGS. 20 and 21, a manufacturing process of the solid state imaging device 4 is shown as an example.

As shown in (1) of FIG. 20, the light sensing section 12 which performs photoelectric conversion of incident light, the pixel separating region 13 for separating the light sensing section 12, the peripheral circuit section 14 in which a peripheral circuit (for example, a circuit 14C) is formed with the pixel separating region 13 interposed between the peripheral circuit section 14 and the light sensing section 12, and the like are formed in the semiconductor substrate (or semiconductor layer) 11. A known manufacturing method is used as the manufacturing method. Then, the interface state lowering layer 21 which allows the incident light to be transmitted therethrough is formed. The interface state lowering layer 21 is formed of a silicon oxide layer, for example. Then, a layer 25 for separating the layer having negative electric charges from the surface of the light receiving surface is formed on the interface state lowering layer 21. It is preferable that the layer 25 having positive electric charges in order to eliminate an influence of the negative electric charges, and it is preferable to use a silicon nitride for the layer 25.

At least on the light sensing section 12, the interface state lowering layer 21 needs to be formed in a film thickness that the hole accumulation layer 23, which will be described later, is formed at a side of the light receiving surface $12s$ of the light sensing section 12 by the layer 22 having negative electric charges formed later. For example, the film thickness is set to be equal to or larger than one atomic layer and equal to or smaller than 100 nm.

Then, as shown in (2) of FIG. 20, a resist mask 52 is formed on the layer 25 having positive electric charges positioned above the peripheral circuit section 14 by using resist application and lithography technique.

Then, as shown in (3) of FIG. 21, the layer 25 having positive electric charges is processed by etching using the resist mask 52 (refer to (2) of FIG. 20), leaving the layer 25 having positive electric charges on the peripheral circuit section 14. Then, the resist mask 52 is removed.

Then, as shown in (4) of FIG. 21, the layer 22 having negative electric charges which covers the layer 25 having positive electric charges is formed on the interface state lowering layer 21. The layer 22 having negative electric charges is formed of a hafnium oxide ($HfO_2$) layer, an aluminum oxide ($Al_2O_3$) layer, a zirconium oxide ($ZrO_2$) layer, a tantalum oxide ($Ta_2O_5$) layer, or a titanium oxide ($TiO_2$) layer, for example. Such kinds of layers have been used as a gate insulating layer of an insulated gate field effect transistor and the like. Accordingly, since a layer forming method is known, the layers can be easily formed. For example, a chemical vapor deposition method, a sputtering method, and an atomic layer deposition method may be used as the layer forming method. Here, it is preferable to use the atomic layer deposition method because an $SiO_2$ layer which lowers the interface state can be simultaneously formed in a thickness of 1 nm during the film formation.

In addition, as materials other than those described above, a lanthanum oxide ($La_2O_3$), a praseodymium oxide ($Pr_2O_3$), a cerium oxide ($CeO_2$), a neodymium oxide ($Nd_2O_3$), a promethium oxide ($Pm_2O_3$), a samarium oxide ($Sm_2O_3$), an europium oxide ($Eu_2O_3$), a gadolinium oxide ($Gd_2O_3$), a terbium oxide ($Tb_2O_3$), a dysprosium oxide ($Dy_2O_3$), a holmium oxide ($Ho_2O_3$), an erbium oxide ($Er_2O_3$), a thulium oxide ($Tm_2O_3$), an ytterbium oxide ($Yb_2O_3$), a lutetium oxide ($Lu_2O_3$), an yttrium oxide ($Y_2O_3$), and the like may be used. In addition, the layer 22 having negative electric charges may also be formed of a hafnium nitride layer, an aluminum nitride layer, a hafnium oxynitride layer, or an aluminum oxynitride layer. These layers may also be formed by using the chemical vapor deposition, the sputtering method, or the atomic layer deposition, for example.

In addition, the layer 22 having negative electric charges may have silicon (Si) or nitrogen (N) added in a range in which an insulation property is not adversely affected. The concentration is appropriately determined in a range in which an insulation property of the layer is not adversely affected. Thus, it becomes possible to raise the thermal resistance of the layer or an ability to prevent implantation of ions during a process by adding the silicon (Si) or the nitrogen (N).

In addition, in the case of forming the layer 22 having negative electric charges with a hafnium oxide ($HfO_2$) layer, it becomes possible to obtain the anti-reflection effect efficiently by adjusting the film thickness of the hafnium oxide ($HfO_2$) layer. Naturally, also for other kinds of layers, the anti-reflection effect can be obtained by optimizing the film thickness according to the refractive index.

The solid state imaging device 5 is configured such that a light shielding layer for shielding a part of the light sensing section 12 and the peripheral circuit section 14, a color filter layer for spectral filtering of light incident on at least the light sensing section 12, a condensing lens for condensing light incident on the light sensing section 12, and the like are provided on the layer 22 having negative electric charges. As an example of such a configuration, any one of the configurations of the solid state imaging devices 1, 2, and 3 may also be applied.

In the fifth example of the method (first manufacturing method) of manufacturing a solid state imaging device, the layer 22 having negative electric charges is formed on the interface state lowering layer 21. Accordingly, by the electric field generated by negative electric charges in the layer 22 having negative electric charges, the hole accumulation layer 23 is sufficiently formed on the light-receiving-surface-side interface of the light sensing section 12. Accordingly, electric charges (electrons) generated from the interface can be suppressed. In addition, even if electric charges (electrons) are generated from the interface, the electric charges (electrons) do not flow to a charge accumulation portion which is a potential well in the light sensing section 12 but flow to the hole accumulation layer 23 in which many holes exist. As a result, the electric charges (electrons) can be eliminated. Thus, since it can be prevented that a dark current generated by the electric charges on the interface is detected in the light sensing section, a dark current caused by the interface state is suppressed. Furthermore, generation of electrons due to the interface state is further suppressed since the interface state lowering layer 21 is formed on the light receiving surface of the light sensing section 12. As a result, it is suppressed that electrons generated due to the interface state flow to the light sensing section 12 as a dark current. In addition, by using the layer 22 having negative electric charges, the HAD structure can be formed without ion implantation and annealing.

In addition, since the layer 25 which preferably has positive electric charges and serves to separate the layer having negative electric charges from the surface of the light receiving surface is formed between the peripheral circuit section 14 and the layer 22 having negative electric charges, the negative electric charges of the layer 22 having negative electric charges is reduced by the positive electric charges in the layer 25 having positive electric charges. Accordingly, the peripheral circuit section 14 is not affected by the electric field of the negative electric charges in the layer 22 having negative electric charges. As a result, it is possible to prevent the peripheral circuit section 14 from malfunctioning due to the negative electric charges.

Here, it will be described below that negative electric charges exist in the hafnium oxide ($HfO_2$) layer which is an example of the layer having negative electric charges.

As a first sample, one which is a MOS capacitor having a gate electrode formed on a silicon substrate with a thermally-oxidized silicon ($SiO_2$) layer interposed therebetween and in which the film thickness of the thermally-oxidized silicon layer is changed is prepared.

As a second sample, one which is a MOS capacitor having a gate electrode formed on a silicon substrate with a CVD silicon oxide (CVD-$SiO_2$) layer interposed therebetween and in which the film thickness of the CVD silicon oxide layer is changed is prepared.

As a third sample, one which is a MOS capacitor having a gate electrode formed on a silicon substrate with a laminated layer, which is obtained by sequentially laminating an ozone-silicon oxide ($O_3$—$SiO_2$) layer, a hafnium oxide ($HfO_2$) layer, and a CVD silicon oxide ($SiO_2$) layer, interposed therebetween and in which the film thickness of the CVD silicon oxide layer is changed is prepared. In addition, the film thicknesses of the $HfO_2$ layer and $O_3$—$SiO_2$ layer are fixed.

The CVD-$SiO_2$ layer of each sample is formed by a CVD method of using mixed gas of monosilane ($SiH_4$) and oxygen ($O_2$), and the $HfO_2$ layer is formed by an ALD method of using tetrakisethylmethyl-amino hafnium (TEMAHf) and ozone ($O_3$) as materials. The $O_3$—$SiO_2$ layer of the third sample is an interface oxide layer which has a thickness of about 1 nm and is formed between the $HfO_2$ layer and the silicon substrate when forming the $HfO_2$ layer in the ALD method. For each gate electrode in each of the samples, a structure in which an aluminum (Al) layer, a titanium nitride (TiN) layer, and a titanium (Ti) layer are laminated from above is used.

In the above sample structures, the gate electrode is formed immediately on the $SiO_2$ layer in the case of the first and second samples, but the CVD-$SiO_2$ layer is laminated on the $HfO_2$ layer only in the case of the third sample where the $HfO_2$ layer is applied. This is to prevent the $HfO_2$ and the electrode from reacting with each other on the interface when the $HfO_2$ and the gate electrode are made to come in direct contact with each other.

Furthermore, in the laminated structure of the third sample, the thickness of the $HfO_2$ layer is fixed to 10 nm and the film thickness of the upper CVD-$SiO_2$ layer is changed. The reason is because the $HfO_2$ has a large relative permittivity and accordingly, the $HfO_2$ layer has a thickness of several nanometers when the thickness is calculated as a thickness of the oxide layer even if the $HfO_2$ layer is formed in a film thickness of 10 nm. As a result, it becomes difficult to see a change of a flat band voltage Vfb with respect to an oxide layer conversion thickness.

For the first, second, and third samples, the flat band voltage Vfb according to an oxide layer conversion thickness Tox has been examined. The result is shown in FIG. 22.

Figure 22:
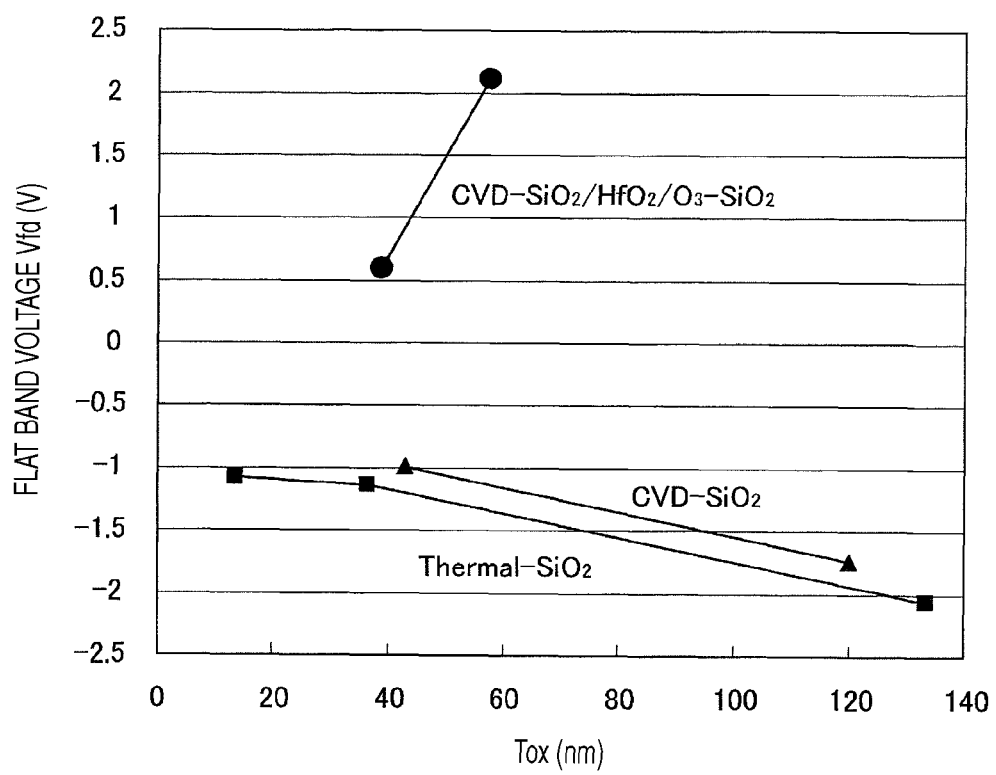
FIG. 22 is a view illustrating the relationship between a flat band voltage and an oxide layer conversion thickness, which shows that negative electric charges exist in a hafnium oxide ($HfO_2$) layer.

As shown in FIG. 22, in the cases of the first sample of the thermally-oxidized (Thermal-$SiO_2$) layer and second sample of the CVD-$SiO_2$ layer, the flat band voltage shifts in a minus direction according to an increase in the film thickness. On the other hand, only in the third sample where the $HfO_2$ layer is applied, it has been confirmed that the flat band voltage shifts in a plus direction according to the increase in film thickness. By the behavior of the flat band voltage, it can be seen that negative electric charges exist in the $HfO_2$ layer.

Figure 23:
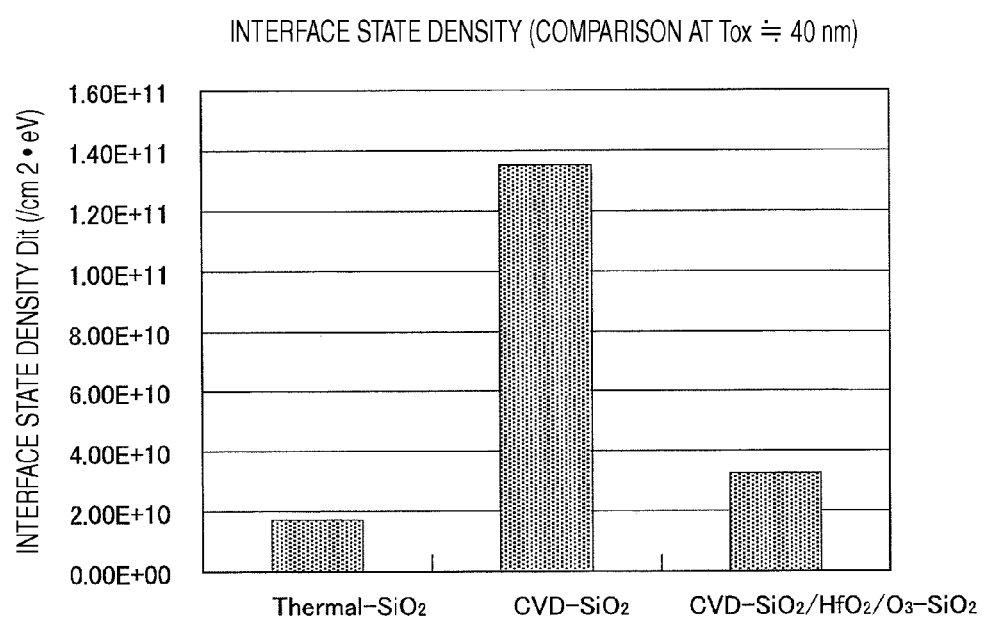
FIG. 23 is a view for comparison of the interface state density, which illustrates that negative electric charges exist in a hafnium oxide ($HfO_2$) layer.

In addition, it can be seen that each material, which forms a layer having negative electric charges, other than the $HfO_2$ also has negative electric charges, similar to the $HfO_2$. In addition, data of the interface state density in each sample is shown in FIG. 23. In FIG. 23, comparison of the interface state density Dit has been performed by using the first, second, and third samples in which Tox in FIG. 22 is almost equal in about 40 nm.

As a result, as shown in FIG. 23, while the first sample of the thermally-oxidized (Thermal-SiO$_2$) layer has a characteristic of 2E10 (/cm$^2$·eV) or less, the interface state is reduced by about one order of magnitude in the second sample of the CVD-SiO$_2$ layer. On the other hand, in the case of the third sample using the HfO$_2$ layer, it has been confirmed that about 3E10/cm$^2$·eV and a good interface close to the thermally oxidized layer. In addition, it can be seen that each material, which forms a layer having negative electric charges, other than the HfO$_2$ also has the good interface close to the thermally oxidized layer, similar to the HfO$_2$.

Next, a flat band voltage Vfb with respect to the oxide layer conversion thickness Tox when the layer 25 having positive electric charges was formed has been examined. The result is shown in FIG. 24.

Figure 24:
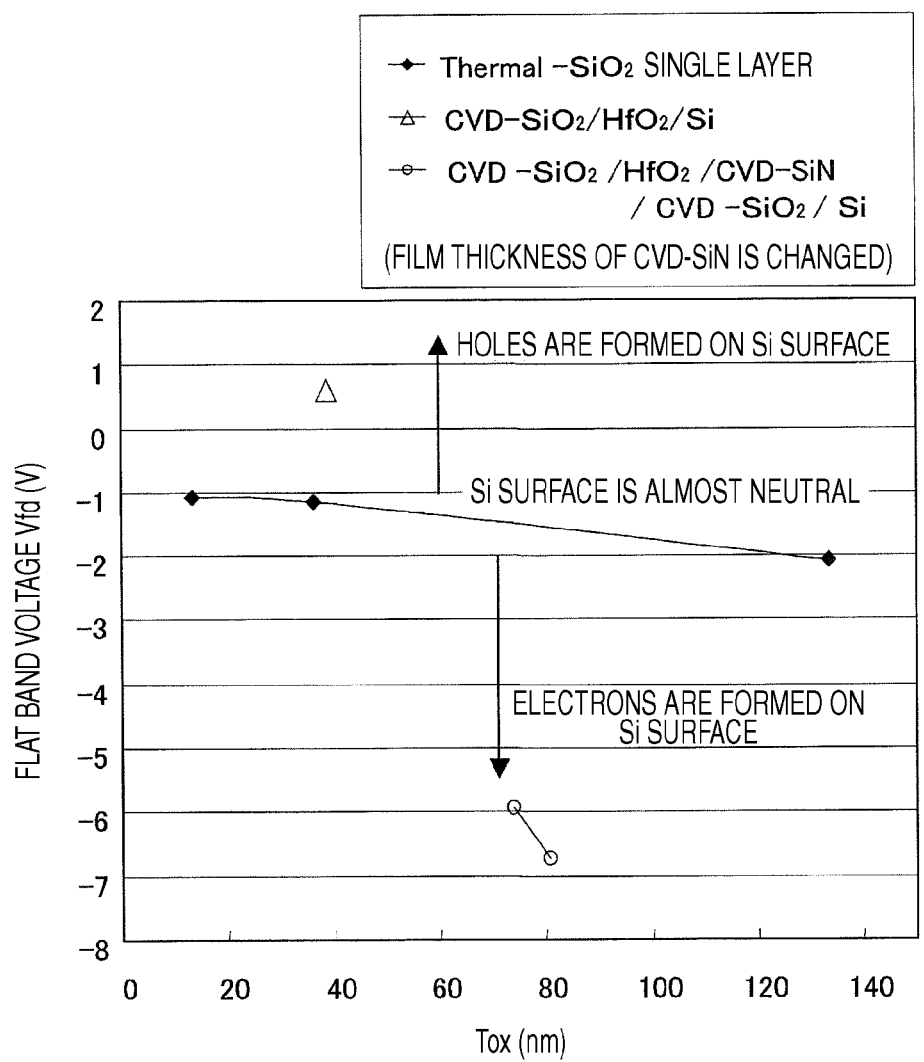
FIG. 24 is a view illustrating the relationship between a flat band voltage and an oxide layer conversion thickness, which explains formation of electrons and holes based on a thermally oxidized layer.

As shown in FIG. 24, in a case larger than the flat band voltage of the thermally oxidized layer, a hole is formed on a surface of the silicon (Si) because a negative electric charge exists in the layer. An example of such a laminated layer includes one obtained by laminating an HfO$_2$ layer and a CVD-SiO$_2$ layer on a surface of a silicon (Si) substrate sequentially from below. On the other hand, in a case smaller than the flat band voltage of the thermally oxidized layer, an electron is formed on the silicon (Si) surface because a positive electric charge exists in the layer. An example of such a laminated layer includes one obtained by laminating a CVD-SiO$_2$ layer, a CVD-SiN layer, an HfO$_2$ layer, and a CVD-SiO$_2$ layer on a surface of a silicon (Si) substrate sequentially from below. Here, when the film thickness of the CVD-SiN layer is made large, a flat band voltage becomes large compared with a thermally oxidized layer, shifting in the negative direction. Furthermore, an influence of the negative electric charges of the hafnium oxide (HfO$_2$) is eliminated by the positive electric charges in the CVD-SiN layer.

In the solid state imaging devices 1 to 5 in the above examples, in the case of containing nitrogen (N) in the layer 22 having negative electric charges as described above, the nitrogen (N) may be contained by nitriding treatment using high-frequency plasma or microwave plasma after forming the layer 22 having negative electric charges. In addition, the negative electric charges in the layer may be increased by executing electron beam curing processing using electron beam irradiation on the layer 22 having negative electric charges after forming the layer 22 having negative electric charges.

Figure 25:
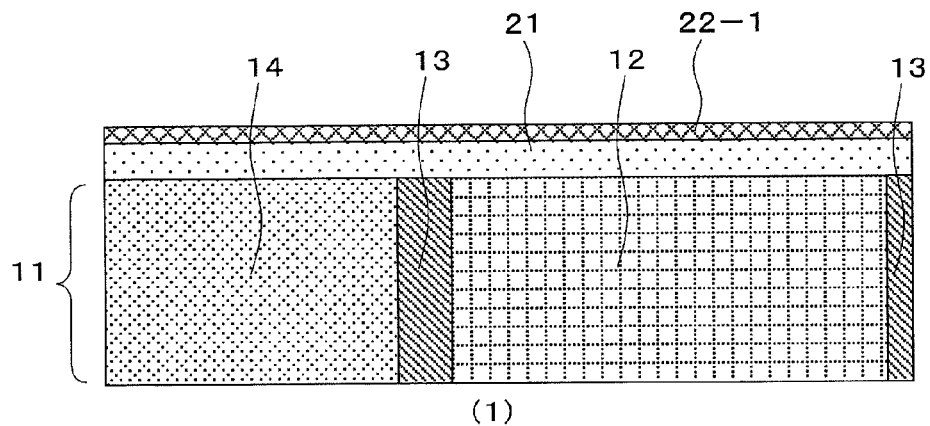
FIG. 25 is a cross-sectional view illustrating a manufacturing process in a method (first manufacturing method) of manufacturing a solid state imaging device according to an embodiment (sixth example) of the present invention.
Figure 25:
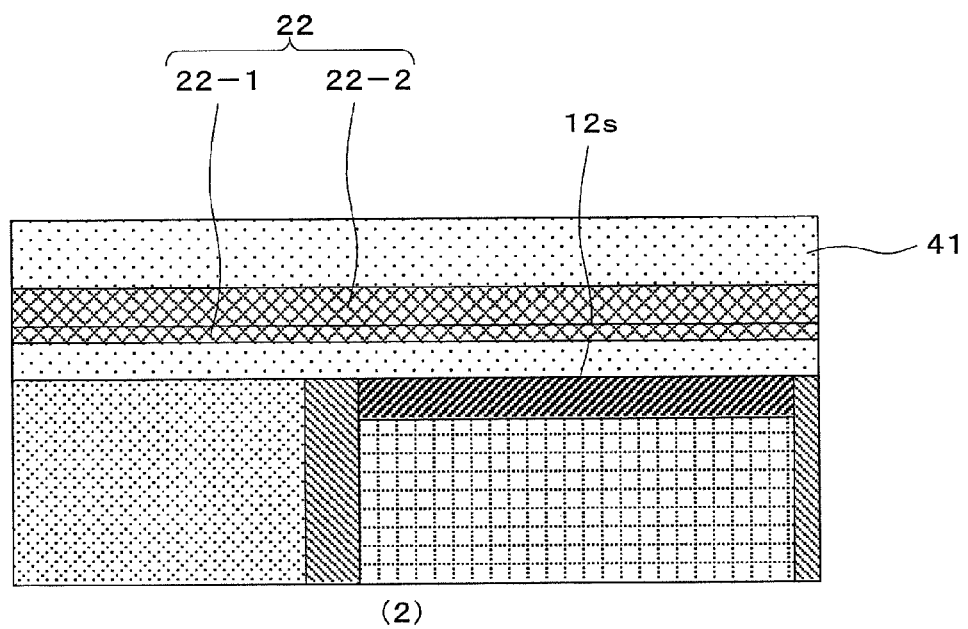

Next, a preferable manufacturing method (sixth example) when a hafnium oxide is used for the layer 22 having negative electric charges which has been used in the methods of manufacturing a solid state imaging device in the first to fifth examples of the present invention will be described below with reference to FIG. 25. As an example, FIG. 25 shows a case suitable for the first example of the first manufacturing method. A method of forming the layer having negative electric charges in the embodiment of the present invention may also be applied to methods of forming the layer having negative electric charges in the second to fifth examples of the first manufacturing method in the same manner.

When the layer 22 having negative electric charges is formed of a hafnium oxide using an atomic layer deposition method (ALD method), the film quality is excellent. However, there is a problem that it takes a time for film formation. Therefore, as shown in (1) of FIG. 25, there is prepared the semiconductor substrate (or semiconductor layer) 11 in which the light sensing section 12 which performs photoelectric conversion of incident light, the pixel separating region 13 for separating the light sensing section 12, the peripheral circuit section 14 having a peripheral circuit (not specifically shown) formed with the pixel separating region 13 interposed between the peripheral circuit section 14 and the light sensing section 12, and the like are formed, and the interface state lowering layer 21 is formed on the light receiving surface 12s of the light sensing section 12, actually, on the semiconductor substrate 11. Then, a first hafnium oxide layer 22-1 is formed on the interface state lowering layer 21 using the atomic layer deposition method. The first hafnium oxide layer 22-1 is formed in a film thickness of at least 3 nm of the film thickness required for the layer 22 having negative electric charges.

In an example of a film forming condition of the atomic layer deposition method (ALD method) for forming the first hafnium oxide layer 22-1, TEMA-Hf (tetrakis ethylmethylamido hafnium), TDMA-Hf (tetrakis dimethylamido hafnium) or TDEA-Hf (tetrakis diethylamido hafnium) is used as a precursor, the temperature of the substrate at the time of film formation is set to 200° C. to 500° C., the flow rate of precursor is set to 10 cm$^3$/min to 500 cm$^3$/min, the irradiation time of precursor is 1 second to 15 seconds, and the flow rate of ozone (O$_3$) is set to 5 cm$^3$/min to 50 cm$^3$/min.

Alternatively, the first hafnium oxide layer 22-1 may also be formed by using a metal organic chemical vapor deposition (MOCVD method). In an example of a film forming condition in the case, TEMA-Hf (tetrakis ethylmethylamido hafnium), TDMA-Hf (tetrakis dimethylamido hafnium) or TDEA-Hf (tetrakis diethylamido hafnium) is used as a precursor, the temperature of the substrate at the time of film formation is set to 200° C. to 600° C., the flow rate of precursor is set to 10 cm$^3$/min to 500 cm$^3$/min, the irradiation time of precursor is 1 second to 15 seconds, and the flow rate of ozone (O$_3$) is set to 5 cm$^3$/min to 50 cm$^3$/min.

Then, as shown in (2) of FIG. 25, a second hafnium oxide layer 22-2 is formed on the first hafnium oxide layer 22-1 by using a physical vapor deposition method (PVD method), completing the layer 22 having negative electric charges. For example, the film formation is performed such that the film thickness including the first hafnium oxide layer 22-1 and the second hafnium oxide layer 22-2 is set to 50 nm to 60 nm. Then, as described in the first to fifth examples, subsequent processing for forming the insulating layer 41 on the layer 22 having negative electric charges is performed.

In an example of a film forming condition in the physical vapor deposition method (PVD method) for forming the second hafnium oxide layer 22-2, a hafnium metal target is used as a target, argon and oxygen are used as process gas, the pressure of film forming atmosphere is set to 0.01 Pa to 50 Pa, power is set to 500 W to 2.00 kW, the flow rate of argon (Ar) is set to 5 cm$^3$/min to 50 cm$^3$/min, and the flow rate of oxygen (O$_2$) is set to 5 cm$^3$/min to 50 cm$^3$/min.

Figure 26:
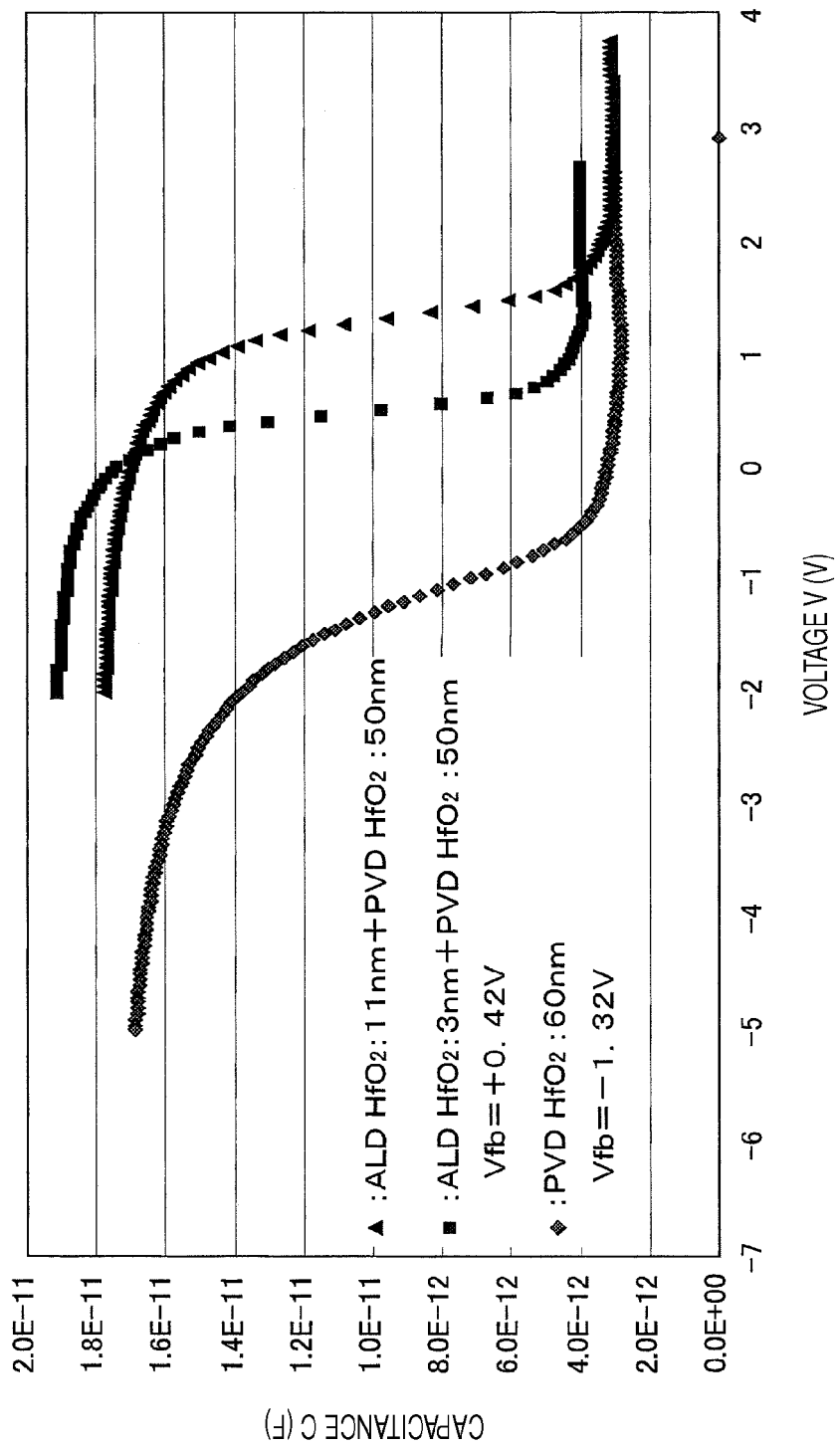
FIG. 26 is a view illustrating the C-V (capacitance-voltage) characteristic of the solid state imaging device using a layer having negative electric charges manufactured in the sixth example of the first manufacturing method.
Figure 27:
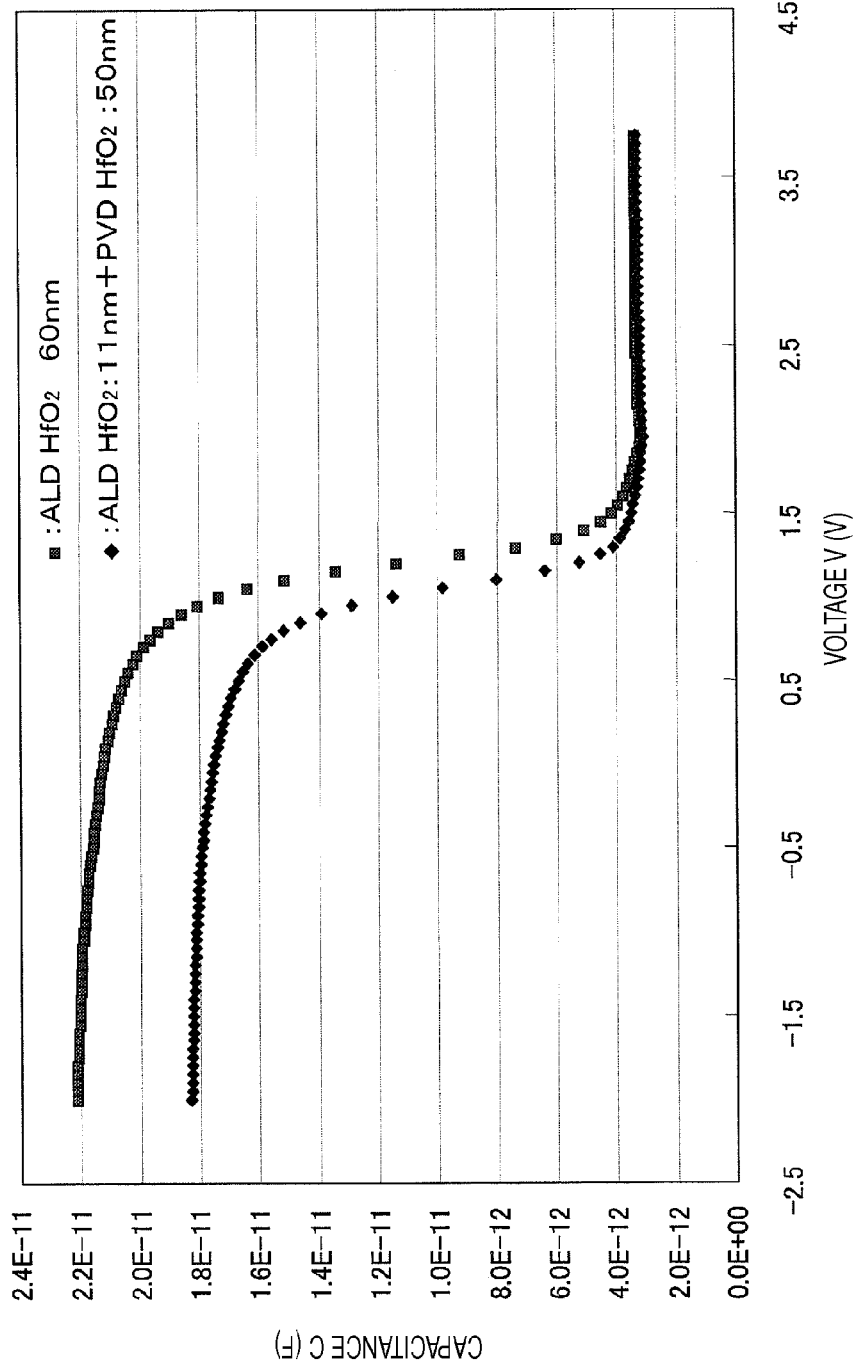
FIG. 27 is a view illustrating the C-V (capacitance-voltage) characteristic of the solid state imaging device using a layer having negative electric charges manufactured in the sixth example of the first manufacturing method.

Next, the C-V (capacitance-voltage) characteristic of the solid state imaging device has been examined in a condition that the thickness of the layer 22 having negative electric charges, which is formed of a hafnium oxide, is set to 60 nm and the thickness of the first hafnium oxide layer 22-1 is used as a parameter. The result is shown in FIGS. 26 and 27. In FIGS. 26 and 27, a vertical axis indicates a capacitance (C) and a horizontal axis indicates a voltage (V).

As shown in FIG. 26, in the case when a hafnium oxide (HfO$_2$) layer is formed only by the PVD method, the flat band voltage Vfb is −1.32 V which is a negative voltage. This is not sufficient for a layer having negative electric charges. In order to be a layer having negative electric charges, the flat band voltage Vfb needs to be a positive voltage. In addition, since a rising edge is blunt, the interface state density is increased. In this case, it was evaluated that the interface state density Dit was too high to be applied, which will be described later.

On the other hand, in the case when the first hafnium oxide layer 22-1 is formed in a thickness of 3 nm by using the ALD method and then the second hafnium oxide layer 22-2 is formed on the first hafnium oxide layer 22-1 in a thickness of 50 nm by using the PVD method, the flat band voltage Vfb is +0.42 V which is a positive voltage. Accordingly, the layer having negative electric charges is obtained. In addition, since a rising edge is sharp, the interface state density Dit is low, resulting in Dit=$5.14E10/cm^2 \cdot eV$.

In addition, in the case when the first hafnium oxide layer 22-1 is formed in a thickness of 11 nm by using the ALD method and then the second hafnium oxide layer 22-2 is formed on the first hafnium oxide layer 22-1 in a thickness of 50 nm by using the PVD method, the flat band voltage Vfb becomes a positive voltage which is further increased. Accordingly, the layer having negative electric charges is obtained. In addition, since a rising edge is sharper, the interface state density Dit is low.

Furthermore, as shown in FIG. 27, in the case when the first hafnium oxide layer 22-1 is formed in a thickness of 11 nm by using the ALD method and then the second hafnium oxide layer 22-2 is formed on the first hafnium oxide layer 22-1 in a thickness of 50 nm by using the PVD method, the flat band voltage Vfb close to that in a case when the entire layer 22 having negative electric charges is formed by using the ALD method and the rising edge also has an almost similar state.

Figure 28:
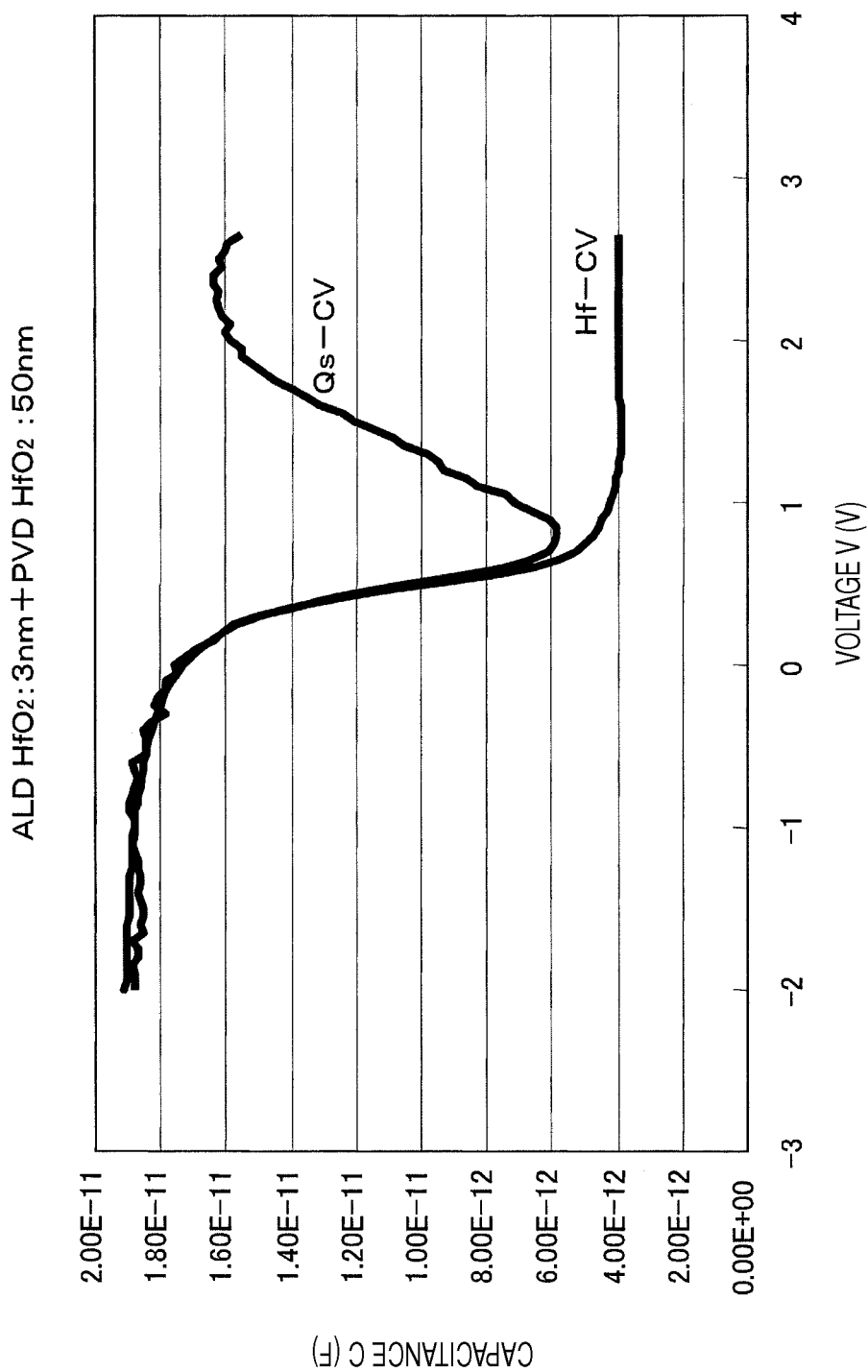
FIG. 28 is a view illustrating the C-V (capacitance-voltage) characteristic of the solid state imaging device using a layer having negative electric charges manufactured in the sixth example of the first manufacturing method.

Next, for the layer having negative electric charges obtained by forming the first hafnium oxide layer 22-1 in a thickness of 11 nm and then forming the second hafnium oxide layer 22-2 on the first hafnium oxide layer 22-1 in a thickness of 50 nm using the PVD method, typical measurement (Qs-CV: Quasi-static-CV) of the C-V characteristic using a direct current and measurement (Hf-CV) using a high frequency were performed. The Qs-CV measurement is a measurement method of sweeping a gate voltage as a linear function of time and calculating a displacement current flowing between a gate and a substrate. From this, a capacitance in a low-frequency region is obtained. The result is shown in FIG. 28. In addition, the interface state density Dit is calculated from a difference between a measurement value of Qs-CV and a measurement value of Hf-CV. As a result, since the interface state density Dit becomes $5.14E10/cm^2 \cdot eV$, a sufficiently low value is obtained. In addition, as described above, since the flat band voltage Vfb is +0.42V, a positive voltage is obtained.

Thus, by forming the first hafnium oxide layer 22-1 in a thickness of 3 nm or more, a value of the flat band voltage Vfb of the layer 22 having negative electric charges can be set to have a positive voltage and the interface state density Dit can be made low. Accordingly, the first hafnium oxide layer 22-1 is preferably formed in a film thickness of at least 3 nm of the film thickness required for the layer 22 having negative electric charges.

The first hafnium oxide layer 22-1 is a layer formed by the atomic layer deposition method. If the film thickness is smaller than 3 nm in forming the hafnium oxide layer using the atomic layer deposition method, interface damage resulting from the PVD method occurs when the following second hafnium oxide layer 22-2 is formed by using the PVD method. However, if the thickness of the first hafnium oxide layer 22-1 is 3 nm or more, the interface damage is suppressed even if the following second hafnium oxide layer 22-2 is formed by using the PVD method. Thus, by setting the thickness of the first hafnium oxide layer 22-1 to 3 nm or more so that the interface damage resulting from the PVD method is suppressed, a value of the flat band voltage Vfb of a layer including the first hafnium oxide layer 22-1 and the second hafnium oxide layer 22-2 becomes a positive voltage. As a result, the layer including the first hafnium oxide layer 22-1 and the second hafnium oxide layer 22-2 becomes a layer having negative electric charges. For this reason, the first hafnium oxide layer 22-1 formed at a side of the interface with the interface state lowering layer 21 is made to have a film thickness of 3 nm or more. In addition, an example of the PVD method includes a sputtering method.

On the other hand, if the entire layer 22 having negative electric charges is formed by using the atomic layer deposition method, an excellent C-V characteristic is obtained, but the productivity significantly lowers because it takes too much time to form the layer. For this reason, the thickness of the first hafnium oxide layer 22-1 cannot be made too large. In the atomic layer deposition method, it takes about 45 minutes to form a hafnium oxide layer in a thickness of 10 nm, for example. On the other hand, in the case of a physical vapor deposition method, it takes about 3 minutes to form a hafnium oxide layer in a thickness of 50 nm, for example. Accordingly, an upper limit of the thickness of the first hafnium oxide layer 22-1 is determined taking the productivity into consideration. For example, when the layer forming time of the layer 22 having negative electric charges is set to 1 hour or less, the upper limit of the thickness of the first hafnium oxide layer 22-1 is about 11 nm to 12 nm. Thus, in the case of a layer forming method in which the atomic layer deposition method and the physical vapor deposition method are used together, the layer forming time can be noticeably shortened compared with the case where the entire layer 22 having negative electric charges is formed by using the atomic layer deposition method or the CVD method. As a result, the mass production efficiency is improved. Furthermore, in the case of the atomic layer deposition method or the MOCVD method, there is almost no damage given to a substrate compared with a case of forming a layer using the physical vapor deposition method. Thus, since the damage to the light receiving sensor portion is reduced, a problem that the interface state density, which is a cause of generation of a dark current, becomes large can be solved.

Until now, the case in which the layer 22 having negative electric charges is formed of the hafnium oxide layer has been described. As the layer 22 having negative electric charges, however, the above-mentioned layers, for example, the aluminum oxide ($Al_2O_3$) layer, the zirconium oxide ($ZrO_2$) layer, the tantalum oxide ($Ta_2O_5$) layer, the titanium oxide ($TiO_2$) layer, the lanthanum oxide ($La_2O_3$), the praseodymium oxide ($Pr_2O_3$), the cerium oxide ($CeO_2$), the neodymium oxide ($Nd_2O_3$), the promethium oxide ($Pm_2O_3$), the samarium oxide ($Sm_2O_3$), the europium oxide ($Eu_2O_3$), the gadolinium oxide ($Gd_2O_3$), the terbium oxide ($Tb_2O_3$), the dysprosium oxide ($Dy_2O_3$), the holmium oxide ($Ho_2O_3$), the erbium oxide ($Er_2O_3$), the thulium oxide ($Tm_2O_3$), the ytterbium oxide ($Yb_2O_3$), the lutetium oxide ($Lu_2O_3$), the yttrium oxide ($Y_2O_3$), the hafnium nitride layer, the aluminum nitride layer, the hafnium oxynitride layer, or the aluminum oxynitride layer may also be used. Also in this case, the manufacturing method according to the embodiment of the present invention, in which layer formation is performed by using the atomic layer deposition method first and then layer formation is performed by using the physical vapor deposition method, may also be applied in the same manner. Thus, the same effects as in the case of the hafnium oxide layer can be acquired.

Figure 29:
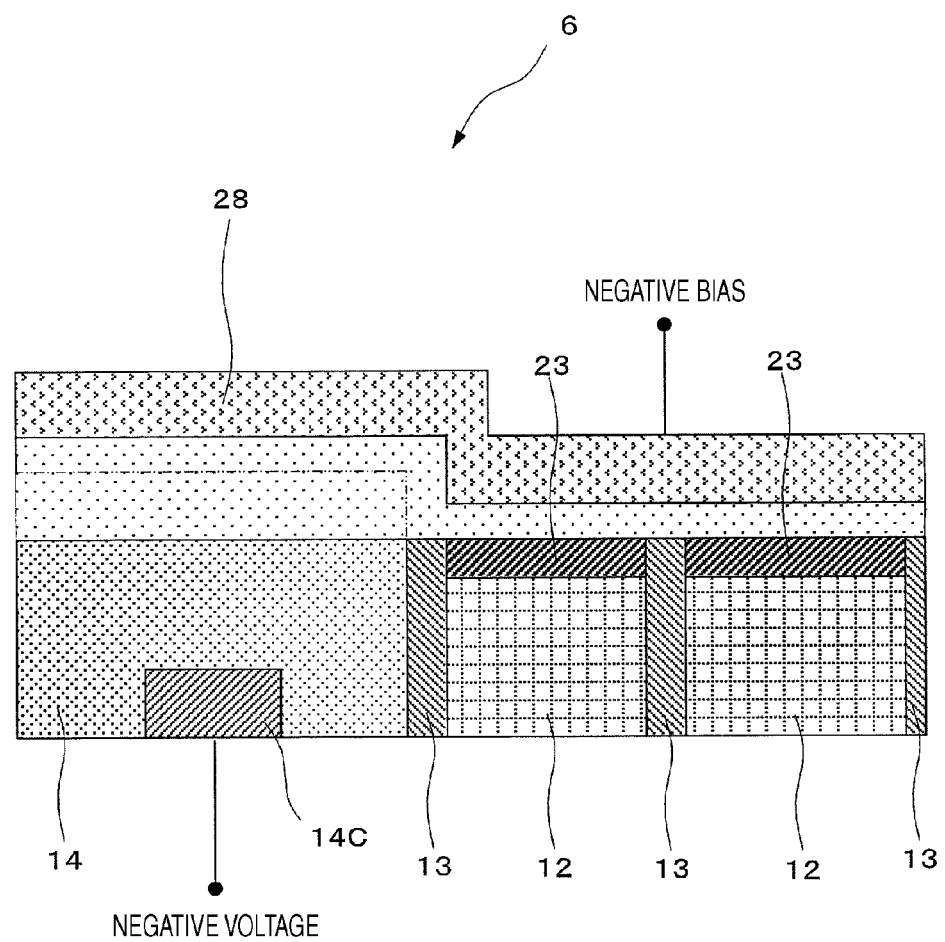
FIG. 29 is a cross-sectional view illustrating the configuration of main parts in a solid state imaging device (second solid state imaging device) according to an embodiment (first example) of the present invention.

Next, a solid state imaging device (second solid state imaging device) according to an embodiment (first example) of the present invention will be described with reference to a cross-sectional view of FIG. 29 illustrating the configuration of main parts. In addition, in FIG. 29, a light shielding layer for shielding a part of a light sensing section and a peripheral circuit section, a color filter layer for spectral filtering of light incident on the light sensing section, a condensing lens for condensing light incident on the light sensing section, and the like are not shown.

As shown in FIG. 29, a solid state imaging device 6 includes a light sensing section 12, which performs photoelectric conversion of incident light, in a semiconductor substrate (or a semiconductor layer) 11. On a side portion of the light sensing section 12, a peripheral circuit section 14 in which a peripheral circuit (for example, a circuit 14C) is formed with a pixel separating region 13 interposed therebetween is provided. On a light receiving surface 12s of the light sensing section (including a hole accumulation layer 23 which will be described later) 12, an insulating layer 27 is formed. The insulating layer 27 is formed of a silicon oxide ($SiO_2$) layer, for example. A negative voltage applying layer 28 is formed on the insulating layer 27.

In the drawing, the insulating layer 27 is formed thicker on the peripheral circuit section 14 than on the light sensing section 12 such that a distance of the negative voltage applying layer 28 from a surface of the peripheral circuit section 14 is larger than a distance of the negative voltage applying layer 28 from a surface of the light sensing section 12. In addition, when the insulating layer 27 is formed of a silicon oxide layer, for example, the insulating layer 27 has the same operation as the interface state lowering layer 21, which has been described earlier, on the light sensing section 12. Accordingly, the insulating layer 27 on the light sensing section 12 is preferably formed in a film thickness of one or more atomic layers and 100 nm or less, for example. Thus, when a negative voltage is applied to the negative voltage applying layer 28, a hole accumulation layer 23 is formed on a light receiving surface side of the light sensing section 12.

In the case when the solid state imaging device 6 is a CMOS image sensor, for example, a pixel circuit configured to include transistors, such as a transfer transistor, a reset transistor, an amplifying transistor, and a selection transistor, is provided as a peripheral circuit of the peripheral circuit section 14. In addition, a driving circuit which performs an operation of reading a signal on a read line of a pixel array section formed by the plurality of light sensing sections 12, a vertical scanning circuit which transmits the read signal, a shift register or an address decoder, a horizontal scanning circuit, and the like are included.

Moreover, in the case when the solid state imaging device 6 is a CCD image sensor, for example, a read gate which reads a signal charge photoelectrically converted by the light sensing section to a vertical transfer gate and a vertical charge transfer section which transmits the read signal charge in the vertical direction are provided as the peripheral circuit of the peripheral circuit section 14. In addition, a horizontal charge transfer section and the like are included.

The negative voltage applying layer 28 is formed of a transparent and conductive layer which allows incident light to be transmitted therethrough, for example, a transparent and conductive layer allows visible light to be transmitted therethrough. For example, an indium tin oxide layer, an indium zinc oxide layer, an indium oxide layer, a tin oxide layer, or a gallium zinc oxide layer may be used as such a layer.

The solid state imaging device 6 is configured such that a light shielding layer for shielding a part of the light sensing section 12 and the peripheral circuit section 14, a color filter layer for spectral filtering of light incident on at least the light sensing section 12, a condensing lens for condensing light incident on the light sensing section 12, and the like are provided on the negative voltage applying layer 28. As an example of such a configuration, any one of the configurations of the solid state imaging devices 1, 2, and 3 may also be applied.

In the solid state imaging device (second solid state imaging device) 6, the negative voltage applying layer 28 is formed on the insulating layer 27 formed on the light receiving surface 12s of the light sensing section 12. Accordingly, by the electric field generated by the negative voltage applied to the negative voltage applying layer 28, a hole accumulation layer is sufficiently formed on the interface at a side of the light receiving surface 12s of the light sensing section 12. Accordingly, electric charges (electrons) generated from the interface are suppressed. In addition, even if electric charges (electrons) are generated from the interface, the electric charges (electrons) do not flow to a charge accumulation portion which is a potential well in the light sensing section 12 but flow to the hole accumulation layer 23 in which many holes exist. As a result, the electric charges (electrons) can be eliminated. As a result, since it can be prevented that the electric charges generated due to the interface become a dark current and are detected by the light sensing section 12, a dark current caused by the interface state is suppressed. Furthermore, generation of electrons due to the interface state is further suppressed since the insulating layer 27 serving as an interface state lowering layer is formed on the light receiving surface 12s of the light sensing section 12. As a result, it is suppressed that electrons generated due to the interface state flow to the light sensing section 12 as a dark current.

Furthermore, as shown in the drawing, since the negative voltage applying layer 28 is formed such that the distance of the negative voltage applying layer 28 from the surface of the peripheral circuit section 14 is larger than the distance of the negative voltage applying layer 28 from the surface of the light sensing section 12 by the insulating layer 27, an influence of the electric field, which is generated when a negative voltage is applied to the negative voltage applying layer 28, on the peripheral circuit section 14 is reduced. As a result, circuit malfunction in the peripheral circuit section 14 can be eliminated.

Figure 30:
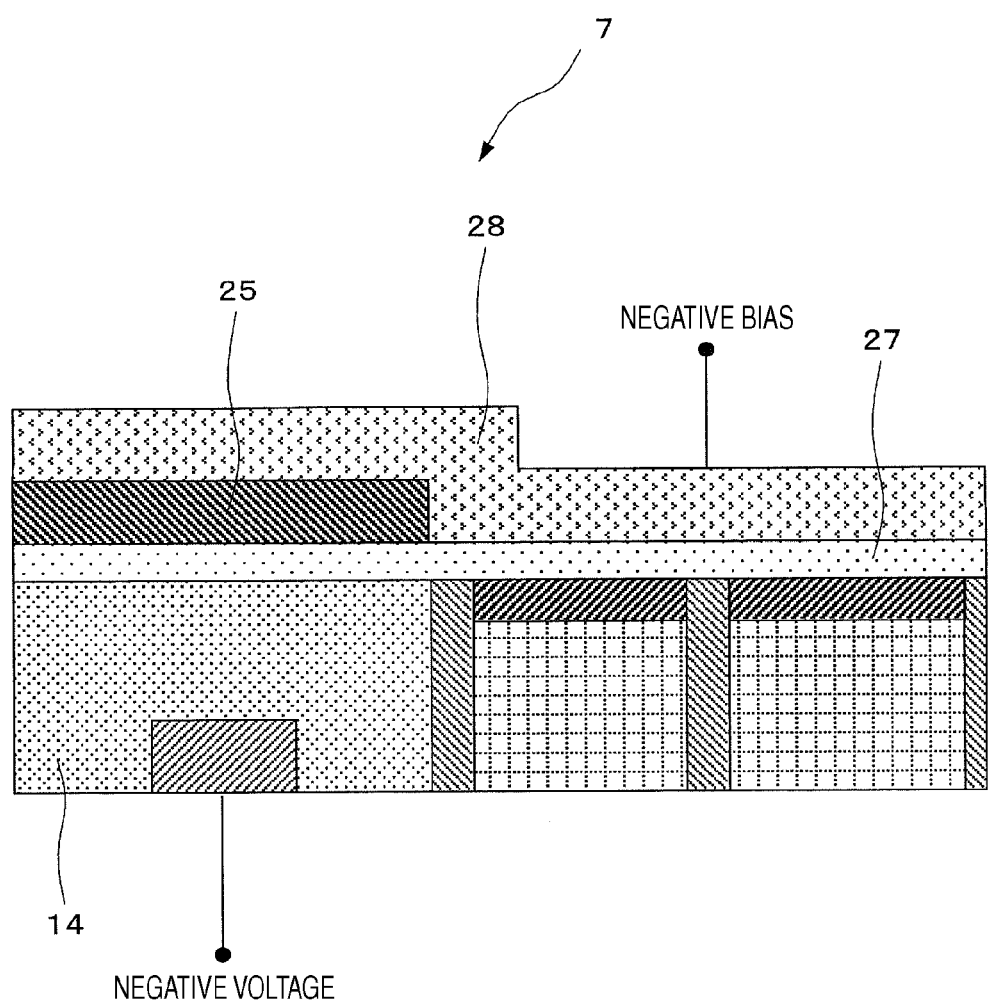
FIG. 30 is a cross-sectional view illustrating the configuration of main parts in a solid state imaging device (second solid state imaging device) according to an embodiment (second example) of the present invention.

Next, a solid state imaging device (second solid state imaging device) according to an embodiment (second example) of the present invention will be described with reference to a cross-sectional view of FIG. 30 illustrating the configuration of main parts. In addition, in FIG. 30, a light shielding layer for shielding a part of a light sensing section and a peripheral circuit section, a color filter layer for spectral filtering of light incident on the light sensing section, a condensing lens for condensing light incident on the light sensing section, and the like are not shown.

As shown in FIG. 30, a solid state imaging device 7 is obtained by forming a layer 25 for making a negative voltage applying layer distant from a light receiving surface on the peripheral circuit section 14, substantially, between the insulating layer 27 and the negative voltage applying layer 28 in the solid state imaging device 6. It is preferable that the layer 25 having positive electric charges in order to eliminate the influence of negative voltages. The layer 25 having positive electric charges is preferably formed between the peripheral circuit section 14 and the negative voltage applying layer 28. Alternatively, the layer 25 having positive electric charges may be formed on the insulating layer 27 or below the insulating layer 27. In addition, although the insulating layer 27 is formed as a layer having a uniform thickness in the drawing, the insulating layer 27 may also be formed thicker on the peripheral circuit section 14 than on the light sensing section 12 like the solid state imaging device 6.

An example of the layer 25 having positive electric charges includes a silicon nitride layer.

Thus, since the layer 25 having positive electric charges is formed between the peripheral circuit section 14 and the negative voltage applying layer 28, the negative electric field generated when a negative voltage is applied to the negative voltage applying layer 28 is reduced by positive electric charges in the layer 25 having positive electric charges. Accordingly, the peripheral circuit section 14 is not affected by the negative electric field. As a result, since it can be prevented that the peripheral circuit section 14 malfunctions due to the negative electric field, the reliability of the peripheral circuit section 14 is improved. As described above, the configuration in which the layer 25 having positive electric charges is formed between the peripheral circuit section 14 and the negative voltage applying layer 28 may also be applied to the solid state imaging device 6, and the same effects as in the solid state imaging device 7 can be obtained.

Figure 31:
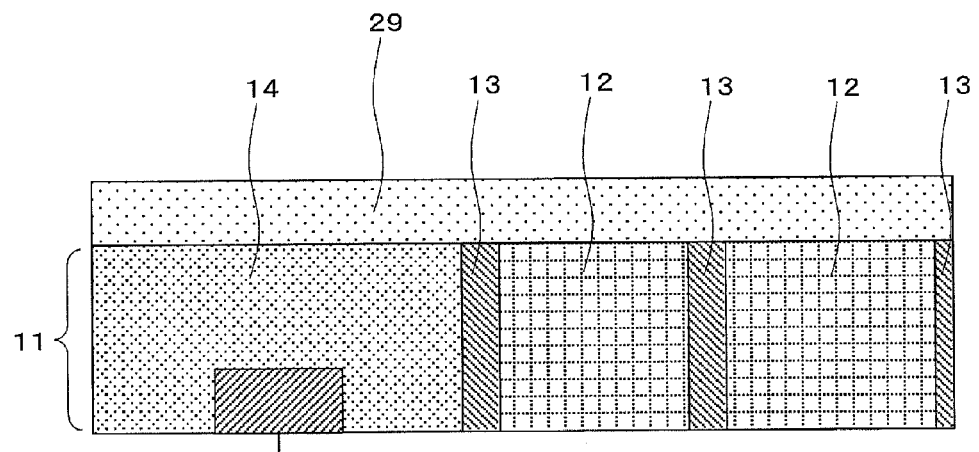
FIG. 31 is a cross-sectional view illustrating a manufacturing process in a method (second manufacturing method) of manufacturing a solid state imaging device according to an embodiment (first example) of the present invention.
Figure 31:
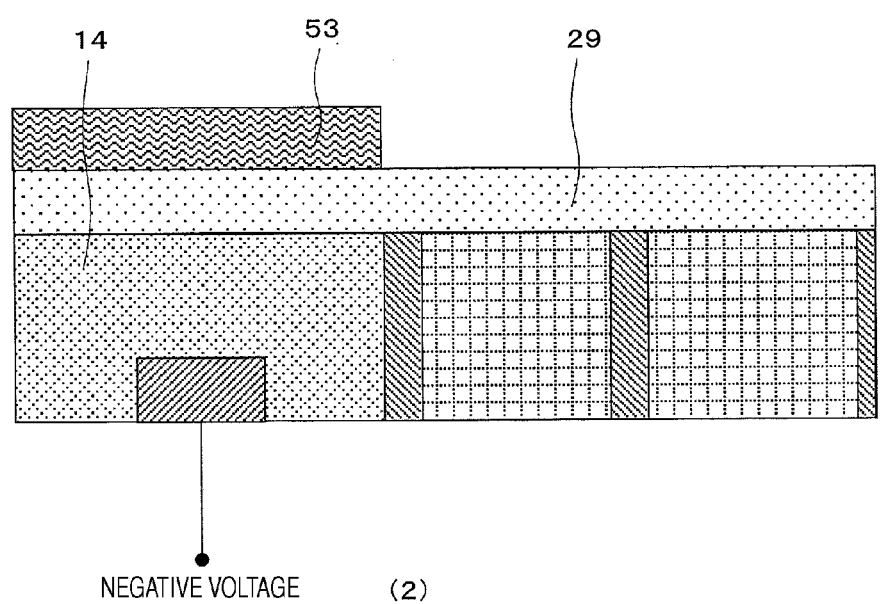
Figure 32:
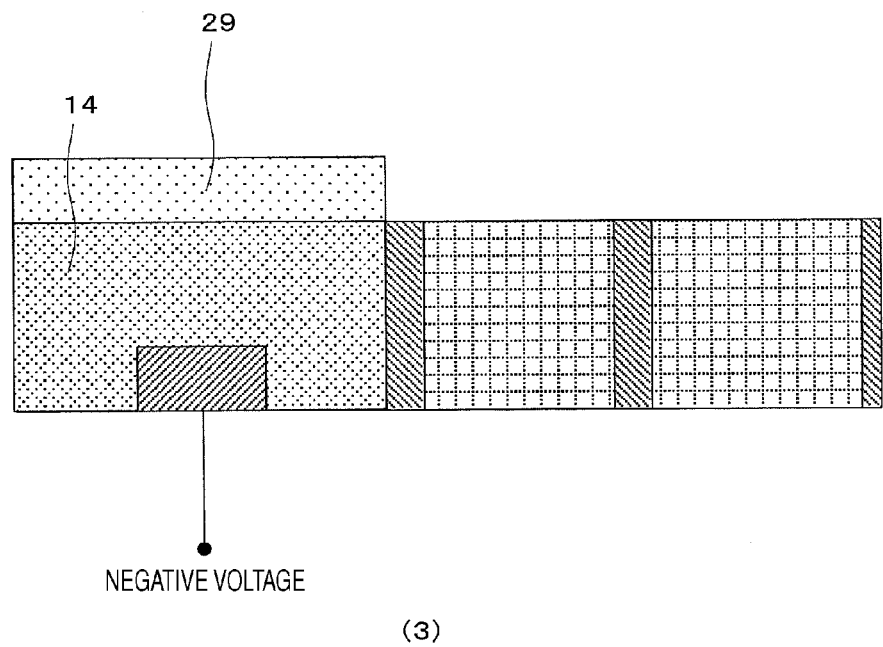
FIG. 32 is a cross-sectional view illustrating a manufacturing process in a method (second manufacturing method) of manufacturing a solid state imaging device according to an embodiment (first example) of the present invention.
Figure 32:
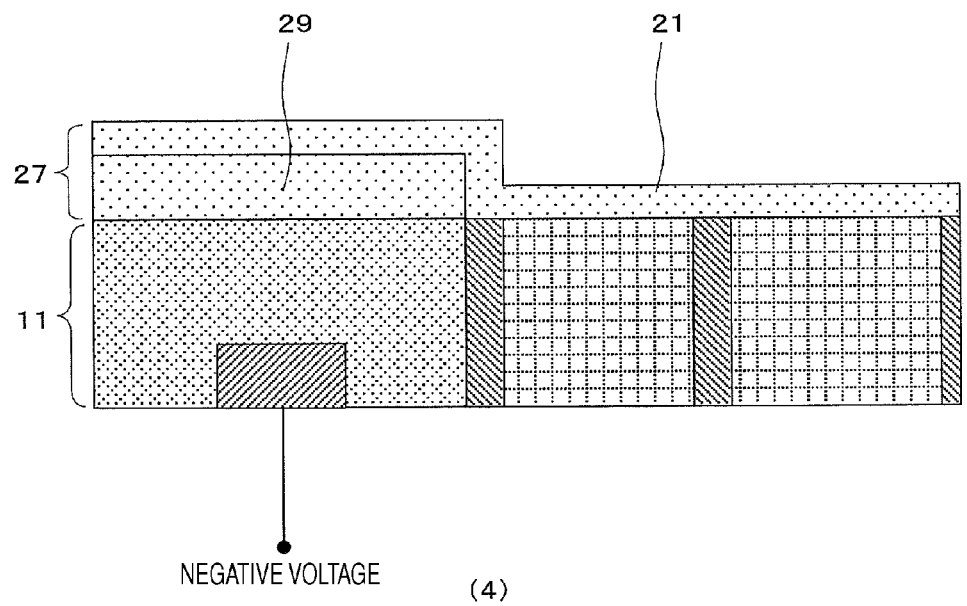
Figure 33:
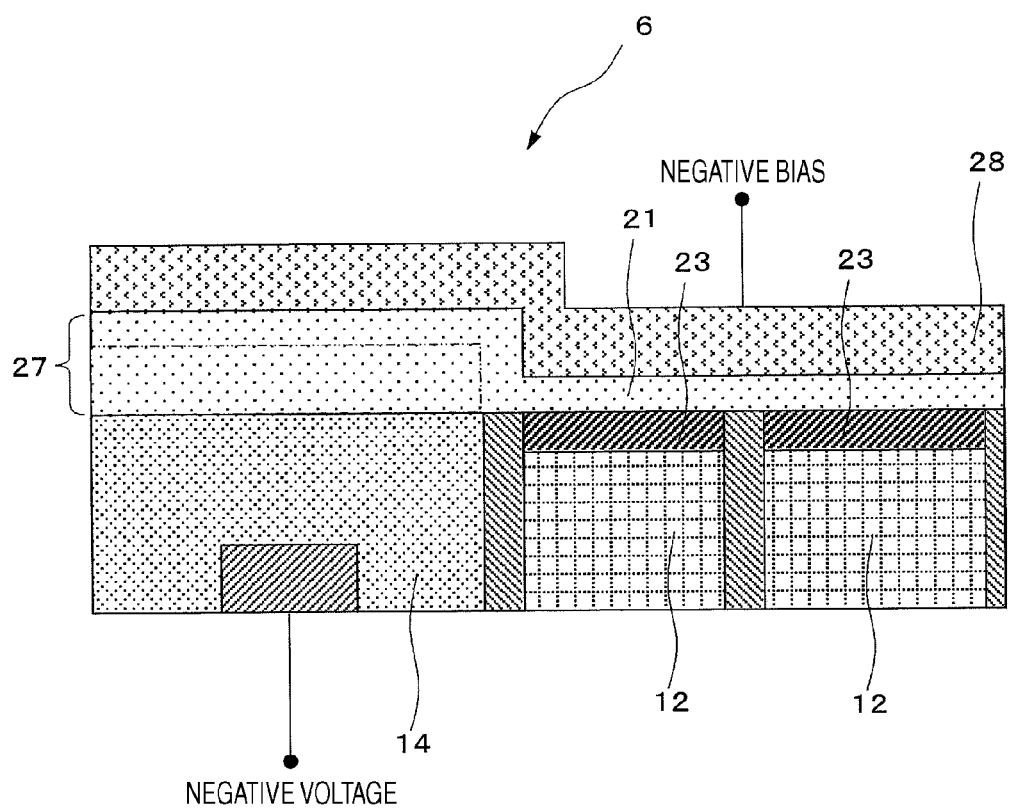
FIG. 33 is a cross-sectional view illustrating a manufacturing process in a method (second manufacturing method) of manufacturing a solid state imaging device according to an embodiment (first example) of the present invention.

Next, a method (second manufacturing method) of manufacturing a solid state imaging device according to an embodiment (first example) of the present invention will be described with reference to cross-sectional views of a manufacturing process of FIGS. 31 to 33 illustrating main parts. In FIGS. 31 to 33, a manufacturing process of the solid state imaging device 4 is shown as an example.

As shown in (1) of FIG. 31, the light sensing section 12 which performs photoelectric conversion of incident light, the pixel separating region 13 for separating the light sensing section 12, the peripheral circuit section 14 in which a peripheral circuit (for example, the circuit 14C) is formed with the pixel separating region 13 interposed between the peripheral circuit section 14 and the light sensing section 12, and the like are formed in the semiconductor substrate (or semiconductor layer) 11. A known manufacturing method is used as the manufacturing method. Then, an insulating layer 29 which allows incident light to be transmitted therethrough is formed. The insulating layer 29 is formed of a silicon oxide layer, for example.

Then, as shown in (2) of FIG. 31, a resist mask 53 is formed on the insulating layer 29 positioned above the peripheral circuit section 14 by using resist application and lithography technique.

Then, as shown in (3) of FIG. 32, the insulating layer 29 is processed by etching using the resist mask 53 (refer to (2) of FIG. 31), leaving the insulating layer 29 on the peripheral circuit section 14. Then, the resist mask 53 is removed.

Then, as shown in (4) of FIG. 32, the interface state lowering layer 21 which covers the insulating layer 26 is formed on the light receiving surface 12s of the light sensing section 12, actually, on the semiconductor substrate 11. The interface state lowering layer 21 is formed of a silicon oxide ($SiO_2$) layer, for example. Thus, the insulating layer 27 is formed by the insulating layer 29 and the interface state lowering layer 21.

Then, as shown in (5) of FIG. 33, the negative voltage applying layer 28 is formed on the interface state lowering layer 21. The hole accumulation layer 23 is formed on a light receiving surface side of the light sensing section 12 by the negative voltage applied to the negative voltage applying layer 28. Accordingly, at least on the light sensing section 12, the interface state lowering layer 21 needs to be formed in a film thickness that the hole accumulation layer 23 is formed at a side of the light receiving surface 12s of the light sensing section 12 by the negative voltage applied to the negative voltage applying layer 28. For example, the film thickness is set to be equal to or larger than one atomic layer and equal to or smaller than 100 nm.

The negative voltage applying layer 28 is formed of a transparent and conductive layer which allows incident light to be transmitted therethrough, for example, a transparent and conductive layer allows visible light to be transmitted therethrough. For example, an indium tin oxide layer, an indium zinc oxide layer, an indium oxide layer, a tin oxide layer, or a gallium zinc oxide layer may be used as such a layer.

A light shielding layer for shielding a part of the light sensing section 12 and the peripheral circuit section 14, a color filter layer for spectral filtering of light incident on at least the light sensing section 12, a condensing lens for condensing light incident on the light sensing section 12, and the like are formed on the negative voltage applying layer 28 in the solid state imaging device 6. Any method described in each example of the method (first manufacturing method) of manufacturing a solid state imaging device may be applied as an example of the manufacturing method.

In the first example of the method (second manufacturing method) of manufacturing the solid state imaging device 6, the negative voltage applying layer 28 is formed on the insulating layer 27 formed on the light receiving surface 12s of the light sensing section 12. Accordingly, by the electric field generated by the negative voltage applied to the negative voltage applying layer 28, a hole accumulation layer is sufficiently formed on the interface at a side of the light receiving surface 12s of the light sensing section 12. Accordingly, electric charges (electrons) generated from the interface can be suppressed. In addition, even if electric charges (electrons) are generated from the interface, the electric charges (electrons) do not flow to a charge accumulation portion which is a potential well in the light sensing section 12 but flow to the hole accumulation layer 23 in which many holes exist. As a result, the electric charges (electrons) can be eliminated. As a result, since it can be prevented that the electric charges generated due to the interface become a dark current and are detected by the light sensing section 12, a dark current caused by the interface state is suppressed. Furthermore, generation of electrons due to the interface state is further suppressed since the interface state lowering layer 21 is formed on the light receiving surface 12s of the light sensing section 12. As a result, it is suppressed that electrons generated due to the interface state flow to the light sensing section 12 as a dark current.

Furthermore, as shown in the drawing, the insulating layer 27 on the peripheral circuit section 14 is formed thicker than the insulating layer 27 on the light sensing section 12 such that the distance of the negative voltage applying layer 28 from the surface of the peripheral circuit section 14 is larger than the distance of the negative voltage applying layer 28 from the surface of the light sensing section 12 by the insulating layer 27. Accordingly, an influence of the electric field, which is generated when a negative voltage is applied to the negative voltage applying layer 28, on the peripheral circuit section 14 is reduced. That is, since the electric field strength is reduced and it is suppressed holes are accumulated on the surface of the peripheral circuit section 14, circuit malfunction in the peripheral circuit section 14 can be eliminated.

Figure 34:
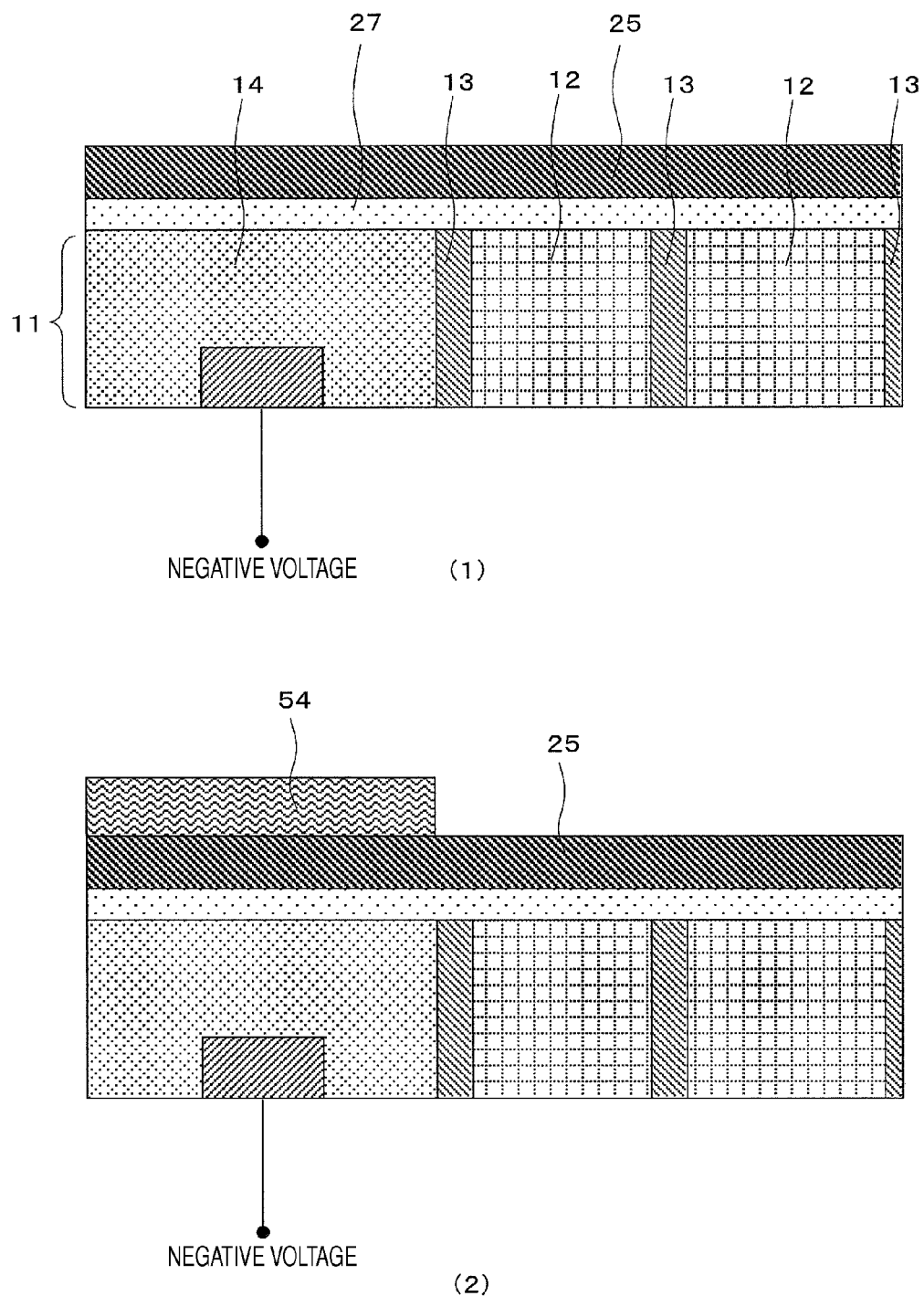
FIG. 34 is a cross-sectional view illustrating a manufacturing process in a method (second manufacturing method) of manufacturing a solid state imaging device according to an embodiment (second example) of the present invention.
Figure 35:
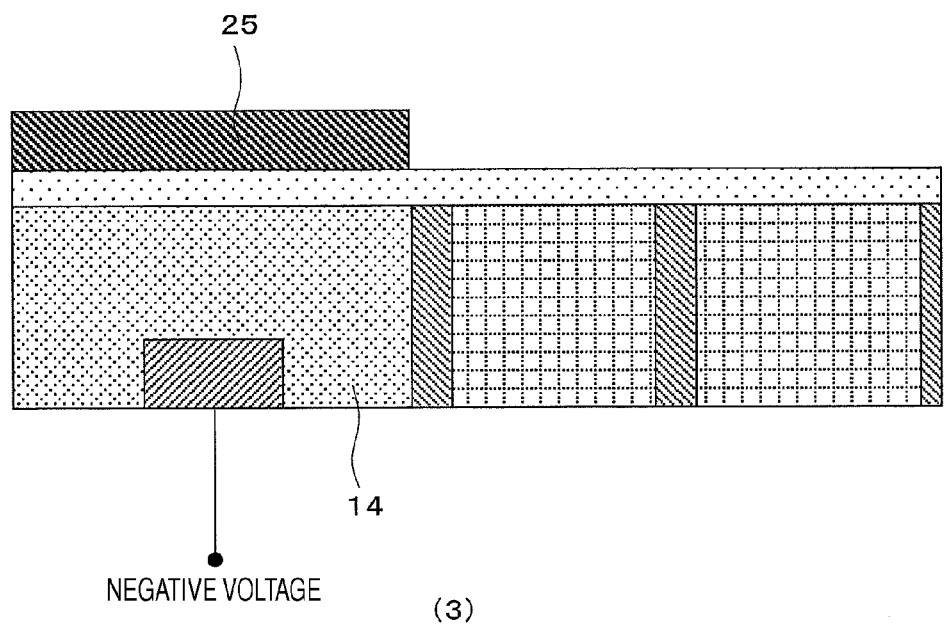
FIG. 35 is a cross-sectional view illustrating a manufacturing process in a method (second manufacturing method) of manufacturing a solid state imaging device according to an embodiment (second example) of the present invention.
Figure 35:
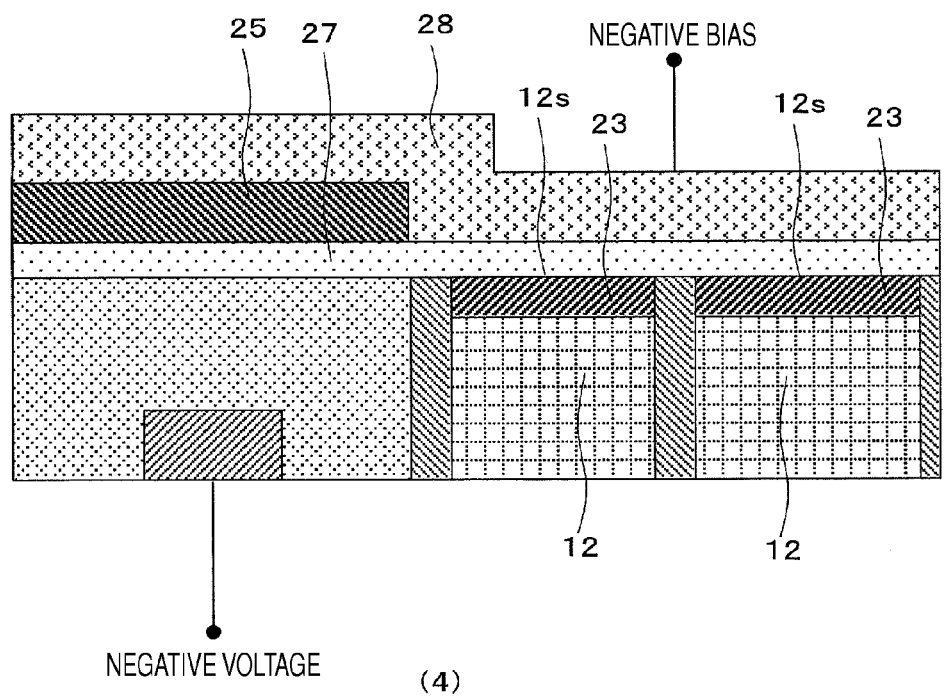

Next, a method (second manufacturing method) of manufacturing a solid state imaging device according to an embodiment (second example) of the present invention will be described with reference to cross-sectional views of a manufacturing process of FIGS. 34 and 35 illustrating main parts. In FIGS. 34 and 35, a manufacturing process of the solid state imaging device 4 is shown as an example.

As shown in (1) of FIG. 34, the light sensing section 12 which performs photoelectric conversion of incident light, the pixel separating region 13 for separating the light sensing section 12, the peripheral circuit section 14 in which a peripheral circuit (for example, the circuit 14C) is formed with the pixel separating region 13 interposed between the peripheral circuit section 14 and the light sensing section 12, and the like are formed in the semiconductor substrate (or semiconductor layer) 11. A known manufacturing method is used as the manufacturing method. Then, the insulating layer 27 which allows incident light to be transmitted therethrough is formed. The insulating layer 27 is formed of a silicon oxide layer, for example. Then, the layer 25 having positive electric charges is formed on the insulating layer 27. The layer 25 having positive electric charges is formed of a silicon nitride layer, for example.

Then, as shown in (2) of FIG. 34, a resist mask 54 is formed on the layer 25 having positive electric charges positioned above the peripheral circuit section 14 by using resist application and lithography technique.

Then, as shown in (3) of FIG. 35, the layer 25 having positive electric charges is processed by etching using the resist mask 54 (refer to (2) of FIG. 34), leaving the layer 25 having positive electric charges on the peripheral circuit section 14. Then, the resist mask 54 is removed.

Then, as shown in (4) of FIG. 35, the negative voltage applying layer 28 is formed on the insulating layer 27 and the layer 25 having positive electric charges. The hole accumulation layer 23 is formed on a light receiving surface side of the light sensing section 12 by the negative voltage applied to the negative voltage applying layer 28. In this case, the insulating layer 27 may be made to function as an interface state lowering layer. Accordingly, at least on the light sensing section 12, the insulating layer 27 needs to be formed in a film thickness that the hole accumulation layer 23 is formed at a side of the light receiving surface 12s of the light sensing section 12 by the negative voltage applied to the negative voltage applying layer 28. For example, the film thickness is set to be equal to or larger than one atomic layer and equal to or smaller than 100 nm.

The negative voltage applying layer 28 is formed of a transparent and conductive layer which allows incident light to be transmitted therethrough, for example, a transparent and conductive layer allows visible light to be transmitted therethrough. For example, an indium tin oxide layer, an indium zinc oxide layer, an indium oxide layer, a tin oxide layer, or a gallium zinc oxide layer may be used as such a layer.

Although not shown, a light shielding layer for shielding a part of the light sensing section 12 and the peripheral circuit section 14, a color filter layer for spectral filtering of light incident on at least the light sensing section 12, a condensing lens for condensing light incident on the light sensing section 12, and the like are formed on the negative voltage applying layer 28 in the solid state imaging device 7. Any method described in each example of the method (first manufacturing method) of manufacturing a solid state imaging device may be applied as an example of the manufacturing method.

In the second example of the method (second manufacturing method) of manufacturing the solid state imaging device 7, the negative voltage applying layer 28 is formed on the insulating layer 27 formed on the light receiving surface 12s of the light sensing section 12. Accordingly, by the electric field generated by the negative voltage applied to the negative voltage applying layer 28, a hole accumulation layer is sufficiently formed on the interface at a side of the light receiving surface 12s of the light sensing section 12. Accordingly, electric charges (electrons) generated from the interface can be suppressed. In addition, even if electric charges (electrons) are generated from the interface, the electric charges (electrons) do not flow to a charge accumulation portion which is a potential well in the light sensing section 12 but flow to the hole accumulation layer 23 in which many holes exist. As a result, the electric charges (electrons) can be eliminated. As a result, since it can be prevented that the electric charges generated due to the interface become a dark current and are detected by the light sensing section 12, a dark current caused by the interface state is suppressed. Furthermore, generation of electrons due to the interface state is further suppressed since the interface state lowering layer 21 is formed on the light receiving surface 12s of the light sensing section 12. As a result, it is suppressed that electrons generated due to the interface state flow to the light sensing section 12 as a dark current.

In addition, since the layer 25 having positive electric charges is formed between the peripheral circuit section 14 and the negative voltage applying layer 28, the negative electric field generated when a negative voltage is applied to the negative voltage applying layer 28 is reduced by positive electric charges in the layer 25 having positive electric charges. Accordingly, the peripheral circuit section 14 is not affected by the negative electric field. As a result, it is possible to prevent the peripheral circuit section 14 from malfunctioning due to the negative electric field. As described above, the configuration in which the layer 25 having positive electric charges is formed between the peripheral circuit section 14 and the negative voltage applying layer 28 may also be applied to the solid state imaging device 6, and the same effects as in the solid state imaging device 7 can be obtained.

Figure 36:
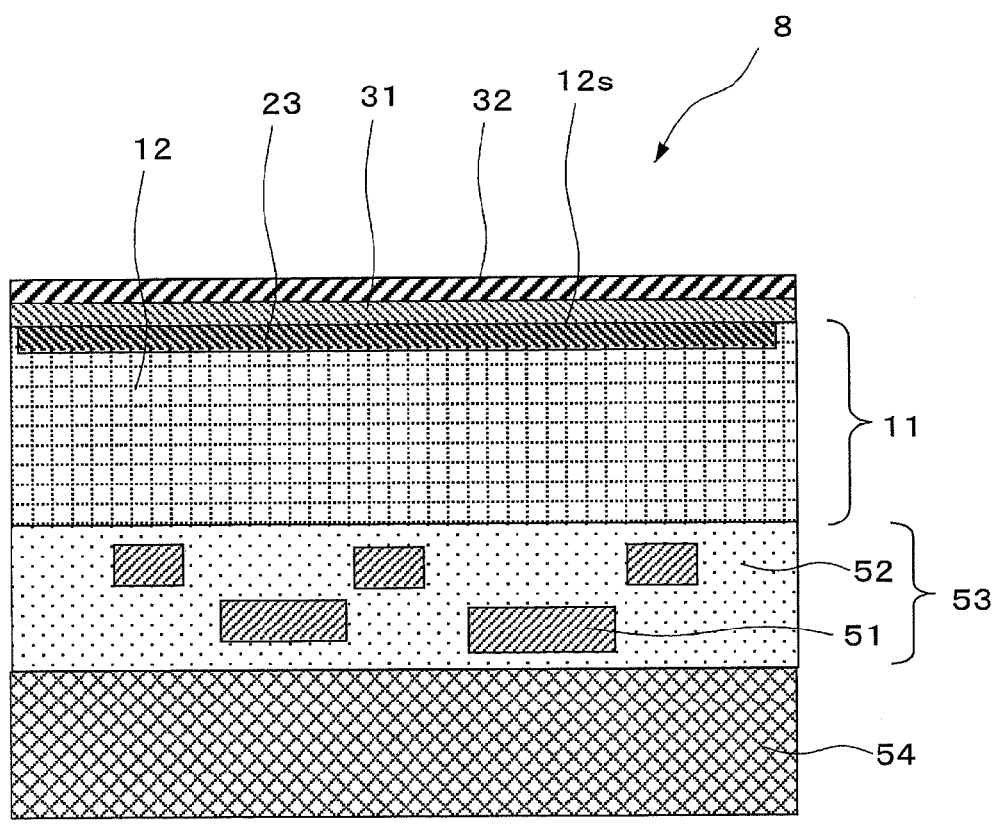
FIG. 36 is a cross-sectional view illustrating the configuration of main parts in a solid state imaging device (third solid state imaging device) according to an embodiment (example) of the present invention.

Next, a solid state imaging device (third solid state imaging device) according to an embodiment (example) of the present invention will be described with reference to a cross-sectional view of FIG. 36 illustrating the configuration of main parts. In addition, in FIG. 36, a light sensing section is mainly shown, but a peripheral circuit section, a wiring layer, a light shielding layer for shielding a part of the light sensing section and the peripheral circuit section, a color filter layer for spectral filtering of light incident on the light sensing section, a condensing lens for condensing light incident on the light sensing section, and the like are not shown.

As shown in FIG. 36, a solid state imaging device 8 has a light sensing section 12, which performs photoelectric conversion of incident light, on a semiconductor substrate (or semiconductor layer) 11. An insulating layer 31 is formed on a side of the light receiving surface 12s of the light sensing section 12 and the insulating layer 31 is formed of a silicon oxide ($SiO_2$) layer, for example. On the insulating layer 31, a layer (hereinafter, referred to as an auxiliary hole accumulation layer) 32 having a work function larger than the interface on a side of the light receiving surface 12s of the light sensing section 12 which performs photoelectric conversion is formed. By a difference between the work functions, the hole accumulation layer 23 is formed. The auxiliary hole accumulation layer 32 may be an insulating layer 21 or a conductive layer, such as a metallic layer since the auxiliary hole accumulation layer 32 does not need to be electrically connected to other elements and wiring lines.

In addition, on a side of the semiconductor substrate 11 opposite a light incidence side of thereof on which the light sensing section 12 is formed, a wiring layer 53 configured to include wiring lines 51, which are provided over a plurality of layers, and an insulating layer 52 is formed, for example. Furthermore, the wiring layer 53 is supported by a support substrate 54.

For example, since the hole accumulation layer 23 is formed of silicon (Si), a value of the work function is about 5.1 eV. Accordingly, the auxiliary hole accumulation layer 32 is preferably a layer having a value of a work function larger than 5.1.

For example, in the case of using a metallic layer, according to the chronological scientific tables, a value of a work function of an iridium (110) layer is 5.42, a value of a work function of an iridium (111) layer is 5.76, a value of a work function of a nickel layer is 5.15, a value of a work function of a palladium layer is 5.55, a value of a work function of an osmium layer is 5.93, a value of a work function of a golden (100) layer is 5.47, a value of a work function of a golden (110) layer is 5.37, and a value of a work function of a platinum layer is 5.64. These layers may be used as the auxiliary hole accumulation layer 32. In addition to the above layers, a metallic layer with a value of a work function larger than that of the interface at a side of the light receiving surface 12s of the light sensing section 12 may also be used as the auxiliary hole accumulation layer 32. In addition, although a work function value of ITO ($In_2O_3$) used as a transparent electrode is 4.8 eV, the work function of an oxide semiconductor may be controlled by a layer forming method or injection of impurities.

It is important that the auxiliary hole accumulation layer 32 be formed in a film thickness, which allows incident light to be transmitted therethrough, since the auxiliary hole accumulation layer 32 is formed on a light incidence side. Regarding the transmittance of the incident light, it is preferable that the auxiliary hole accumulation layer 32 have a transmittance as high as possible. For example, it is preferable to secure a transmittance of 95% or more.

In addition, for the auxiliary hole accumulation layer 32, it is preferable to use a difference between the work function of the auxiliary hole accumulation layer 32 and a work function of a surface of the light sensing section 12. Since there is no limitation in low resistance, it is not necessary to make the film thickness large even in a case when a conductive layer is used, for example. For example, assuming that the intensity of incident light is $I_0$ and the absorptivity is $\alpha$ (where $\alpha=(4\pi k)/\lambda$, k is Boltzmann's constant, and $\lambda$ is a wavelength of incident light), the light intensity at a position of a depth z position is expressed as $I(z)=I_0 \exp(-\alpha \cdot z)$. Accordingly, calculating a thickness satisfying $I(z)/I_0=0.8$, the thickness of the iridium layer is 1.9 nm, the thickness of the gold layer is 4.8 nm, and the thickness of the platinum layer is 3.4 nm, for example. That is, it can be seen that the thickness is preferably 2 nm or less, even though the thickness changes with the film type.

In addition, the auxiliary hole accumulation layer 32 may be an organic layer. For example, polysthylenedioxytyiophene) may be used. As described above, the auxiliary hole accumulation layer 32 may be a conductive layer, an insulating layer, or a semiconductor layer as long as it has a work function value higher than that of the interface at a side of the light receiving surface 12s of the light sensing section 12.

In the solid state imaging device 8, the layer (auxiliary hole accumulation layer) 32 with a larger work function value than the interface 23 at a side of the light receiving surface 12s of the light sensing section 12 is provided on the insulating layer 31 formed on the light sensing section 12. Accordingly, since the hole accumulation efficiency of the hole accumulation layer 23 is improved, the hole accumulation layer 23 formed on the light-receiving-side interface of the light sensing section 12 can accumulate sufficient holes therein. As a result, a dark current is reduced.

Figure 37:
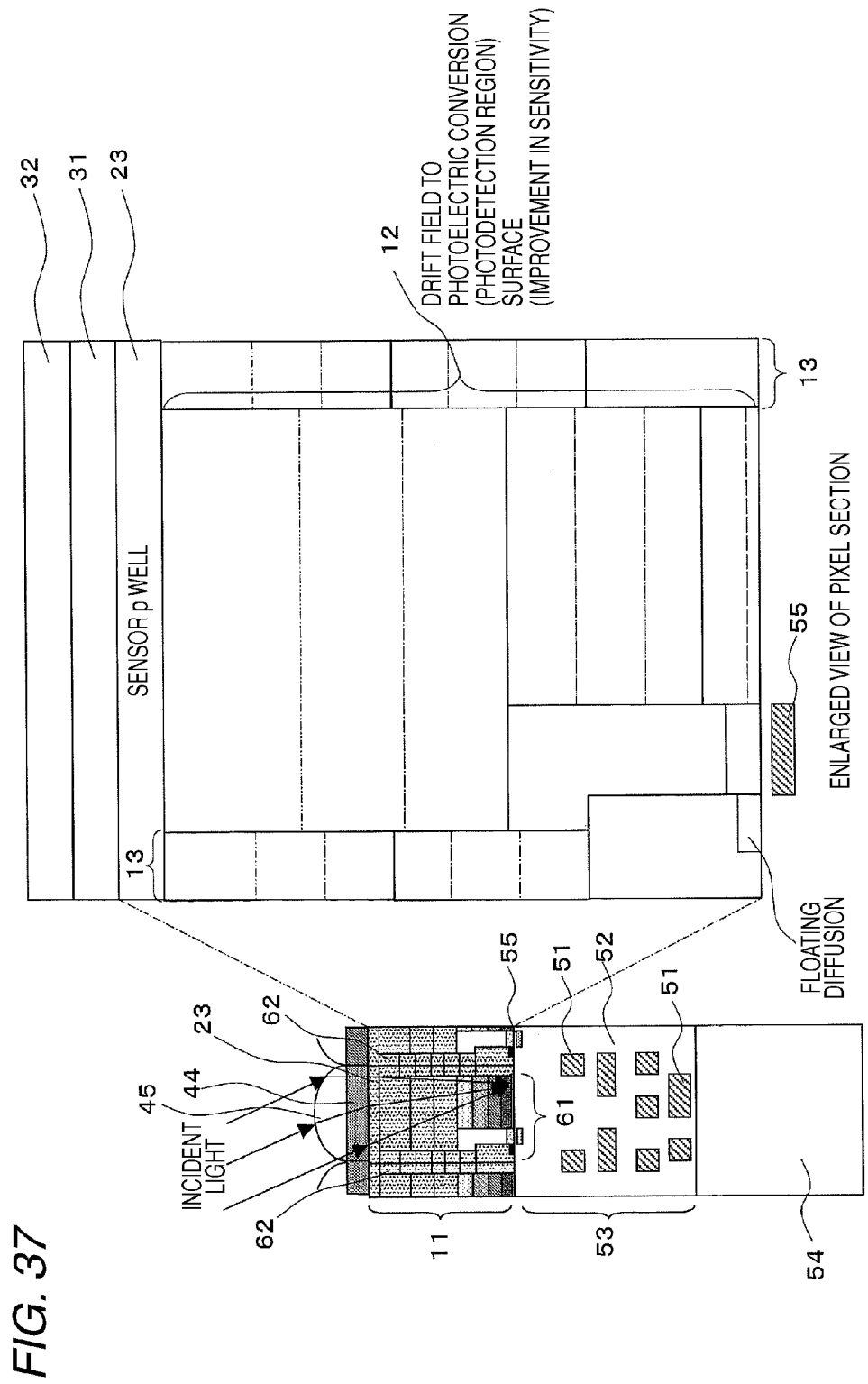
FIG. 37 is a cross-sectional view of the configuration of main parts, which illustrates an example of a solid state imaging device that uses an auxiliary hole accumulation layer.

Next, an example of the configuration of the solid state imaging device using the auxiliary hole accumulation layer 32 will be described with reference to FIG. 37. FIG. 37 shows a CMOS image sensor.

As shown in FIG. 37, the light sensing section (for example, a photodiode) 12, which converts incident light into an electric signal, and a plurality of pixel sections 61 having a transistor group 55 (partially shown in the drawing) including a transfer transistor, an amplifying transistor, and a reset transistor are formed in the semiconductor substrate 11. For example, a silicon substrate is used as the semiconductor substrate 11. In addition, a signal processing section (not shown) which processes a signal charge read from each light sensing section 12 is formed.

An element separating region 13 is formed in a part of the periphery of the pixel section 61, for example, between the pixel sections 61 provided in a column direction or in a row direction.

In addition, the wiring layer 53 is formed on a surface side (below the semiconductor substrate 11 in the drawing) of the semiconductor substrate 11 formed with the light sensing section 12. The wiring layer 53 is configured to include the wiring lines 51 and the insulating layer 52 which covers the wiring lines 51. The support substrate 54 is formed on the wiring layer 53. The support substrate 54 is formed of a silicon substrate, for example.

Furthermore, in the solid state imaging device 1, the hole accumulation layer 23 is formed on a bottom surface side of the semiconductor substrate 11, and the auxiliary hole accumulation layer 32 is formed on the hole accumulation layer 23 with the insulating layer 31 interposed therebetween. Furthermore, an organic color filter layer 44 is formed through the insulating layer (not shown). The organic color filter layer 44 is formed corresponding to the light sensing section 12 and is obtained by aligning a blue organic color filter, a red organic color filter, and a green organic color filter in a checker board pattern, for example. In addition, the condensing lens 45 for making incident light condensed onto each light sensing section 12 is formed on each organic color filter layer 44.

Figure 38:
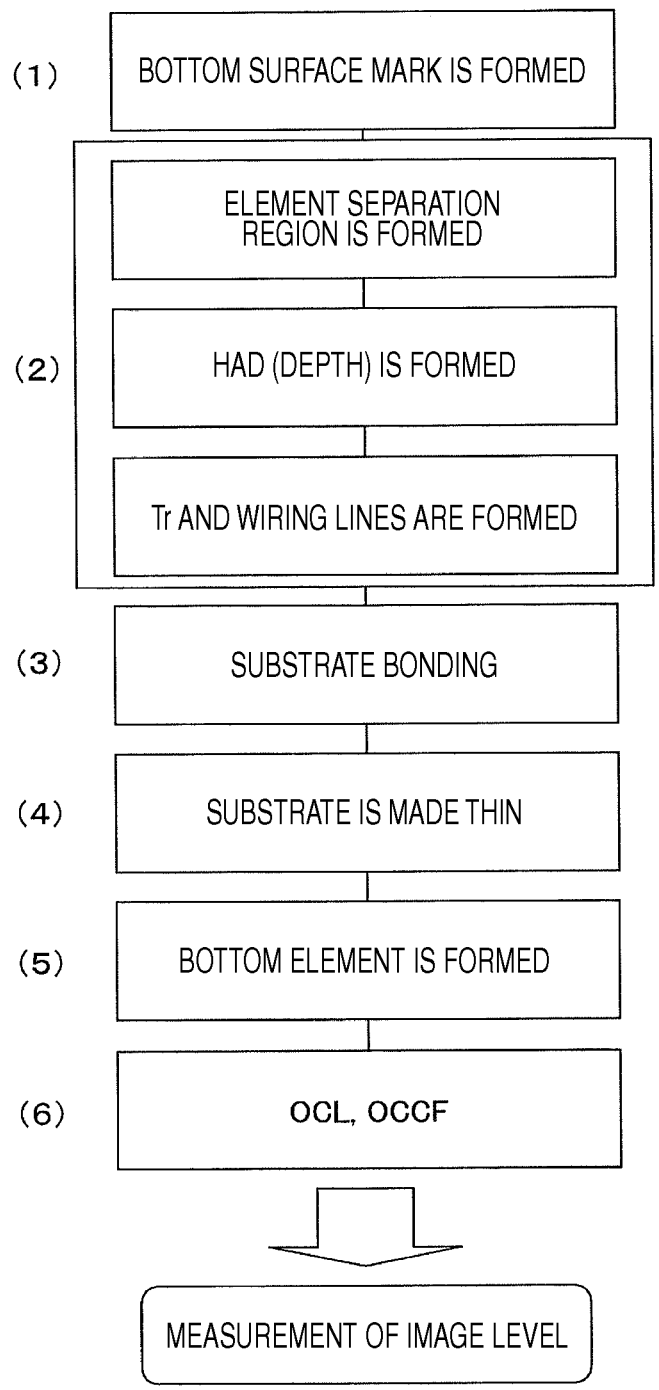
FIG. 38 is a flow chart illustrating a method (third manufacturing method) of manufacturing a solid state imaging device according to an embodiment (example) of the present invention.
Figure 39:
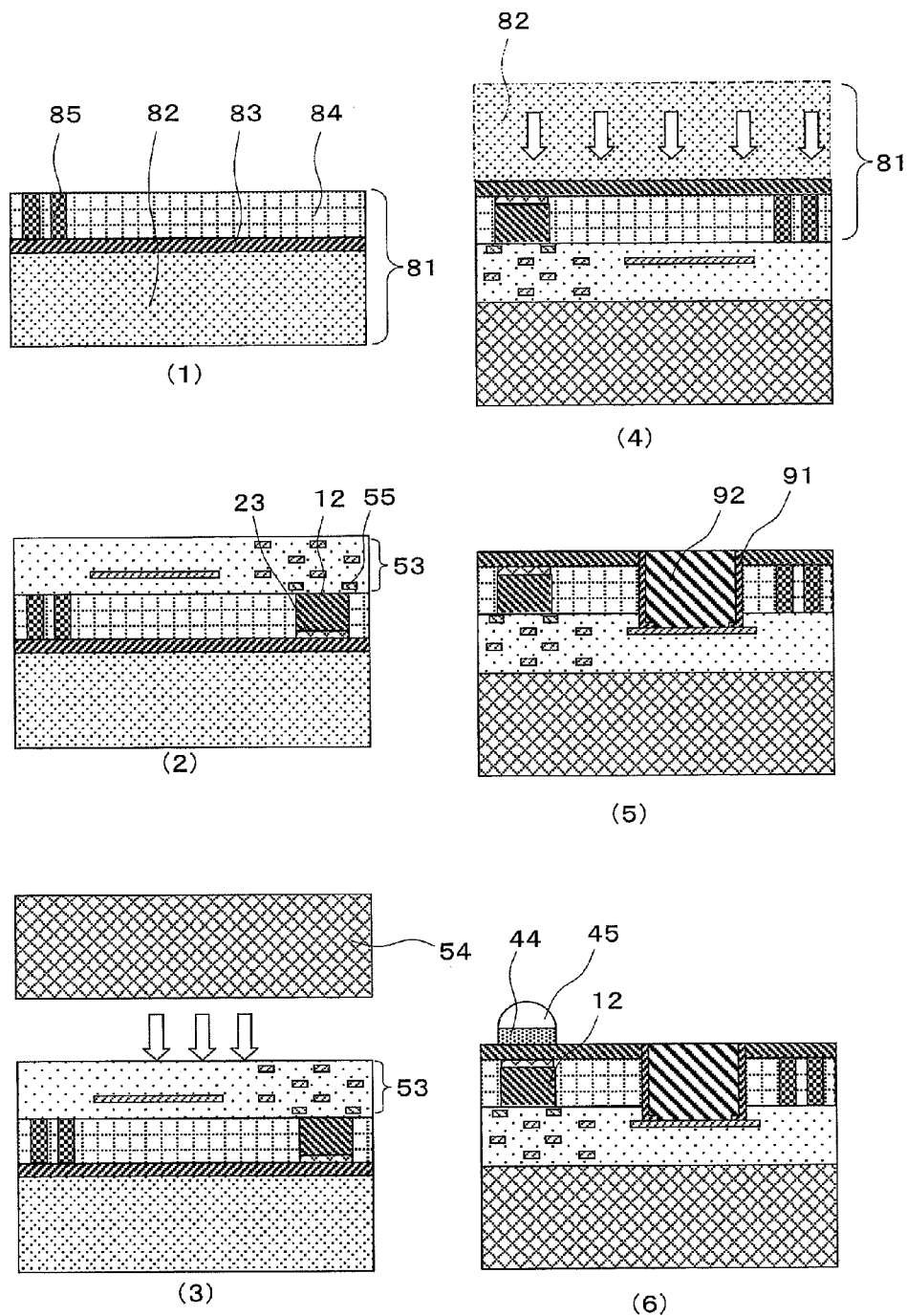
FIG. 39 is a cross-sectional view illustrating a manufacturing process in a method (third manufacturing method) of manufacturing a solid state imaging device according to an embodiment (example) of the present invention.
Figure 40:
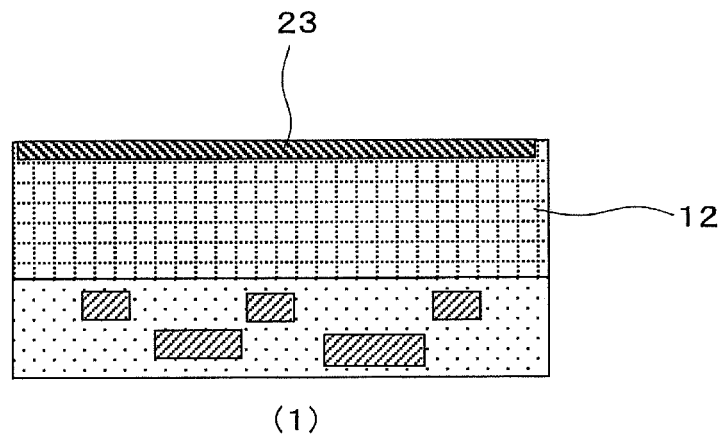
FIG. 40 is a cross-sectional view illustrating a process of manufacturing main parts in a method (third manufacturing method) of manufacturing a solid state imaging device according to an embodiment (example) of the present invention.
Figure 40:
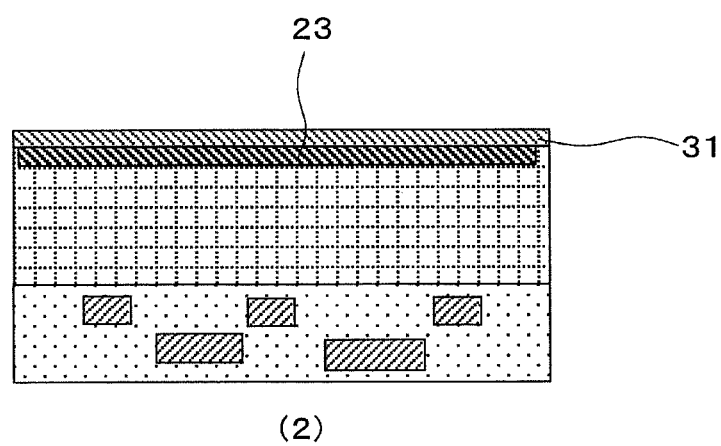
Figure 40:
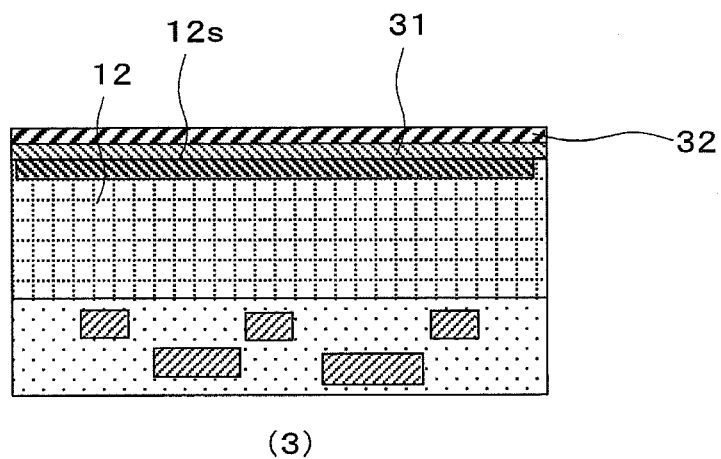

Next, a method (third manufacturing method) of manufacturing a solid state imaging device according to an embodiment (first example) of the present invention will be described with reference to a flow chart shown in FIG. 38, a cross-sectional view of a manufacturing process of FIG. 39, and a cross-sectional view of a manufacturing process of FIG. 40 illustrating main parts. In FIGS. 38 to 40, a manufacturing process of the solid state imaging device 8 is shown as an example.

As shown in (1) of FIG. 38 and (1) of FIG. 39, an SOI substrate 81 obtained by forming a silicon layer 84 on a silicon substrate 82 with an insulating layer (for example, a silicon oxide layer) 83 interposed therebetween is first prepared, and a bottom surface mark 85 for alignment is formed in the silicon layer 84.

Then, as shown in (2) of FIG. 38 and (2) of FIG. 39, an element separating region (not shown), the hole accumulation layer 23, the light sensing section 12, the transistor group 55, the wiring layer 53, and the like are formed in the silicon layer 84 of the SOI substrate 81. The hole accumulation layer 23 may be formed in a subsequent process after a process of making a substrate thin.

Then, as shown in (3) of FIG. 38 and (3) of FIG. 39, the wiring layer 53 and the support substrate 54 are bonded together.

Then, as shown in (4) of FIG. 38 and (4) of FIG. 39, a process of making the SOI substrate 81 thin is executed. Here, the silicon substrate 82 is removed by grinding and polishing, for example.

Although not shown, the hole accumulation layer 23 may also be formed by forming a cap layer (not shown) after removing the insulating layer 82 of the SOI substrate 81 and performing impurity injection and activation processing. As an example, a plasma-TEOS silicon oxide layer is formed in a thickness of 30 nm as the cap layer and the impurity injection is performed by ion implantation of boron. In this ion implantation condition, for example, the implantation energy is set to 20 keV and a dose of $1\times10^{13}/cm^2$ is set, for example. In addition, the activation is preferably performed by annealing in a temperature of 400° C. or less so that bonding of the wiring layer 53 and the support substrate 54 is not damaged. Then, the cap layer is removed by rare fluorinated acid processing, for example. At this time, the insulating layer 83 of the SOI substrate 81 may be removed.

Thus, as shown in (1) of FIG. 40, the light-receiving-surface-side interface 23 of the light sensing section is formed on the light sensing section 12.

Then, as shown in (2) of FIG. 40, the insulating layer 31 is formed on the hole accumulation layer 23 (light incidence side). As an example, a plasma TEOS silicon oxide layer is formed in a thickness of 30 nm.

Then, as shown in (3) of FIG. 40, a layer having a work function value larger than the interface (having a work function value of about 5.1 eV) at a side of the light receiving surface 12s of the light sensing section 12, that is, the auxiliary hole accumulation layer 32 is formed on the insulating layer 31 (light incidence side). As an example, a platinum (Pt) layer having a work function of 5.6 eV, which is a thin metal layer, is formed in a thickness of 3 nm by sputtering. For other thin metal layers, iridium (Ir), rhenium (Re), nickel (Ni), palladium (Pd), cobalt (Co), ruthenium (Ru), rhodium (Rh), osmium (Os), gold (Au), and the like may be used. It is needless to say that alloy may be used.

Furthermore, ITO ($In_2O_3$) may also be used as a material of the auxiliary hole accumulation layer 32 since the work function of the light-receiving-surface-side interface of the light sensing section is about 5.1 eV in this example. The ITO may have a work function of 4.5 eV to 5.6 eV in the layer forming process. In addition, other oxide semiconductors, such as $RuO_2$, $SnO_2$, $IrO_2$, $OsO_2$, ZnO, $ReO_2$, and $MoO_2$, or a semiconductor obtained by injecting acceptor impurities, or polysthylenedioxytyiophene (PEDOT) which is an organic material may also be used as a material of the auxiliary hole accumulation layer 32 because they have work function values larger than 5.1 eV. In addition, examples of the layer forming technique performed in a temperature of 400° C. or less include the ALD method, the CVD method, and the vapor doping method.

Then, as shown in (5) of FIG. 38 and (5) of FIG. 39, a bottom electrode 92 is formed through a barrier metal 91.

Then, as shown in (6) of FIG. 38 and (6) of FIG. 39, the color filter layer 44 is formed on the light sensing section 12 and then the condensing lens 45 is formed. Thus, the solid state imaging device 8 is formed.

In the method (third manufacturing method) of manufacturing a solid state imaging device, the layer having a larger work function value than the interface 23 at a side of the light receiving surface 12s of the light sensing section 12 is provided on the insulating layer 31 formed on the light sensing section 12. Accordingly, since the hole accumulation efficiency of the hole accumulation layer 23 is improved, the hole accumulation layer 23 formed on the interface at a side of the light receiving surface 12s of the light sensing section 12 can accumulate sufficient holes therein. As a result, a dark current is reduced. In addition, the auxiliary hole accumulation layer 32 preferably has a work function value higher than a work function value of the hole accumulation layer 23 and may be a conductive layer, an insulating layer 21, or an semiconductor layer since a current does not need to flow to the auxiliary hole accumulation layer 32. For this reason, a material having high resistance may also be selected for the auxiliary hole accumulation layer 32. In addition, the auxiliary hole accumulation layer 32 does not need an external signal input terminal.

Each of the solid state imaging devices 1 to 8 in the above examples includes a plurality of pixel sections each having a light sensing section, which converts incident light into an electric signal, and a wiring layer provided on a surface of the semiconductor substrate formed with the pixel sections, and may be applied as a back illuminated imaging device having a configuration in which light incident from a side opposite a surface on which the wiring layer is formed is received in each of the light sensing sections. It is needless to say that each of the solid state imaging devices 1 to 8 may also be applied as a top-emission-type solid state imaging device in which a wiring layer is formed on a light receiving surface side and incident light incident on the light sensing section is not blocked by setting an optical path of the incident light incident on the light sensing section as a region where the wiring layer is not formed.

Next, an imaging apparatus according to an embodiment (example) of the present invention will be described with reference to a block diagram of FIG. 41. Examples of the imaging apparatus include a video camera, a digital still camera, and a camera of a mobile phone.

Figure 41:
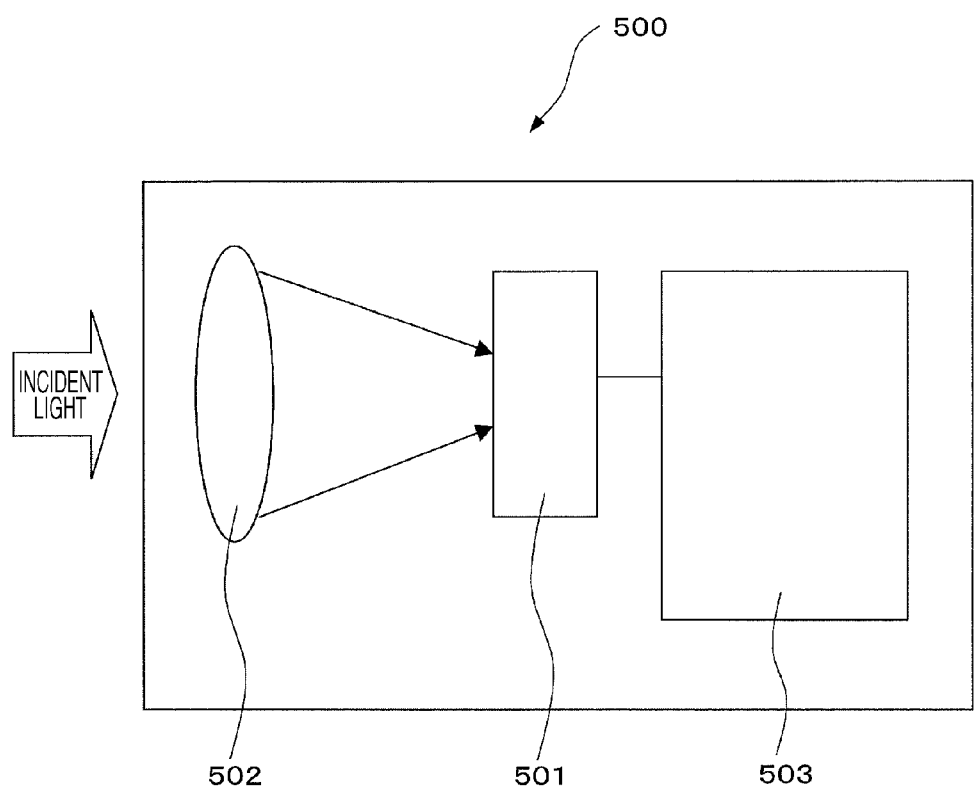
FIG. 41 is a block diagram illustrating an imaging apparatus according to an embodiment of the present invention.
Figure 42:
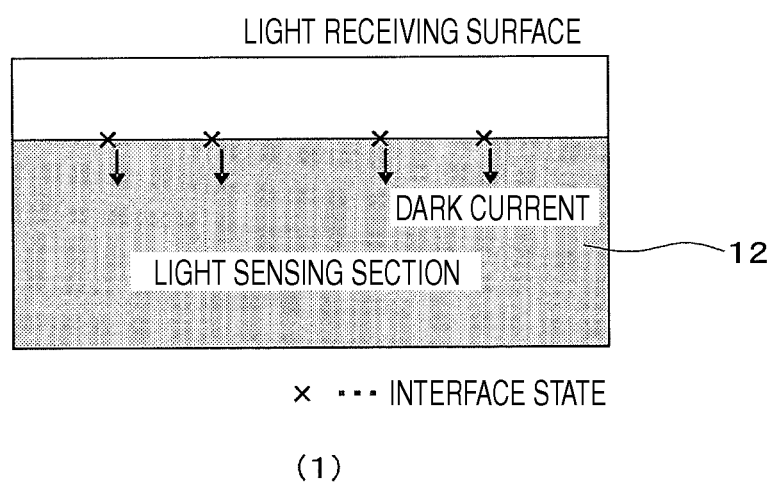
FIG. 42 is a cross-sectional view illustrating the schematic configuration of a light sensing section, which shows a technique of suppressing generation of a dark current caused by the interface state.
Figure 42:
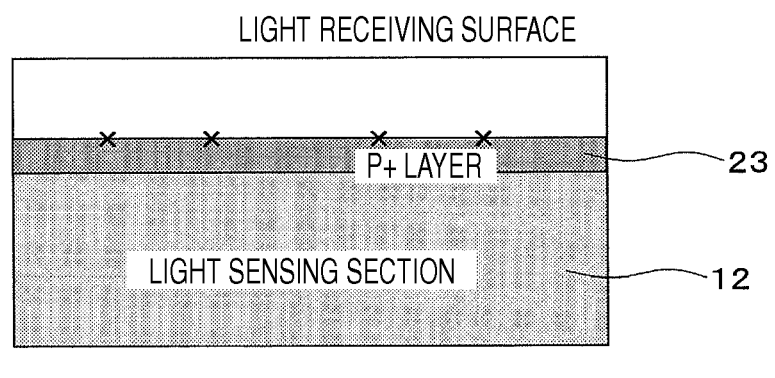

As shown in FIG. 41, an imaging apparatus 500 includes a solid state imaging device (not shown) provided in an imaging section 501. An imaging optical system 502 which images an image is provided at the condensing side of the imaging section 501. To the imaging section 501, a signal processing section 503 having a driving circuit for driving the imaging section 501, a signal processing circuit which processes an image photoelectrically converted in the solid state imaging device into an image, and the like are connected. In addition, the image signal processed by the signal processing section may be stored in an image storage section (not shown). In the imaging apparatus 500, the solid state imaging devices 1 to 8 described in the above embodiments may be used as the solid state imaging device.

In the imaging apparatus 500 according to the embodiment of the present invention, the solid state imaging device 1 or 2 according to the embodiment of the present invention or the solid state imaging device having a condensing lens and an anti-reflection layer configured as shown in FIG. 4 is used. Accordingly, a solid state imaging device capable of improving the color reproducibility or the resolution is used in the same manner as described above, which is advantageous in that a high-quality image can be recorded.

Furthermore, the imaging apparatus 500 according to the embodiment of the present invention is not limited to having the above-described configuration but may be applied to an imaging apparatus having any kind of configuration as long as it is an imaging apparatus using a solid state imaging device.

In addition, each of the solid state imaging devices 1 to 8 may be formed as a one chip type device or a module type device in which an imaging section and a signal processing section or an optical system are collectively packaged and which has an imaging function. In addition, the present invention may be applied to not only a solid-state imaging device but also an imaging apparatus. In this case, an effect of improving image quality can be obtained in the imaging apparatus. Here, the imaging apparatus refers to a camera or a portable apparatus having an imaging function, for example. In addition, the 'imaging' includes not only imaging of an image at the time of normal photographing of a camera but also detection of a fingerprint and the like in a broad sense of meaning.

It should be understood by those skilled in the art that various modifications, combinations, sub-combinations and alterations may occur depending on design requirements and other factors insofar as they are within the scope of the appended claims or the equivalents thereof.

What is claimed is:

1. A solid state imaging device, comprising:
a semiconductor substrate comprising a light sensing section and comprising a first surface and a second surface opposite to the first surface, wherein the first surface is on a light incident side of the semiconductor substrate;
a wiring layer on the second surface; and
at least three layers over the first surface, the three layers comprising a first layer, a second layer and a third layer, wherein the first and second layers each comprise a material selected from the group consisting of hafnium oxide ($HfO_2$), aluminum oxide ($Al_2O_3$), zirconium oxide ($ZrO_2$), tantalum oxide ($Ta_2O_5$), titanium oxide ($TiO_2$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), hafnium nitride, aluminum nitride, hafnium oxide nitride, and aluminum oxide nitride, and the third layer comprises a silicon oxide.

2. The device of claim 1, wherein the first and the second layer are made of different materials.

3. The device of claim 2, wherein at least one of the first layer and the second layer is made of hafnium oxide.

4. The device of claim 3, wherein the layers are disposed over the semiconductor substrate in the order of the third layer, the first layer and the second layer from the first surface of the semiconductor substrate.

5. The device of claim 4, further comprising:
a fourth layer over the second layer.

6. The device of claim 5, wherein the fourth layer is made of a silicon oxide layer.

7. The device of claim 6, further comprising:
a color filter and an on chip micro lens over the fourth layer.

8. The device of claim 7, further comprising:
a peripheral circuit section, wherein at least the first, second, third and fourth layers are provided over the peripheral circuit section.

9. The device of claim 8, further comprising:
a light-shielding layer over the fourth layer in the peripheral circuit section.

10. The device of claim 9, wherein the light-shielding layer is provided over a portion of the light sensing section.

11. The device of claim 9, further comprising:
an insulating layer over the fourth layer, wherein the insulating layer is provided on the light-shielding layer in the peripheral circuit section.

12. The device of claim 1, wherein the total thickness of the first and second layers is between 50 nm and 60 nm.

13. The device of claim 1, wherein the first and the second layer are made of the same material.

14. The device of claim 12, wherein each of the first layer and the second layer is made of hafnium oxide.

15. The device of claim 13, further comprising:
a fourth layer over the first, second and third layers.

16. The device of claim 14, further comprising:
a peripheral circuit section, wherein at least the first, second, third and fourth layers are provided over the peripheral circuit section.

17. The device of claim 15, further comprising:
a light-shielding layer over the fourth layer in the peripheral circuit section.

18. The device of claim 16, wherein the light-shielding layer is provided over a portion of the light sensing section.

19. The device of claim 16, wherein thickness of the fourth layer over the light sensing section is different from thickness of the fourth layer over the peripheral circuit section.

20. The device of claim 15, further comprising:
a color filter and an on chip micro lens over the fourth layer.

* * * * *